United States Patent [19]
Ikeda et al.

[11] Patent Number: 5,508,540
[45] Date of Patent: Apr. 16, 1996

[54] SEMICONDUCTOR INTEGRATED CIRCUIT DEVICE AND PROCESS OF MANUFACTURING THE SAME

[75] Inventors: Shuji Ikeda, Koganei; Koichi Imato, Kodaira; Kazuo Yoshizaki, Musashimurayama; Kohji Yamasaki, Akishima; Soichiro Hashiba, Nagoya; Keiichi Yoshizumi, Kokubunji; Yasuko Yoshida, Sayama; Kousuke Okuyama, Kawagoe; Mitsugu Oshima, Yamanashi; Kazushi Tomita, Kawaguchi; Tsuyoshi Tabata, Yamanashi; Kazushi Fukuda, Kodaira; Junichi Takano, Yamanashi; Toshiaki Yamanaka, Iruma; Chiemi Hashimoto, Koganei; Motoko Kawashima, Kodaira; Fumiyuki Kanai, Houya; Takashi Hashimoto, Iruma, all of Japan

[73] Assignee: Hitachi, Ltd., Tokyo, Japan

[21] Appl. No.: 190,596

[22] Filed: Feb. 2, 1994

[30] Foreign Application Priority Data

Feb. 19, 1993 [JP] Japan .................................. 5-029510
Mar. 10, 1993 [JP] Japan .................................. 5-049117
Jul. 21, 1993 [JP] Japan .................................. 5-179575

[51] Int. Cl.⁶ ........................ H01L 27/108; H01L 29/04; H01L 29/76; H01L 27/11

[52] U.S. Cl. .............. 257/298; 257/69; 257/71; 257/297; 257/300; 257/903

[58] Field of Search .................. 257/67, 68, 69, 257/71, 296, 297, 298, 300, 310, 903, 904

[56] References Cited

U.S. PATENT DOCUMENTS

| 5,194,749 | 3/1993 | Meguro et al. | 257/69 |
| 5,239,196 | 8/1993 | Ikeda et al. | 257/385 |
| 5,326,989 | 7/1994 | Muragishi | 257/67 |

OTHER PUBLICATIONS

Shouji Ikeda, et al—A Polysilicon Transistor Technology for Large Capacity SRAMs (1990 IEEE).

*Primary Examiner*—Steven H. Loke
*Attorney, Agent, or Firm*—Antonelli, Terry, Stout & Kraus

[57] ABSTRACT

A SRAM having its memory cell constructed to include transfer MISFETs to be controlled by word lines and a flip-flop circuit having driver MISFETs and load MISFETs. Plate electrodes of large area fixed on predetermined power source lines are arranged over the load MISFETs such that the plate electrodes over the offset region of the load MISFETs are formed with an opening. A silicon nitride film having a thickness permeable to hydrogen but not to humidity is formed over the transfer MISFETs and the driver MISFETs formed over the main surface of a semiconductor substrate and the load MISFETs formed of a polycrystalline silicon film deposited on the driver MISFETs.

24 Claims, 40 Drawing Sheets

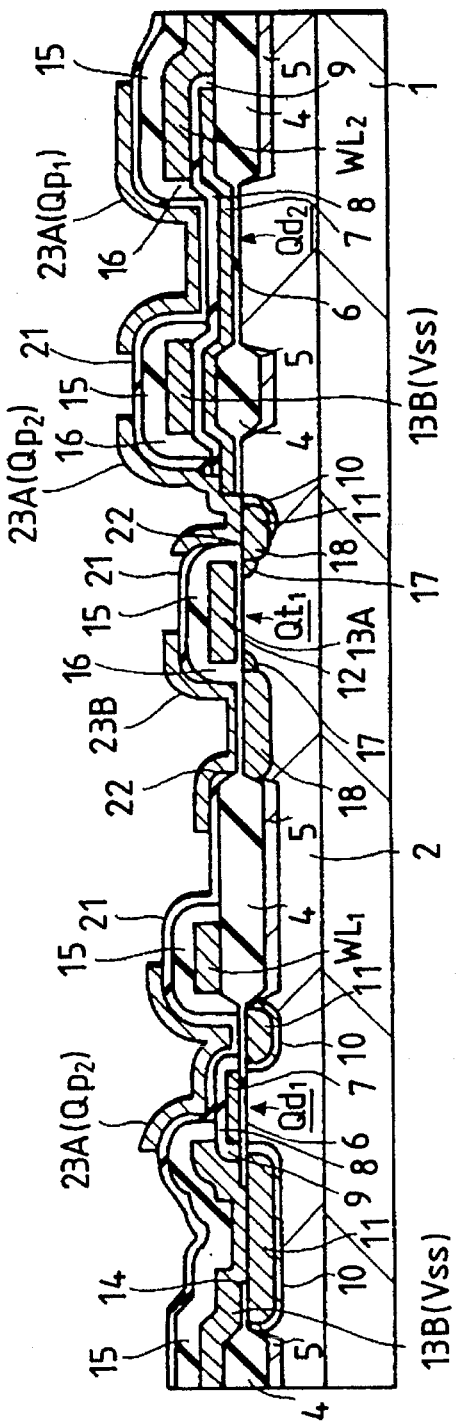
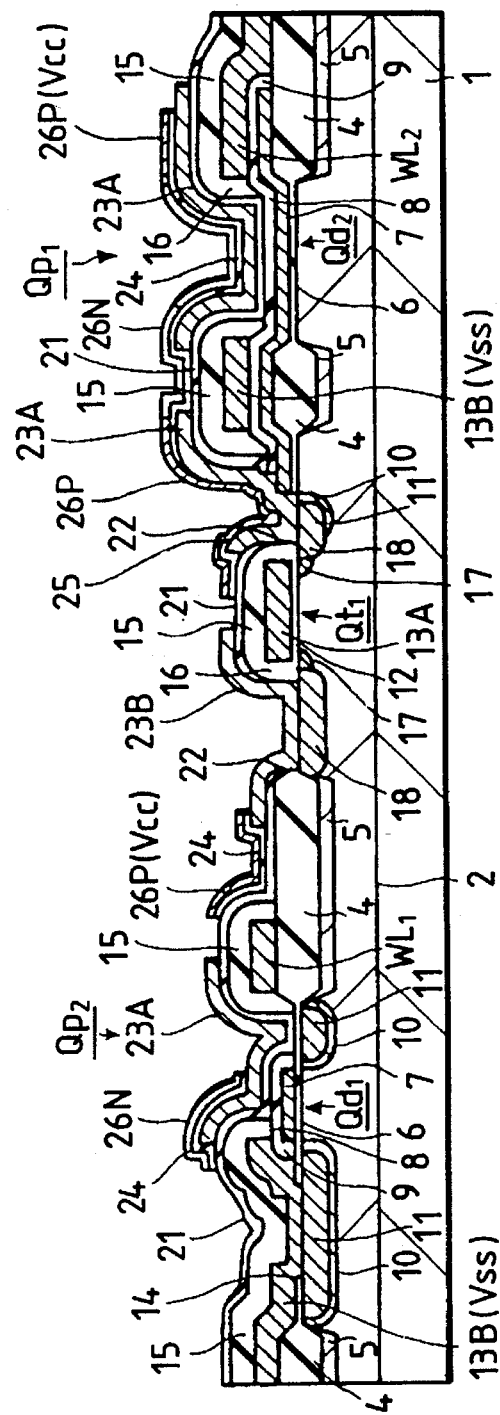
FIG. 15
FIG. 16

SEMICONDUCTOR INTEGRATED CIRCUIT DEVICE AND PROCESS OF MANUFACTURING THE SAME

BACKGROUND OF THE INVENTION

The present invention relates to a semiconductor integrated circuit device and a technique for manufacturing the same. More particularly, the present invention relates to a technique which is effective if applied to a semiconductor integrated circuit device having a SRAM (Static Random Access Memory). The SRAM is disclosed, for example, in U.S. Pat. No. 5,194,749 which was filed by us at the U.S. Patent Office on Nov. 22, 1988 and given Ser. No. 274,490.

The SRAM as a semiconductor memory device is equipped at the intersections between complementary data lines and word lines with memory cells, each of which is composed of a flip-flop circuit and two transfer MISFETs (Metal-Insulator-Semiconductor-Field-Effect-Transistors).

The transfer MISFETs of the memory cell have one of their source regions and drain regions connected with the input/output terminals of the flip-flop circuit and their other regions connected with the complementary data lines. Moreover, the transfer MISFETs have their gate electrodes connected with word lines so that their conductivity and non-conductivity are controlled by the word lines.

The flip-flop circuit of the memory cell is constructed as a data storage unit, which is composed of two driver MISFETs and two load MISFETS. One driver MISFET has its drain region connected with either the source region or drain region of one transfer MISFET and its source region connected with a reference voltage line. Moreover, this driver MISFET has its gate electrode connected with the source region or drain region of the other transfer MISFET.

The load MISFETS have their drain regions connected with either the source regions or drain regions of the transfer MISFETs and their source regions connected with the power source line. The load elements are formed over the driver MISFETs so as to reduce the area occupied by the memory cells thereby to improve the degree of integration.

In the SRAM, a first conductive film formed on the main surface of a semiconductor substrate forms the gate electrodes of the driver MISFETs, and a second conductive film formed on the main surface of the semiconductor substrate forms the gate electrodes of the transfer MISFETs, the word lines to be connected with the gate electrodes and the reference voltage line to be connected with the source regions of the driver MISFETs. Moreover, a third conductive film formed over the first and second conductive films forms the gate electrodes of the load MISFETs, and a fourth conductive film formed over the third conductive film forms the channel regions, the source regions and the drain regions of the load MISFETs, and the power source line to be connected with the source regions of the load MISFETs.

In short, the SRAM, as disclosed in the above-specified U.S. Patent, adopts the so-called "complete CMOS structure", in which the flip-flop circuit of the memory cell is constructed to include the two driver MISFETs and the two load MISFETs so as to have its standby current reduced.

In order to eliminate the α-ray soft error of the memory cell, moreover, the SRAM is equipped with capacitance elements, in which the gate electrodes (i.e., the first conductive film) of the driver MISFETs are used as a first electrode and in which the gate electrodes (i.e., the third conductive film) of the load MISFETs formed on a dielectric film of an insulating film formed on the gate electrodes are used as a second electrode.

SUMMARY OF THE INVENTION

In a SRAM having its capacitance elements formed between the gate electrodes of the driver MISFETs and the gate electrodes of the load MISFETs of the memory cell, it is difficult to form capacitance elements having a high capacity; and such SRAM is accompanied by a problem that it becomes more difficult to retain the resistance to the α-ray soft errors for the finer structure of the memory cell.

An object of the present invention is to provide a technique capable of improving the α-ray soft error resistance of the memory cells of the SRAM.

Another object of the present invention is to provide a technique capable of improving the reliability of the circuit operation of the SRAM.

The foregoing and other objects and novel features of the present invention will become apparent from the following description to be made with reference to the accompanying drawings.

The summary of representative concepts of the invention to be disclosed will be described in the following.

(1) In a SRAM having its memory cell constructed to include transfer MISFETs controlled by word lines and a flip-flop circuit having driver MISFETs and load MISFETs: a first conductive film formed over the main surface of a semiconductor substrate forms the gate electrodes of the driver MISFETs; a second conductive film formed over the main surface of the semiconductor substrate forms the gate electrodes of the transfer MISFETs; a third conductive film formed over the first and second conductive films forms the gate electrodes of the load MISFETs; a fourth conductive film formed over the first and second conductive films forms the channel regions, the source regions and the drain regions of the load MISFETs; a fifth conductive film formed over the third and fourth conductive films forms the plate electrodes covering a memory cell array; capacitance elements are formed between the load MISFETs and the plate electrodes; and at least the plate electrodes over the offset regions of the load MISFETs are formed with openings.

(2) In the SRAM according to the concept (1), the plate electrodes are supplied with the supply voltage from the outside of the memory cell array.

(3) In the SRAM according to the concept (1), at least a portion of the dielectric film of the capacitance elements is formed of a silicon nitride film.

(4) In a process of manufacturing the SRAM according to the concept (3), the plate electrodes are formed with the opening, and the silicon nitride film is then removed from the bottom of the opening. After this, hydrogen annealing treatment is carried out to feed hydrogen through the opening to the conductive film forming the load MISFETs.

(5) In a process of manufacturing the SRAM according to the concept (4), when the silicon nitride film is to be removed from the bottom of the opening, the region to be formed with the peripheral circuits is also cleared of the silicon nitride film.

(6) In a process of manufacturing the SRAM according to the concept (1), after the conductive film forming the channel regions, source regions and drain regions of the load MISFETs has been etched, the insulating film below the conductive film is etched to expose a portion of the gate electrodes of the load MISFETs to the outside, and the dielectric film of the capacitance elements is then formed on the conductive film.

(7) In a SRAM having its memory cell constructed to include transfer MISFETs formed on the main surface of a semiconductor substrate and a flip-flop circuit having driver MISFETs formed on the main surface of the semiconductor substrate and load MISFETs formed of a polycrystalline silicon film deposited on the driver MISFETs, a silicon nitride film having such as thickness as is permeable to hydrogen but not humidity (moisture) is formed over the load MISFETs.

(8) In the SRAM according to the concept (7), the silicon nitride film over the semiconductor region of the transfer MISFETs is formed with an opening having a larger diameter than that of a data line connecting via a contact hole.

(9) In the SRAM according to the concept (7), a BPSG (boron-doped phosphosilicate glass) film or PSG (phosphosilicate glass) film is formed over the silicon nitride film.

(10) In a process of manufacturing the SRAM according to the concept (7), after the silicon nitride film has been deposited on the load MISFETs, a hydrogen annealing is carried out to feed hydrogen to the polycrystalline silicon film forming the load MISFETs.

(11) In a process of manufacturing the SRAM according to the concept (7), after the silicon nitride film has been deposited on the load MISFETs, an insulating film is deposited on the silicon nitride film by the plasma CVD (Chemical Vapor Deposition) method to feed the hydrogen to the polycrystalline silicon film forming the load MISFETs.

(12) In a process of manufacturing the SRAM according to the concept (7), after the silicon nitride film has been deposited on the load MISFETs, it is removed from the regions of the peripheral circuits but is left only on the region of the memory cell.

(18) In a process of manufacturing the SRAM according to the concept (7), after the silicon nitride film has been deposited on the load MISFETs, a silicon oxide film is deposited on the silicon nitride film, and the semiconductor substrate is then annealed at 600° C. or a higher temperature.

According to the aforementioned means (1), the capacitance elements are Formed between the load MISFETs and the plate electrodes covering the former and having a large area, so that they can be given a high capacity to improve the α-ray soft error resistance of the memory cell.

Moreover, the plate electrodes over the channel regions at the drain region side of the load MISFETs are formed with the opening to separate the offset regions and the plate electrodes, so that a high electric field can be avoided from being applied from the plate electrodes to the offset regions of the load MISFETs. As a result, a leakage current can be prevented from being established between the source regions and the drain regions by that high electric field, to reduce the OFF current of the load MISFETs thereby to retain the stable operation of the memory cell.

According to the aforementioned means (2), by supplying the supply voltage to the plate electrodes from the outside of the memory cell array, the direct influence of the supply noises, if any, from the outside to the semiconductor chip formed with the SRAM, can be avoided from being exerted upon the memory cell, so that the stable operation of the memory cell can be retained.

According to the aforementioned means (3), at least a portion of the dielectric film of the capacitance elements is formed of a silicon nitride film having a higher breakdown voltage than that of the silicon oxide film, so that the dielectric film can be made thinner than that of the case, in which it is made of a single layer of the silicon oxide film, to increase the capacity of the capacitance elements.

Moreover, the load MISFETs are covered with the silicon nitride film having a higher water resistance than that of the silicon oxide film, so that the load MISFETs can be suppressed from having characteristic fluctuations which might otherwise be caused by the humidity invading from the chip surface.

According to the aforementioned means (4), hydrogen atoms are fed through the opening formed in the plate electrodes to the uncombined bonds (i.e., the dangling bonds) which are present in the crystal surfaces of the conductive film (i.e., the polycrystalline silicon film) forming the load MISFETs, so that the mutual conductance (gm) of the load MISFETs $Qp_1$ and $Qp_2$ can be improved.

According to the aforementioned means (5), by forming the hydrogen impermeable silicon nitride film over the peripheral circuits, the fluctuations of the threshold voltage of the peripheral circuits (or the MISFETs forming the peripheral circuits) can be suppressed to retain the stable operation of the SRAM.

According to the aforementioned means (6), by forming the dielectric film after the insulating film has been once removed from the gate electrodes of the load MISFETs, the dielectric film formed between the load MISFETs and the plate electrodes can be thinned to increase the capacity of the capacitance elements.

According to the aforementioned means (7), by covering the load MISFETs with the humidity impermeable film, the invasion of the humidity into the load MISFETs can be prevented to prevent the fluctuations of the threshold voltage (Vth) of the load MISFETs due to the humidity invasion.

By forming the hydrogen permeable film over the load MISFETs, moreover, sufficient hydrogen can be fed to the dangling bonds of the polycrystalline silicon film forming the load MISFETs, to improve the mutual conductance (gm) of the load MISFETs.

According to the aforementioned means (8), the silicon nitride film is not exposed to the side wall of the data line connecting contact hole when this contact hole is formed. As a result, the shape controllability of the contact hole can be improved to improve the connection reliability of the data lines in the contact hole.

According to the aforementioned means (9), by forming the BPSG film or the PSG film having a high gettering effect over the silicon nitride film, a metallic impurity such as Na can be prevented from permeating the silicon nitride film and invading into the load MISFETs, to improve the electric characteristics of the load MISFETs.

According to the aforementioned means (10) or (11), by making use of the steps from one for forming the load MISFET to one for depositing the silicon nitride film forming the final passivation film, sufficient hydrogen is fed to the dangling bonds of the polycrystalline silicon film forming the load MISFETs, so that the mutual conductance (gm) of the load MISFETs can be improve without increasing the number of manufacturing steps.

According to the aforementioned means (12), the peripheral circuits can be easily worked by removing the silicon nitride film from the peripheral circuit regions. Since, in this case, the gate insulating film of the MISFETs forming the peripheral circuits is formed by thermally oxidizing the surface of monocrystalline silicon, the defect level due to the dangling bonds is so low as to be hardly influenced by the humidity. As a result, no trouble arises even if the gate insulating film is left uncovered with the silicon nitride film.

According to the aforementioned means (13), after the silicon oxide film has been deposited on the silicon nitride film, an annealing is carried out at 600° C. or higher. As a result, the number of the dangling bonds in the interface between the silicon nitride film and the silicon oxide film can be reduced to improve the hydrogen permeability of the interface.

BRIEF DESCRIPTION OF THE DRAWINGS

FIG. 15 is a section of an essential portion of the semiconductor substrate and shows a process of manufacturing the semiconductor integrated circuit device according to the first embodiment of the present invention;

FIG. 16 is a section of an essential portion of the semiconductor substrate and shows a process of manufacturing the semiconductor integrated circuit device according to the first embodiment of the present invention;

DESCRIPTION OF THE PREFERRED EMBODIMENTS

Figure 1:
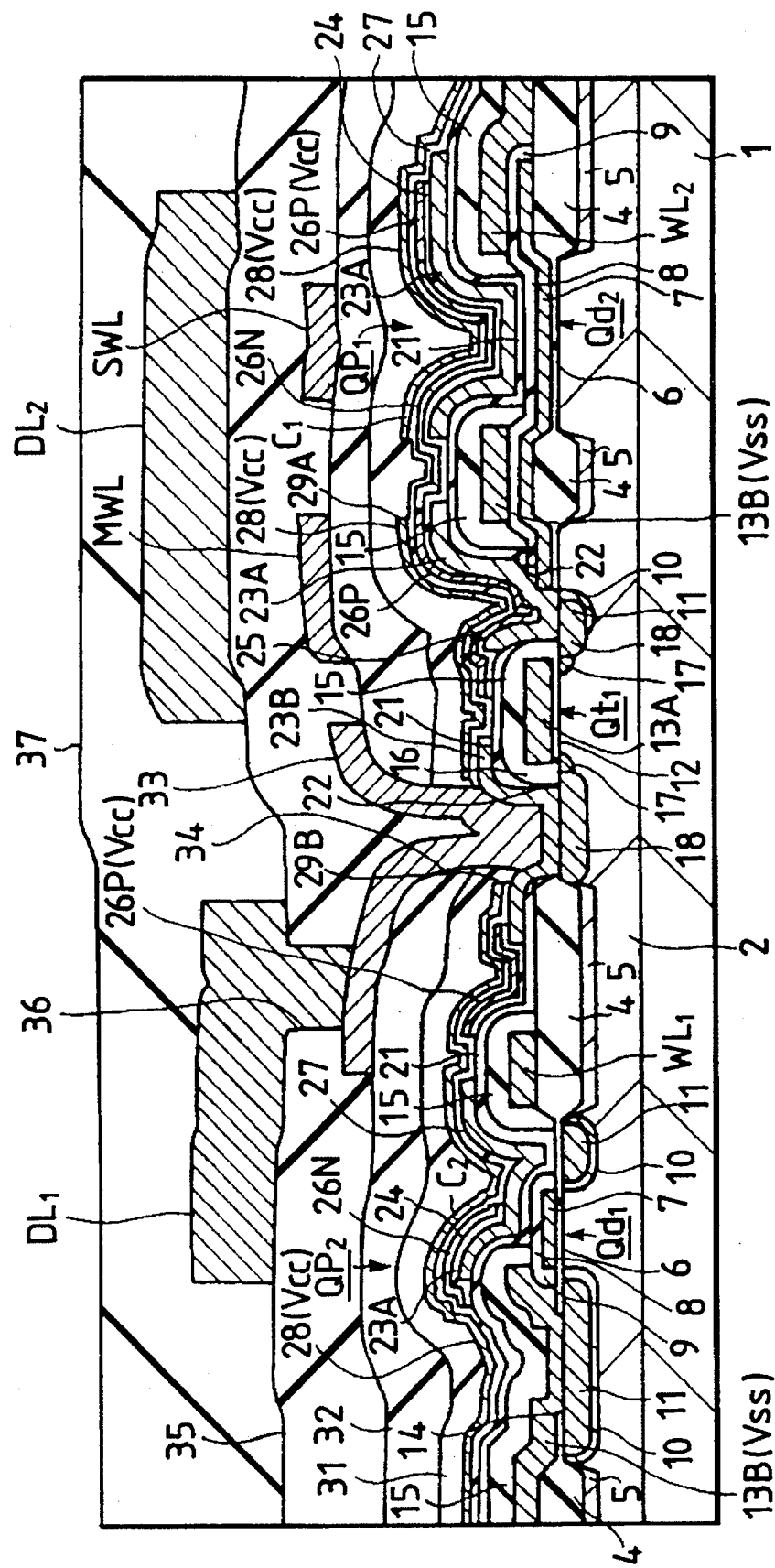
FIG. 1 is a section of an essential portion of a semiconductor substrate showing a memory cell of a semiconductor integrated circuit device according to a first embodiment of the present invention.

The present invention will be described in detail in the following with its embodiments. Incidentally, the portions having identical functions are designated at common reference numerals throughout the accompanying drawings, and their repeated description will be omitted.

[Embodiment 1]

A SRAM according to one embodiment of the present invention is given a high capacity of 4 Mbits to 64 Mbits, for example. This SRAM has a memory cell MC, as shown in an equivalent circuit diagram in FIG. 9.

Figure 9:
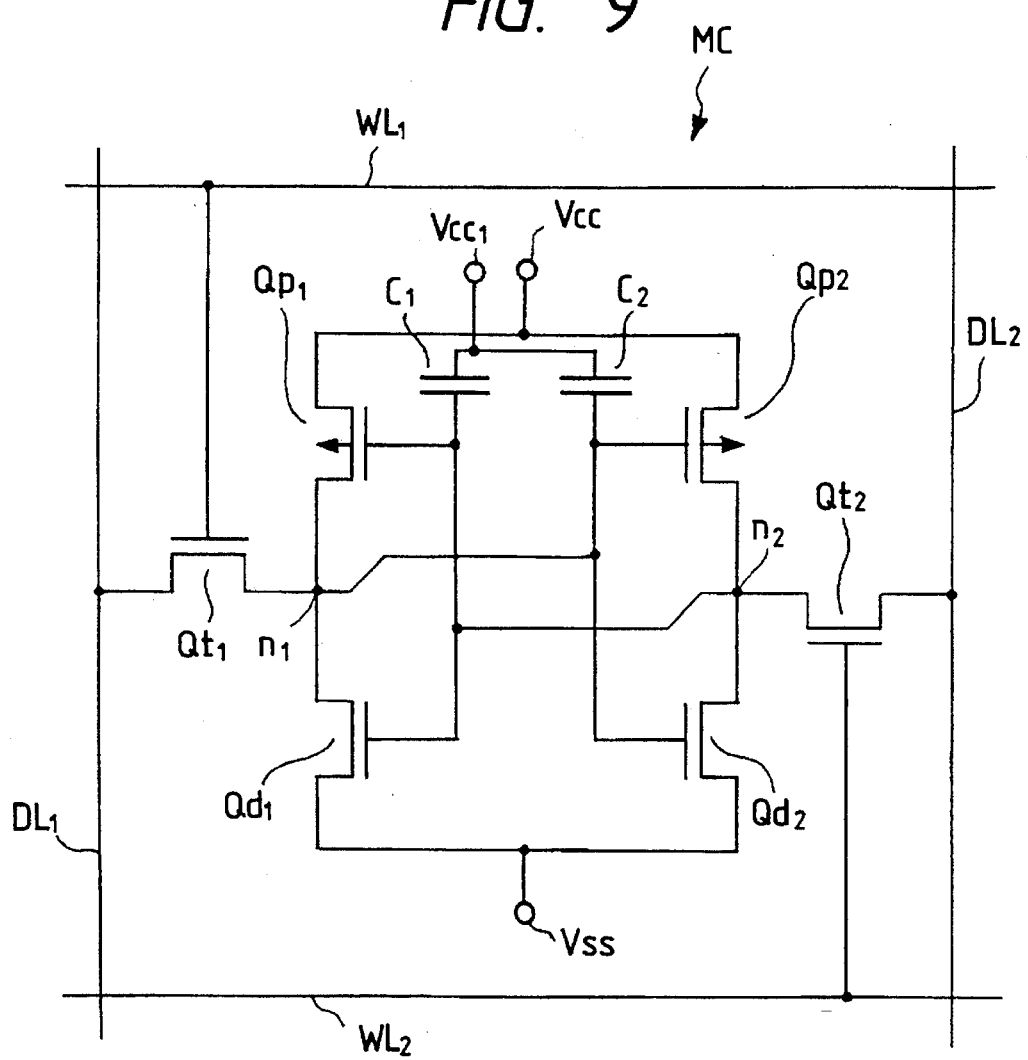
FIG. 9 is an equivalent circuit diagram of the memory cell of the semiconductor integrated circuit device according to the first embodiment of the present invention.

As shown in FIG. 9, the memory cell MC is arranged at an intersection between word lines WL (i.e., a First word line $WL_1$ and a second word line $WL_2$) and complementary data lines DL (i.e., a first data line $DL_1$ and a second data line $DL_2$) and is constructed to include a flip-flop circuit and two transfer MISFETs $Qt_1$ and $Qt_2$. The flip-flop circuit is constructed as a data storage unit for storing data of 1 bit ("1" or "0").

The two transfer MISFETs $Qt_1$ and $Qt_2$ of the memory cell MC are constructed to have an n-channel MISFET structure, and have either their individual source regions or drain regions connected with a pair of input/output terminals of the flip-flop circuit. The transfer MISFET $Qt_1$ has one of its source region and drain region connected with the first data line $DL_1$ and its gate electrode connected with the first word line $WL_1$. The transfer MISFET $Qt_2$ has one of its source region and drain region connected with the second data line $DL_2$ and its gate electrode connected with the second word line $WL_2$.

The aforementioned flip-flop circuit is constructed to include two driver MISFETs $Qd_1$ and $Qd_2$ of n-channel type and two load MISFETs $Qp_1$ and $Qp_2$ of p-channel type. In short, the memory cell MC of the SRAM of the this embodiment is constructed to have a complete CMOS structure.

The aforementioned driver MISFET $Qd_1$ and load MISFET $Qp_1$ have their drain regions (as located at one input/output terminal of the flip-flop circuit) connected with each other and their gate electrodes connected with each other to construct a CMOS inverter. Likewise, the driver MISFET $Qd_2$ and load MISFET $Qp_2$ have their drain regions (as located at the other input/output terminal of the flip-flop circuit) connected with each other and their gate electrodes connected with each other to construct a CMOS inverter.

The aforementioned driver MISFET $Qd_1$ and load MISFET $Qp_1$ have their drain regions connected with the others of the source region and drain region of the transfer MISFET $Qt_1$ and the individual gate electrodes of the driver MISFET $Qd_2$ and load MISFET $Qp_2$. Like-wise, the driver MISFET $Qd_2$ and the load MISFET $Qp_2$ have their individual drain regions connected with the others of the source region and drain region of the transfer MISFET $Qt_2$ and the individual gate electrodes of the driver MISFET $Qd_1$ and the load MISFET $Qp_1$.

The aforementioned driver MISFETs $Qd_1$ and $Qd_2$ have their individual source regions connected with a reference voltage ($V_{ss}$), and the load MISFETs $Qp_1$ and $Qp_2$ have their individual source regions connected with a supply voltage ($V_{cc}$). The reference voltage ($V_{ss}$) is exemplified by 0 V (at the GND potential), and the supply voltage ($V_{cc}$) is exemplified by 5 V.

Between the individual gate electrodes of the aforementioned load MISFETs $Qp_1$ and $Qp_2$ and the second supply voltage ($V_{cc1}$), there are connected capacitance elements $C_1$ and $C_2$. These capacitance elements $C_1$ and $C_2$ are provided to improve the resistance of the memory cell MC to the α-ray soft error and has a structure, as will be specified hereinafter.

Next, the specific structure of the memory cell MC of the aforementioned SRAM will be described with reference to FIGS. 1 to 8.

As shown in FIG. 1, a semiconductor substrate (or semiconductor chip) 1 made of an n⁻-type monocrystalline silicon is formed on its main surface with a p⁻-type well 2, which has its inactive region formed on its main surface with an element separating field insulating film 4 made of a silicon oxide film. Below the field insulating film 4, there is formed an inversion preventing p-type channel stopper region 5.

Of the driver MISFETs $Qd_1$ and $Qd_2$, the transfer MISFETs $Qt_1$ and $Qt_2$ and the load MISFETs $Qp_1$ and $Qp_2$ composing the memory cell MC, the driver MISFETs $Qd_1$ and $Qd_2$ and the transfer MISFETs $Qt_1$ and $Qt_2$ are individually formed on the main surface of the active regions of the p⁻-type well 2, which is surrounded by the aforementioned field insulating film 4.

The driver MISFETs $Qd_1$ and $Qd_2$ are individually constructed to include a gate insulating film 6, gate electrodes 7, source regions and drain regions. The gate electrodes 7 are formed of a polycrystalline silicon film, for example, at the step of forming a First-layered gate material. This polycrystalline silicon film is doped with an n-type impurity such as phosphorus (P) so as to have its resistance reduced.

Over the gate electrodes 7 of the driver MISFETs $Qd_1$ and $Qd_2$, there is formed an insulating film 8. This insulating film 8 is formed of a silicon oxide film, for example. On the other hand, the gate electrodes 7 are formed on their side wall in their longitudinal direction with a side wall spacer 9. This side wall spacer 9 is formed of a silicon oxide film, for example.

The individual source regions and drain regions of the driver MISFETs $Qd_1$ and $Qd_2$ are formed of lightly doped n-type semiconductor regions 10 and heavily doped n⁺-type semiconductor regions 11 formed over the former regions 10. In short, the driver MISFETs $Qd_1$ and $Qd_2$ have their individual source regions and drain regions constructed to have the so-called "double diffused drain structure".

Figure 2:
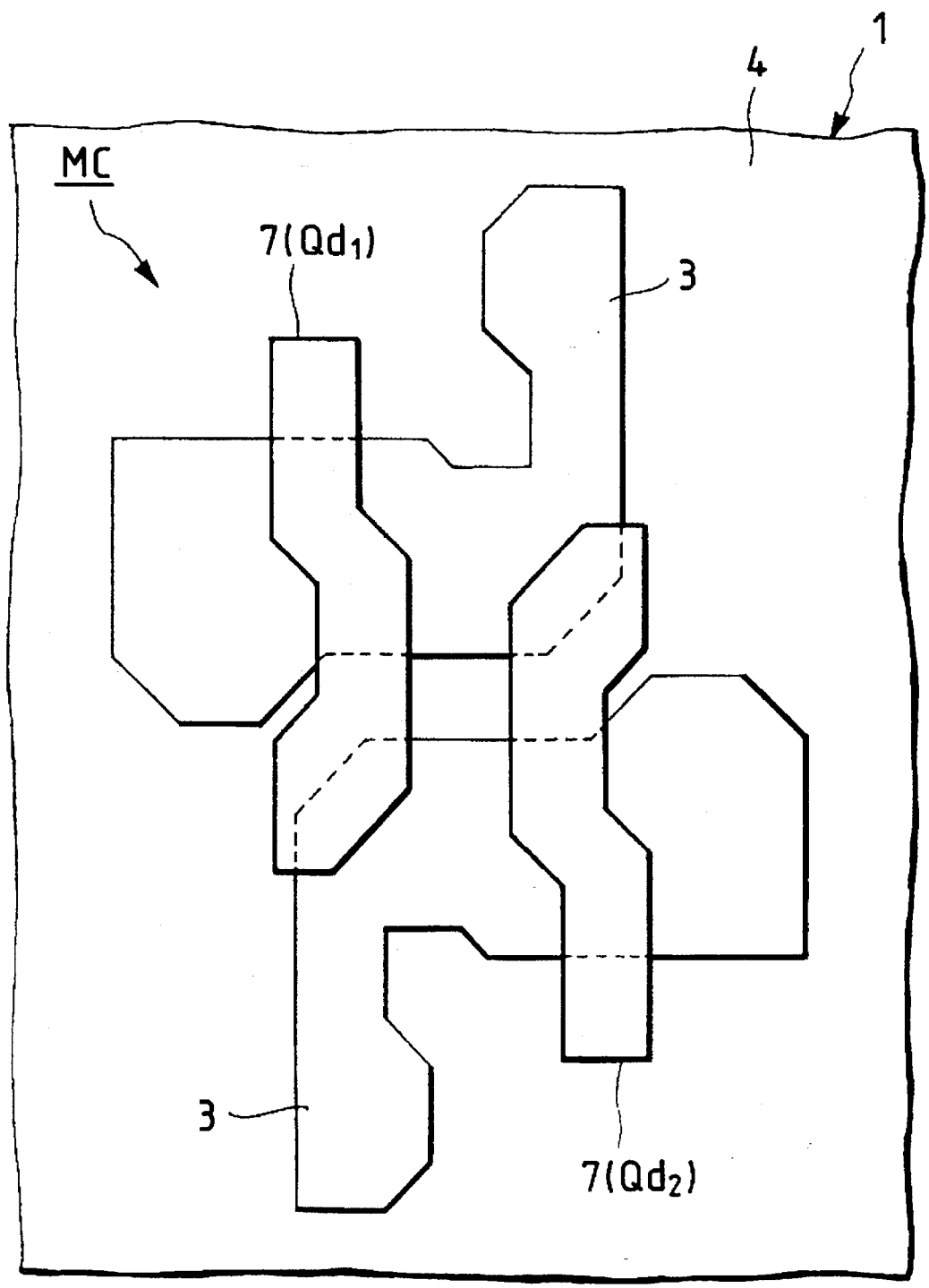
FIG. 2 is a top plan view of an essential portion showing a pattern layout of the memory cell of the semiconductor integrated circuit device according to the first embodiment of the present invention.

The pattern layout of the field insulating film 4 formed on the main surface of the semiconductor substrate 1 and the gate electrodes of the driver MISFETs $Qd_1$ and $Qd_2$ is shown in FIG. 2. In FIG. 2, two L-shaped regions 3 and 3 surrounded by the field insulating film 4 are the active regions of one memory cell MC.

As shown in FIG. 2, the individual gate electrodes 7 of the driver MISFETs $Qd_1$ and $Qd_2$ have their one-end sides protruded over the field insulating film 4 at least to an extent to correspond to the mask aligning allowance in a manufacturing process. The other end side of the gate electrode 7 ($Qd_1$) of the driver MISFET $Qd_1$ is protruded over the drain region of the driver MISFET $Qd_2$, and the other end side of the gate electrode 7 ($Qd_2$) of the driver MISFET $Qd_2$ is protruded over the drain region 7 of the driver MISFET $Qd_1$ through the field insulating film 4.

As shown in FIG. 1, the transfer MISFETs $Qt_1$ and $Qt_2$ of the memory cell MC are individually constructed to include a gate insulating film 12, gate electrodes 13A, source regions and drain regions. The gate electrodes 13A are formed, at the step of a second-layered gate material, of a laminated film (i.e., a polycide film) of a polycrystalline silicon film and a refractory metal silicide film, for example. The lower polycrystalline silicon film is doped with an n-type impurity (e.g., P) so as to have its resistance reduced. The upper refractory metal silicide film is made of $WSi_x$, $MoSi_x$, $TaSi_x$ or $TaSi_x$, for example.

Over the gate electrodes 13A of the aforementioned transfer MISFETs $Qt_1$ and $Qt_2$, there are formed an insulating film 15 and an insulating film 21. These insulating films 15 and 21 are formed of a silicon oxide film, for example.

On the other hand, the gate electrodes 13A are formed on their side walls with a side wall spacer 16. This side wall spacer 16 is made of a silicon oxide film, for example.

The transfer MISFETs $Qt_1$ and $Qt_2$ have their source regions and drain regions formed of lightly doped n-type semiconductor regions 17 and heavily doped n⁺-type semiconductor regions 18. In short, the source regions and the drain regions of the transfer MISFETs $Qt_1$ and $Qt_2$ are constructed to have the LDD (Lightly Doped Drain) structure.

Figure 3:
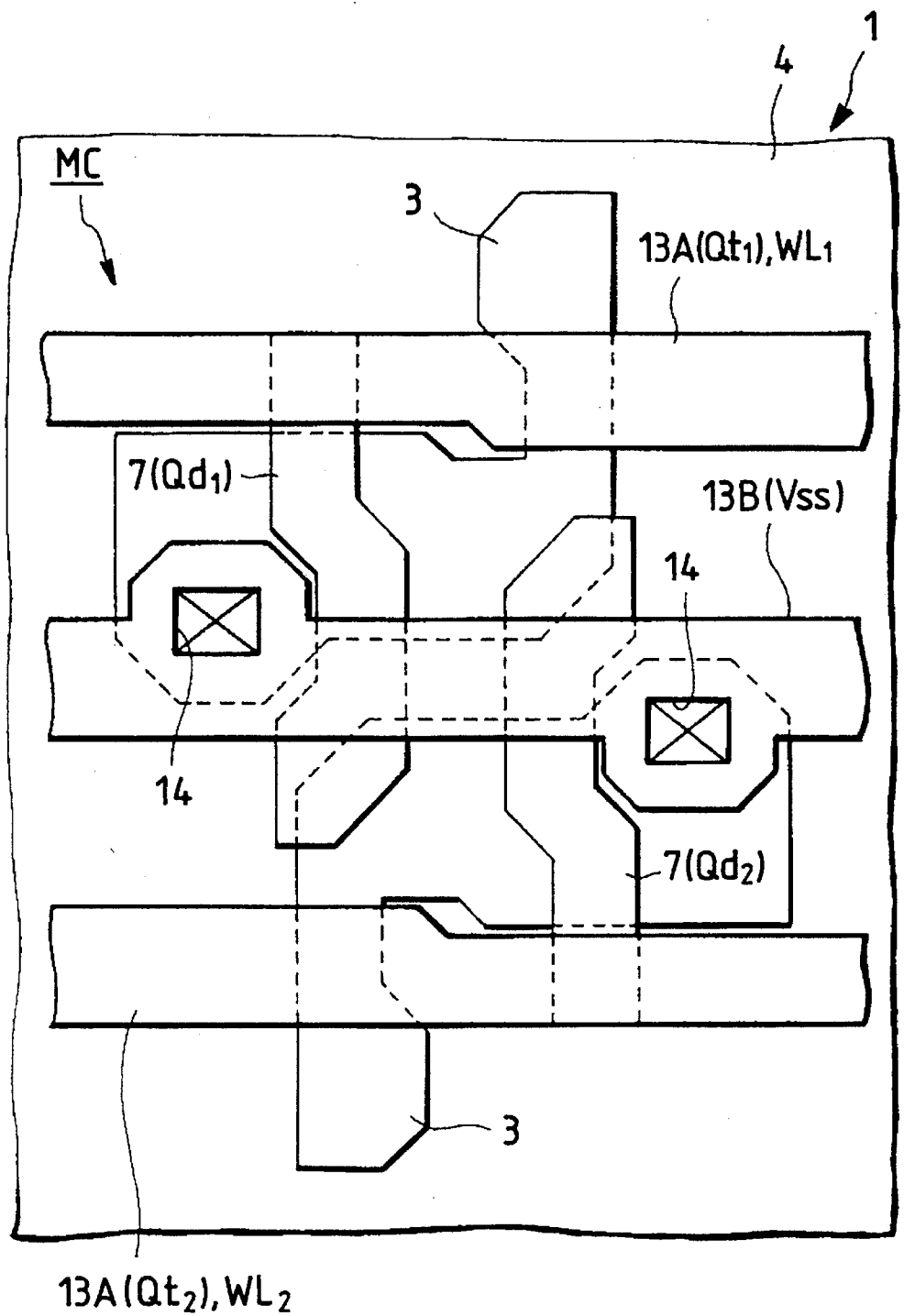
FIG. 3 is a top plan view of an essential portion showing a pattern layout of the memory cell of the semiconductor integrated circuit device according to the first embodiment of the present invention.

The pattern layout of the gate electrodes 13A of the transfer MISFETs $Qt_1$ and $Qt_2$ formed on the main surface of the semiconductor substrate 1 is shown in FIG. 3. As shown in FIG. 3, the gate electrodes 13A of the transfer MISFETs $Qt_1$ and $Qt_2$ are arranged to have their longitudinal direction (Lg) intersecting the longitudinal direction (Lg) of the gate electrodes 7 of the driver MISFETs $Qd_1$ and $Qd_2$.

As shown in FIGS. 1 and 3, either the source region or the drain region of the transfer MISFET $Qt_1$ is made integral with the drain region of the driver MISFET $Qd_1$. Likewise, either the source region or the drain region of the transfer MISFET $Qt_2$ is made integral with the drain region of the driver MISFET $Qd_2$.

The first word line $WL_1$ is connected with the gate electrode 13A ($Qt_1$) of the transfer MISFET $Qt_1$, and the second word line $WL_2$ is connected with the gate electrode 13A ($Qt_2$) of the transfer MISFET $Qt_2$. The gate electrode 13A of the transfer MISFET $Qt_1$ is made integral with the first word line $WL_1$, and the gate electrode 13A off the transfer MISFET $Qt_2$ is made integral with the second word line $WL_2$.

Between the first word line $WL_1$ and the second word line $WL_2$, there is arranged a reference voltage line ($V_{ss}$) 18B which is shared as a common source line between the two driver MISFETs $Qd_1$ and $Qd_2$. The reference voltage line ($V_{ss}$) 18B is formed at the step of forming the same second layer as the gate electrodes 13A and the word lines WL (i.e., the first word line $WL_1$ and the second word line $WL_2$) of the transfer MISFETs $Qt_1$ and $Qt_2$ and is extended over the field insulating film 4 in the same direction as that of the word lines WL. Moreover, the reference voltage line ($V_{ss}$) 18B is connected with the individual source regions (i.e., the n⁺-type semiconductor regions 11) of the driver MISFETs $Qd_1$ and $Qd_2$ through a contact hole 14 which is formed in the same insulating film of the gate insulating film 6 of the driver MISFETs $Qd_1$ and $Qd_2$.

Of the two load MISFETs $Qp_1$ and $Qp_2$ of the memory cell MC, as shown in FIG. 1, the load MISFET $Qp_1$ is arranged over the region of the driver MISFET $Qd_2$, and the load MISFET $Qp_2$ is arranged over the driver MISFET $Qd_1$. The load MISFETs $Qp_1$ and $Qp_2$ are individually formed of gate electrodes 23A, a gate insulating film 24, channel regions 26N, source regions 26P and drain regions 26P.

The gate electrodes 23A of the load MISFETs $Qp_1$ and $Qp_2$ are formed of a polycrystalline silicon film, for example, at the step of forming a third-layered gate material. This polycrystalline silicon film is doped with an n-type impurity (e.g., P) so as to have its resistance reduced. The pattern layout of the gate electrodes 23A of the load MISFETs $Qp_1$ and $Qp_2$ is shown in FIG.

Figure 4:
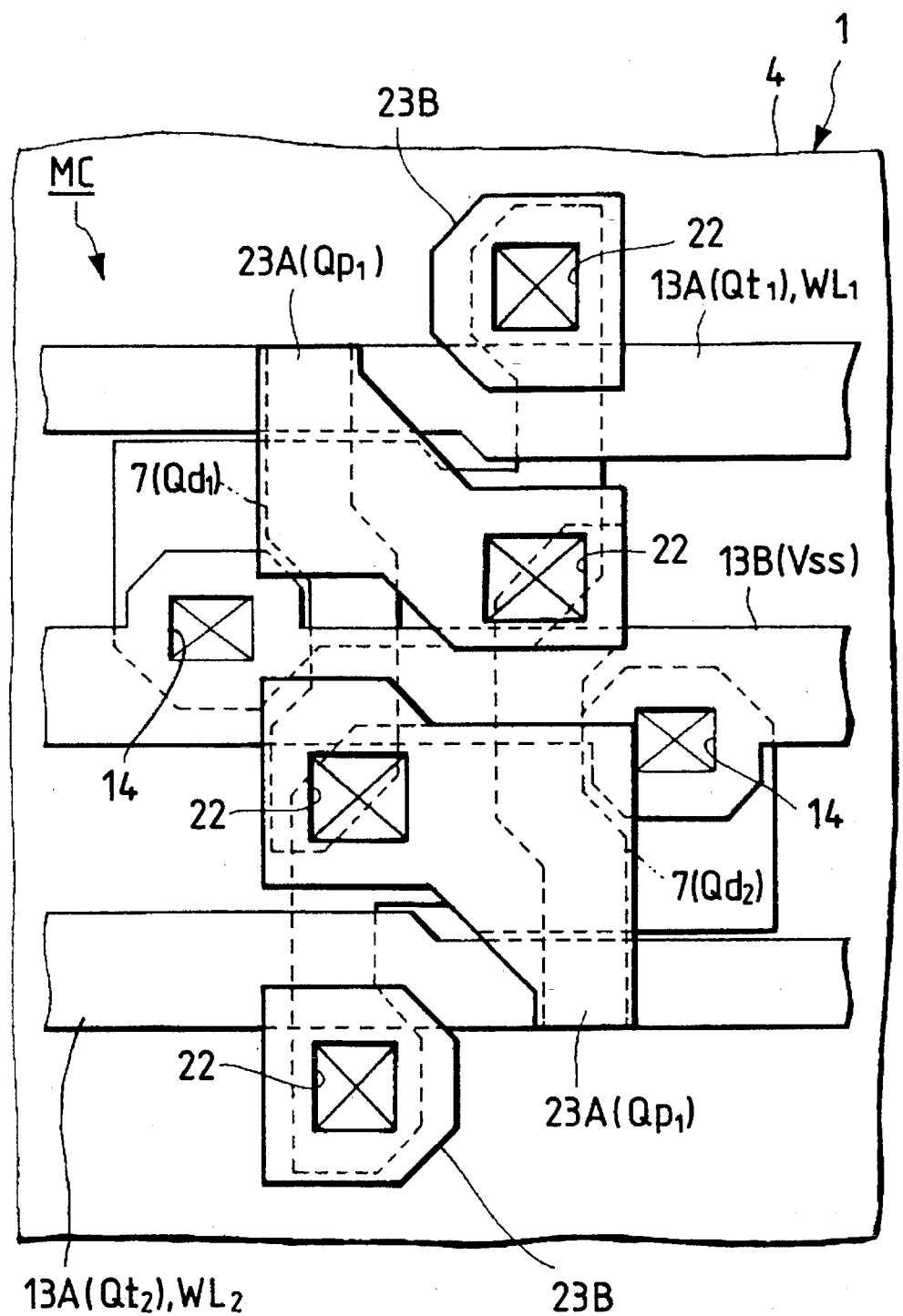
FIG. 4 is a top plan view of an essential portion showing a pattern layout of the memory cell of the semiconductor integrated circuit device according to the first embodiment of the present invention.

As shown in FIGS. 1 and 4, the gate electrode 23A of the load MISFET $Qp_1$ is connected with the gate electrode 7 of the driver MISFET $Qd_1$ and the source region or the drain region of the transfer MISFET $Qt_2$ through a contact hole 22 which is formed in the insulating film 21, the insulating film 8 and the insulating film (i.e., the insulating film of the same layer as that of the gate insulating film 12 of the transfer MISFETs $Qt_1$ and $Qt_2$). Likewise, the gate electrode 23A of the load MISFET $Qp_2$ is connected with the gate electrode 7 of the driver MISFET $Qd_2$ and either the source region or the drain region of the transfer MISFET $Qt_1$ through a contact hole 22 which is formed in the insulating film 21, the insulating film 8 and the insulating film (i.e., the insulating film of the same layer as that of the gate insulating film 12 of the transfer MISFETs $Qt_1$ and $Qt_2$).

Over the other of the source regions and the drain regions of the transfer MISFETs $Qt_1$ and $Qt_2$, there is arranged a pad layer 23B which is formed at the step of forming the same third-layered gate material as the gate electrodes 23A of the load MISFETs $Qp_1$ and $Qp_2$. The pad layer 23B is connected with the other of the source regions and the drain regions of the transfer MISFETs $Qt_1$ and $Qt_2$ through the contact hole 22 which is formed in the insulating film and the insulating film (i.e., the same insulating film as the gate insulating film 12 of the transfer MISFETs $Qt_1$ and $Qt_2$).

As shown in FIG. 1, over the gate electrodes 23A of the load MISFETs $Qp_1$ and $Qp_2$, there is formed the gate insulating film 24 of the load MISFETs $Qp_1$ and $Qp_2$. This gate insulating film 24 is formed of a silicon oxide film 24, for example.

Over the gate insulating film 24 of the load MISFETs $Qp_1$ and $Qp_2$, there are formed the channel regions 26N, the source regions 26P and the drain regions 26P of the load MISFETs $Qp_1$ and $Qp_2$. The channel regions 26N are formed of a polycrystalline silicon film, for example, at the step of forming a fourth-layered gate material. This polycrystalline silicon film is doped with an n-type impurity (e.g., P) so as to change the threshold voltage of the load MISFETs $Qp_1$ and $Qp_2$ into an enhancement type. The pattern layout of the channel regions 26N, the source regions 26P and the drain regions 26P of the load MISFETs $Qp_1$ and $Qp_2$ is shown in FIG. 5.

Figure 5:
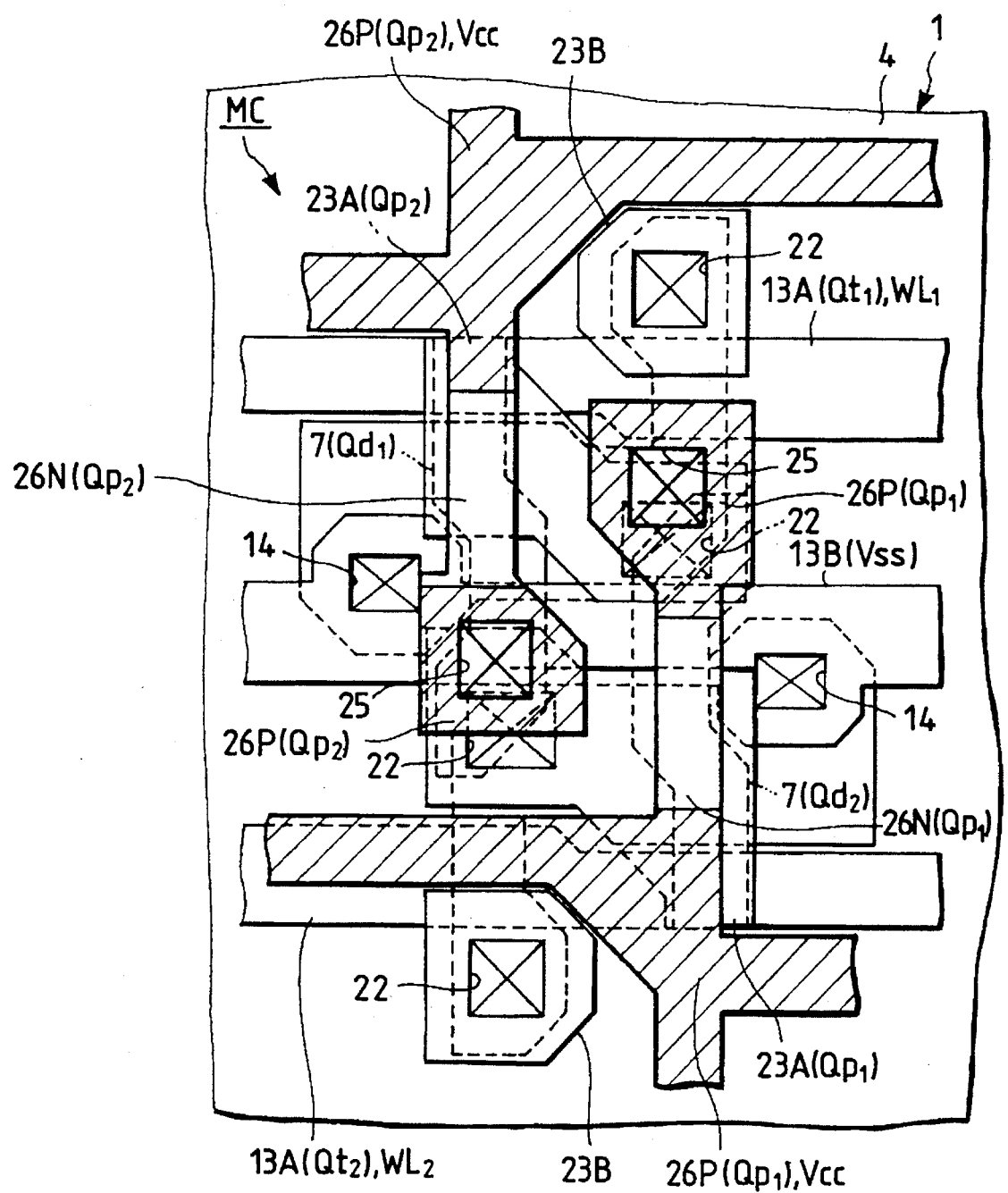
FIG. 5 is a top plan view of an essential portion showing a pattern layout of the memory cell of the semiconductor integrated circuit device according to the first embodiment of the present invention.

As shown in FIGS. 1 and 5, the drain regions 26P are formed at one-end side of the channel regions 26N of the load MISFETs $Qp_1$ and $Qp_2$, and the source regions 26P are formed at the other end side. The drain regions 26P and the source regions 26P are made integral with the channel regions 26N at the step of forming the same fourth-layered gate material (i.e., polycrystalline silicon) as that of the channel regions 26N. The polycrystalline silicon film forming the drain regions 26P and the source regions 26P is doped with a p-type impurity (e.g., boron (B) or $BF_2$). Incidentally, the drain regions 26P and the source regions 26P excepting the channel regions 26N are hatched in FIG. 5 so as to make the arrangement of the channel regions 26N, the drain regions 26P and the source regions 26P understandable. Thus, the load MISFETs $Qp_1$ and $Qp_2$ of the memory cell MC of this embodiment are constructed to have the so-called "bottom gate structure", in which the channel regions 26N, the source regions 26P and the drain regions 26P formed at the step of forming the fourth-layered gate material are arranged over the gate electrodes 23A formed at the step of forming the third-layered gate material.

In the load MISFETs $Qp_1$ and $Qp_2$, the drain regions 26P and the gate electrodes 23A are separated from each other through the channel regions 26N so as to prevent a trouble that a leakage current is established between the source regions 26P and the drain regions 26P when a high electric field is applied between the gate electrodes 23A and the drain regions 26P overlying the gate electrodes 23A and held in the state of the reference voltage ($V_{ss}$). In short, the load MISFETs $Qp_1$ and $Qp_2$ are constructed to have the so-called "offset structure" in which the drain regions 26P and the gate electrodes 23A are separated from each other without any overlap. Of the channel regions 26N of the load MISFETs $Qp_1$ and $Qp_2$, the regions separated from the gate electrodes 23A will be called offset regions 26off (as hatched in FIG. 6A) in the following. The advantages of this offset structure is disclosed on pp. 469 to 472 of Tech. Digest of IEDM (International Electron Device Meeting) 1990, for example. The disclosure of this document is incorporated in the present application as a reference.

The drain region 26P of the load MISFET $Qp_1$ is connected with the gate electrode 23A of the load MISFET $Qp_2$ through a contact hole 25 which is formed in the insulating film as the gate insulating film 24. Likewise, the drain region 26P of the load MISFET $Qp_2$ is connected with the gate electrode 23A of the load MISFET $Qp_1$ through the contact hole 25 which is formed in the insulating film as the gate insulating film 24.

With the source regions 26P of the load MISFETs $Qp_1$ and $Qp_2$, there is connected the power source line ($V_{cc}$) 26P. This power source line ($V_{cc}$) is formed integral with the channel regions 26N, the drain regions 26P and the source regions 26P at the step of forming the same fourth-layered gate material (i.e., polycrystalline silicon) as that of them.

The top plan pattern of the memory cell MC described above, i.e., the transfer MISFETs $Qt_1$ and $Qt_2$, the driver MISFETs $Qd_1$ and $Qd_2$ and the load MISFETs $Qp_1$ and $Qp_2$ is basically identical to that of the SRAM cell which is disclosed in U.S. Pat. No. 5,239,196 as filed by us and given Ser. No. 653,493 at U.S. Patent Office on Feb. 11, 1991. The total content of U.S. Pat. No. 5,239,196 is incorporated in this application as a reference.

Over the load MISFETs $Qp_1$ and $Qp_2$, as shown in FIG. 1, there is formed an insulating film 27. This insulating film 27 is formed of a laminated film of a silicon oxide film and a silicon nitride film, for example, to form a dielectric film of the later-described capacitance elements $C_1$ and $C_2$.

Over the insulating film 27, there are formed plate electrodes 28. These plate electrodes 28 are formed of a polycrystalline silicon film, for example, at the step of forming a fifth-layered gate material. This polycrystalline silicon film is doped with an n-type impurity (e.g., P). The pattern layout of the plate electrodes 28 are shown in FIG. 6. In order to make the illustration understandable, FIG. 6 shows only the fourth-layered gate material (i.e., the channel regions 26N, the source regions 26P, the drain regions 26P and the power source line ($V_{cc}$ 26P of the load MISFETs $Qp_1$ and $Qp_2$) and the third-layered gate material (i.e., the gate electrodes 23A and the pad layer 23B of the load MISFETs $Qp_1$ and $Qp_2$) of the conductive layer underlying the plate electrodes 28.

Figure 6A:
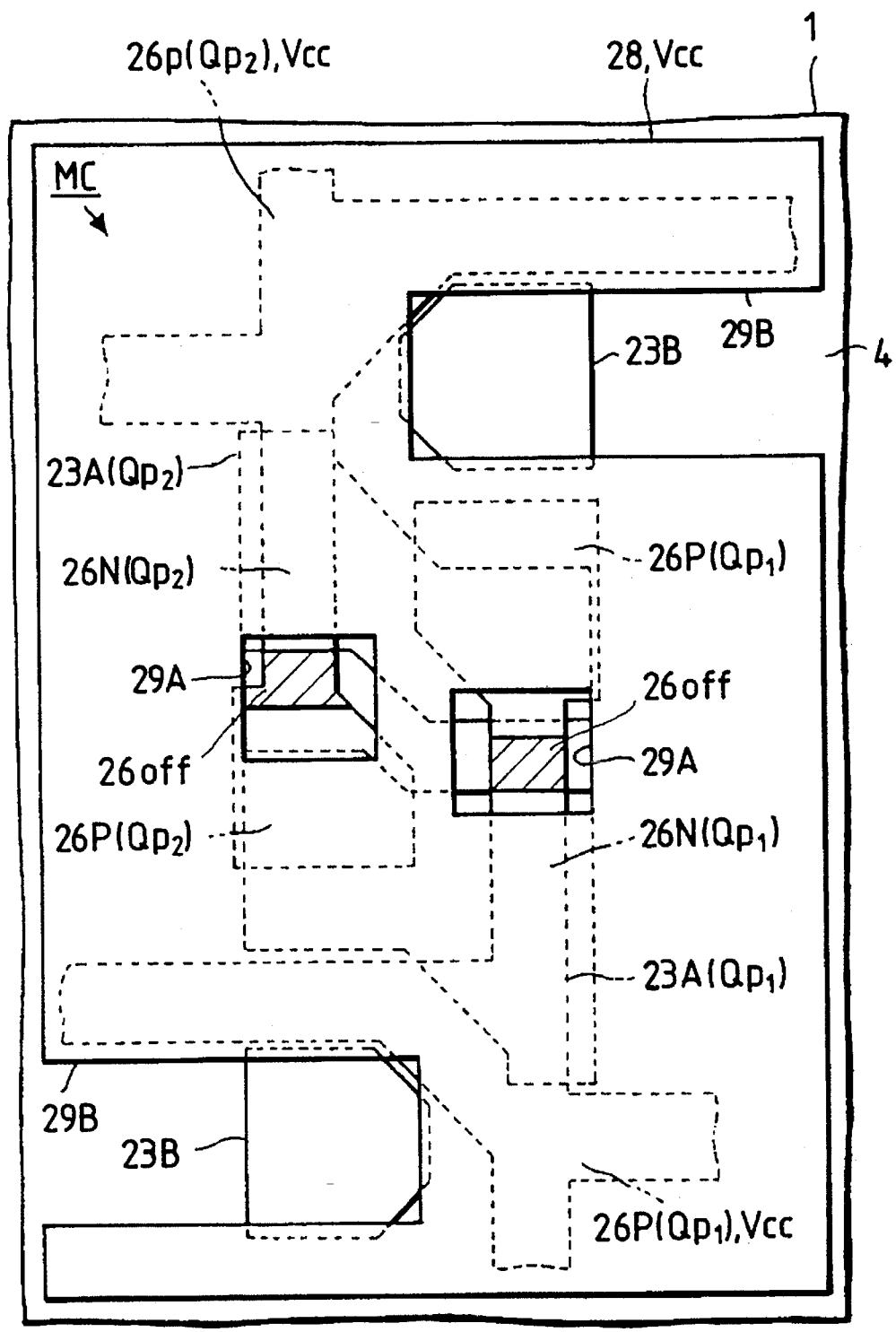
FIGS. 6A and 6B are top plan views of an essential portion showing a pattern layout of the memory cell of the semiconductor integrated circuit device according to the first embodiment of the present invention.
Figure 6B:
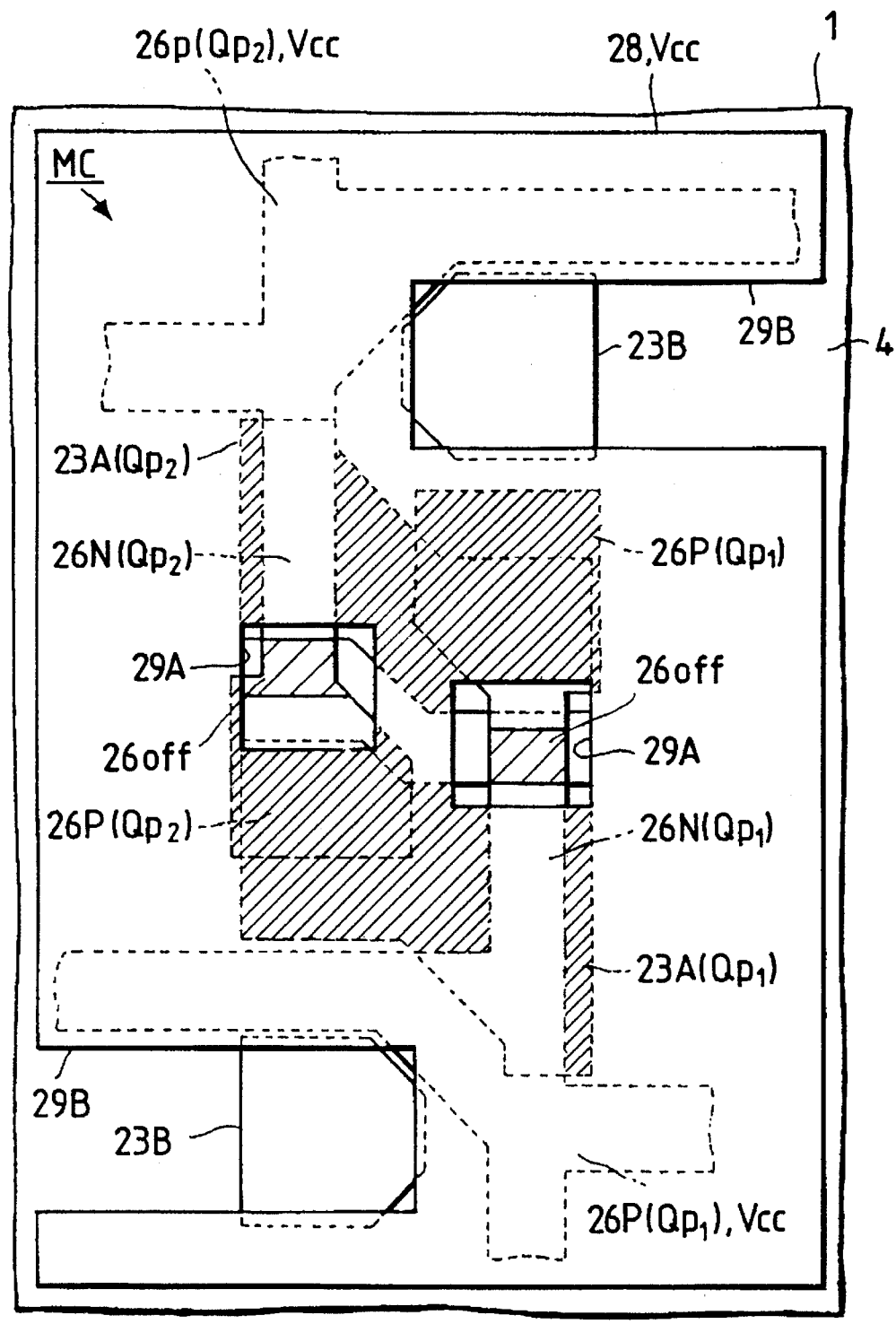
Figure 7:
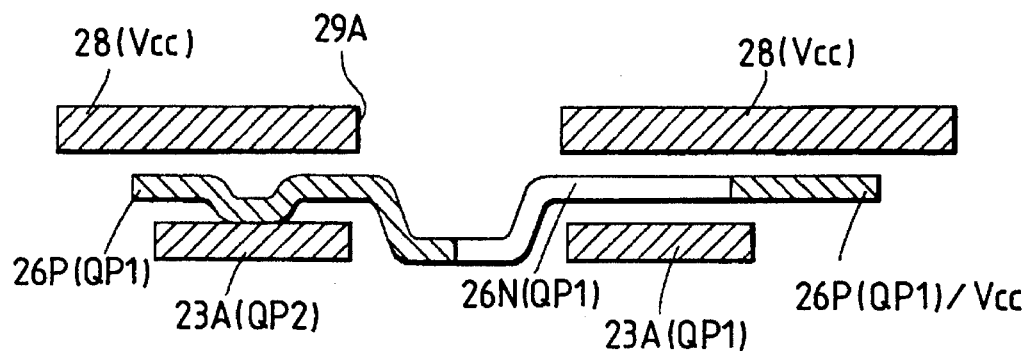
FIG. 7 is a schematic section schematically showing the arrangement of load MISFETs and plate electrodes formed over the MISFETs.

As shown in FIG. 1 and FIGS. 6A and 6B, the plate electrodes 28 are formed to cover the whole area of the memory cell MC. These plate electrodes 28 are supplied with the second supply voltage ($V_{cc1}$), which is exemplified in this embodiment by the supply voltage ($V_{cc}$) according to the structure, as will be described hereinafter.

As shown in FIGS. 6B and 9, the memory cell MC is equipped with the two capacitance elements $C_1$ and $C_2$. In case of the SRAM of this embodiment, these capacitance elements $C_1$ and $C_2$ are formed between the gate electrodes 23A of the load MISFETs $Qp_1$ and $Qp_2$ and the plate electrodes 28. Specifically, the capacitance elements $C_1$ and $C_2$ are constructed to have the stack (or laminate) structure, in which the gate electrodes 23A of the load MISFETs $Qp_1$ and $Qp_2$ are used as the first electrode, in which the plate electrodes 28 are used as the second electrode and in which the insulating film 27 between the gate electrodes 23A and the plate electrodes 28 is made of a dielectric film. Incidentally, FIG. 6B presents the same top plan pattern as that of FIG. 6A. In the hatched portions of FIG. 6B, the plate electrodes 28 and the gate electrodes 23A of the load MISFETs $Qp_1$ and $Qp_2$ are equivalently overlapped to form the capacitance elements $C_1$ and $C_2$. In other words, the plate electrodes 28 form the capacitance elements $C_1$ and $C_2$ between itself and storage nodes $n_1$ and $n_2$ of the memory cell MC.

Thus, in the SRAM of this embodiment, the capacitance elements $C_1$ and $C_2$ are formed between the load MISFETs $Qp_1$ and $Qp_2$ and the plate electrodes 28 covering the former and having a large area. As a result, the capacitance elements $C_1$ and $C_2$ can be given high capacitances to drastically improve the resistance of the memory cell MC to the α-ray error.

As shown in FIG. 1, FIGS. 6A and 6B and FIG. 7, the aforementioned plate electrodes 28 are formed in their portions with openings 29A and 29B. Of these, the opening 29A is formed over the drain regions 26P of the load MISFETs $Qp_1$ and $Qp_2$ so that the plate electrodes 28 may not cover the offset regions 26off of the load MISFETs $Qp_1$ and $Qp_2$. On the other hand, the opening 29B is formed over the aforementioned pad layer 28B which is formed at the step of forming the third-layered gate material as that of the gate electrodes 23A of the load MISFETs $Qp_1$ and $Qp_2$.

Thus, the SRAM of this embodiment is constructed to have the offset structure in which the plate electrodes 28 over the drain regions 26P of the load MISFETs $Qp_1$ and $Qp_2$ are formed with the opening 29A to separate the offset regions 26off and the plate electrodes 28 through that opening 29A.

Thanks to this structure, a high electric field be avoided from being applied between the plate electrodes 28 and the offset regions 26off when the load MISFETs $Qp_1$ and $Qp_2$ having their gate electrodes 23A supplied with the supply voltage ($V_{cc}$) are OFF. In other words, the plate electrodes 28 to be supplied with the supply voltage ($V_{cc}$) can be prevented from acting as the gate electrodes, to prevent any establishment of leakage current between the source regions 26P and the drain regions 26P by that high electric field. As a result, the source-drain current (the OFF current) in the OFF state of the load MISFETs $Qp_1$ and $Qp_2$ can be reduced to improve the ratio of the ON current to the OFF current thereby to retain the stable operation of the memory cell MC.

Incidentally, the other opening 29B formed in the plate electrodes 28 is formed to connect the pad layer 23B below the plate electrodes 28 and the complementary data lines DL (i.e., the first data line $DL_1$ and the second data line $DL_2$) over the plate electrodes 28 without being shorted to the plate electrodes 28.

Figure 8:
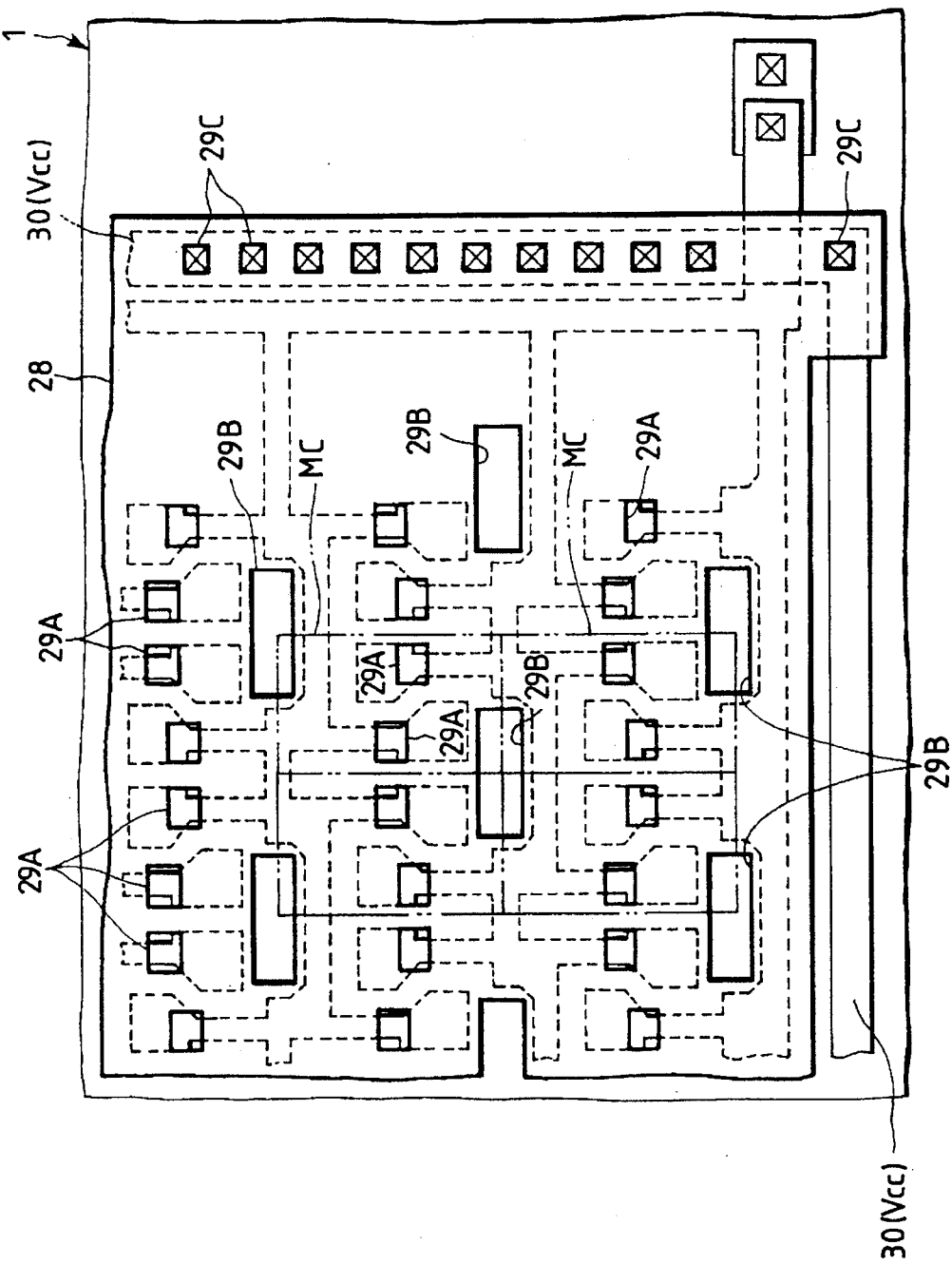
FIG. 8 is a top plan view of an essential portion showing a pattern layout of the memory cell of the semiconductor integrated circuit device according to the first embodiment of the present invention.
Figure 10:
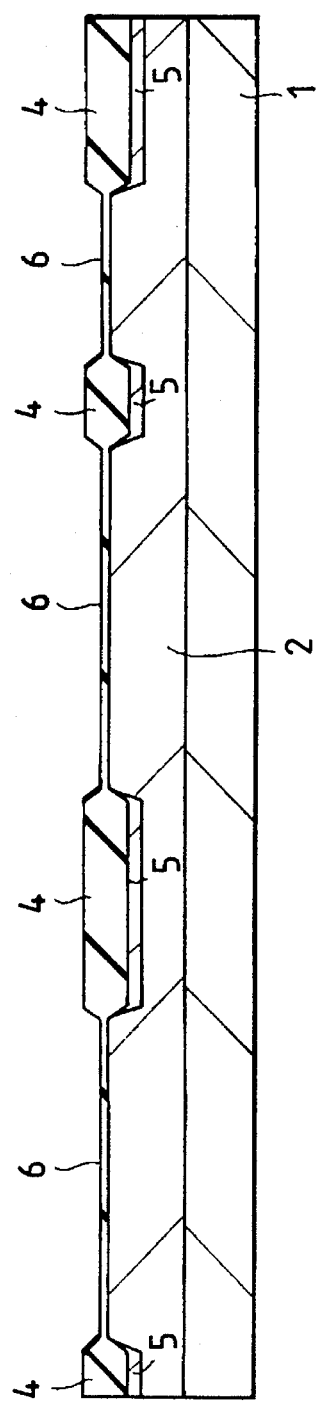
FIG. 10 is a section of an essential portion of the semiconductor substrate and shows a process of manufacturing the semiconductor integrated circuit device according to the first embodiment of the present invention.

As shown in FIG. 8, the plate electrodes 28 are integrally formed to cover the whole area of the memory cell array which is composed of a number of memory cells MC. As shown, moreover, the plate electrodes 28 have their one end extended to above a guard ring 30, which is formed along the peripheral portion of the memory cell array and made of an n-type well, so that they are supplied with the supply voltage ($V_{cc}$) from the guard ring 30 through contact holes 29C which are opened in the guard ring 30.

In the SRAM of this embodiment, more specifically, the plate electrodes 28 are supplied with the supply voltage ($V_{cc}$) not from the power source line ($V_{cc}$) connected with the source regions 26P of the load MISFETs $Qp_1$ and $Qp_2$ of the memory cell MC but from the outside of the memory cell array. In short, the power source lines ($V_{cc}$) 26P and the plate electrodes 28 are supplied with the supply voltage ($V_{cc}$) independently of each other from the outside of the memory cell array. Thanks to this structure, the supply noises from the outside, if any, in the semiconductor chip 1 having the SRAM can be avoided, from affecting the memory cell MC directly through the plate electrodes 28, so that the stable operation of the memory cell MC can be retained.

Over the plate electrodes 28, as shown in FIG. 1, there are formed through an insulating film 31 and an interlayer insulating film 32, an intermediate conductive layer 33, a subword line SWL and a main word line MWL. The intermediate conductive layer 83 is connected with the aforementioned pad layer 28B through a contact hole 34 which is formed in the interlayer insulating film 32, the insulating film 81 and the aforementioned insulating film 27.

The intermediate conductive layer 33, subword line SWL and main word line MWL enumerated above are individually formed of a refractory metal film of tungsten (W), for example, at the step of forming a first-layered wiring material. The insulating film 31 is formed of a silicon oxide film, for example, and the interlayer insulating film 32 is formed of a BPSG (Boron-doped Phospho Silicate Glass) film, for example.

Over the intermediate conductive layer 33, sub-word line SWL and main word line MWL described above, as shown in FIG. 1, there are arranged through a second-layered interlayer insulating film 35 the complementary data lines DL (the first data line $DL_1$ and the second data line $DL_2$). These complementary data lines DL are connected with the intermediate conductive layer 33 through a contact hole 36 which is formed in the interlayer insulating film 35.

The complementary data lines DL are formed, at the step of forming a second-layered wiring material, of a three-layered metal film which is prepared by laminating a barrier metal film, an aluminum alloy film and a barrier metal film sequentially, for example. The barrier metal is made of TiW, for example, and the aluminum alloy is made of aluminum containing Cu and Si added thereto, for example. The interlayer insulating film 35 is formed of a three-layered insulating film which is prepared by laminating a silicon oxide film, an SOG (Spin On Glass) film and a silicon oxide film sequentially, for example.

Of the aforementioned complementary data lines DL, the first data line $DL_1$ is connected with one (i.e., the $n^+$-type semiconductor region 18) of the source region and drain region of the transfer MISFET $Qt_1$, and the second data line $DL_2$ is connected with one (i.e., the $n^+$-type semiconductor region 18) of the source region and drain region of the transfer MISFET $Qt_2$. The complementary data lines DL and the $n^+$-type semiconductor regions 18 off the transfer MISFETs $Qt_1$ and $Qt_2$ are individually connected through the aforementioned intermediate conductive layer 33 and pad layer 23B.

Over the aforementioned complementary data lines DL, there is formed a final passivation film 37 for protecting the surface of the semiconductor chip 1. This final passivation film 37 is formed of a laminated film of a silicon oxide film and a silicon nitride film, for example.

Next, one example of the specific process of manufacturing the aforementioned SRAM will be described with reference to FIGS. 10 to 18.

First of all, the semiconductor substrate 1 made of $n^-$-type monocrystalline silicon having a specific resistance of about 10 [Ω/cm] is prepared. The $p^-$-type well 2 is formed in the portions of the regions to be formed with the memory cell array and the regions to be formed with the not-shown peripheral circuits, whereas the n-type well is formed in another portion of the regions to be formed with the peripheral circuit. The $p^-$-type well 2 is formed by extending and diffusing $BF_2$ whose ions have been introduced into the main surface of the semiconductor substrate 1, and the n-type well regions are formed by extending and diffusing P whose ions have been introduced into the main surface of the semiconductor substrate 1. Next, the element separating field insulating film 4 is formed on the main surface of the $p^-$-type well 2. At this time, the inversion preventing p-type channel stopper regions 5 are formed below the field insulating film 4. This field insulating film 4 is formed by growing the silicon oxide film to a thickness of about 420 to 480 nm by the thermal oxidation method (the LOGOS method) using the silicon nitride film as a non-oxidizable mask.

Next, the active regions of the $p^-$-type well 2 have their main surfaces doped with $BF_2$ ions so as to adjust the threshold voltage of the driver MISFETs $Qd_1$ and $Qd_2$, and the gate insulating film 6 of the driver MISFETs $Qd_1$ and $Qd_2$ is then formed. This gate insulating film 6 is formed by the thermally oxidation method to have a thickness of about 13 to 14 nm.

Next, there is deposited on the whole surface of the semiconductor substrate 1 a polycrystalline silicon film as the first-layered gate material. This polycrystalline silicon film is formed to have a thickness of about 90 to 110 nm by the CVD method. The polycrystalline silicon film is doped with P during the deposition so as to have its resistance reduced.

Next, there is deposited on the aforementioned polycrystalline silicon film the insulating film 8 which is formed of a silicon oxide film. This insulating film 8 is formed to have a thickness of about 135 to 165 nm by the CVD method. The insulating film 8 is formed to electrically isolate the gate electrodes 7 of the driver MISFETs $Qd_1$ and $Qd_2$ and the conductive layer to be formed over the former.

Figure 11:
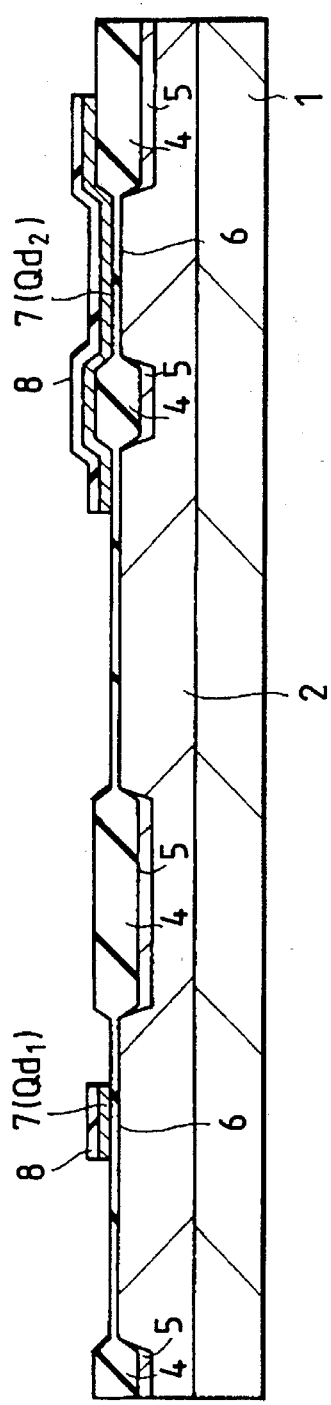
FIG. 11 is a section of an essential portion of the semiconductor substrate and shows a process of manufacturing the semiconductor integrated circuit device according to the first embodiment of the present invention.

Next, the gate electrodes 7 of the driver MISFETs $Qd_1$ and $Qd_2$ are formed (as shown in FIG. 11) by etching the insulating film 8 and the aforementioned underlying polycrystalline silicon film sequentially while using the photoresist film formed on the insulating film 8 as the mask and subsequently by asking and removing the photoresist film.

Next, a silicon oxide film is deposited all over the semiconductor substrate 1. This silicon oxide film is formed to have a thickness of about 160 to 200 nm by the CVD method. Next, this silicon oxide film is etched by the anisotropic etching method such as the RIE (Reactive Ion Etching) method to form the side wall spacers 9 on the side walls of the gate electrodes 7 of the driver MISFETs $Qd_1$ and $Qd_2$.

Next, the aforementioned gate insulating film 6 on the main surface in the active regions excepting those below the gate electrodes 7 of the driver MISFETs $Qd_1$ and $Qd_2$ is etched off by a dilute aqueous solution of hydrofluoric acid, and a new silicon oxide film is formed on the main surface of the active regions. This silicon oxide film is formed to have a thickness of about 9 to 11 nm by the thermal oxidation method.

Figure 12:
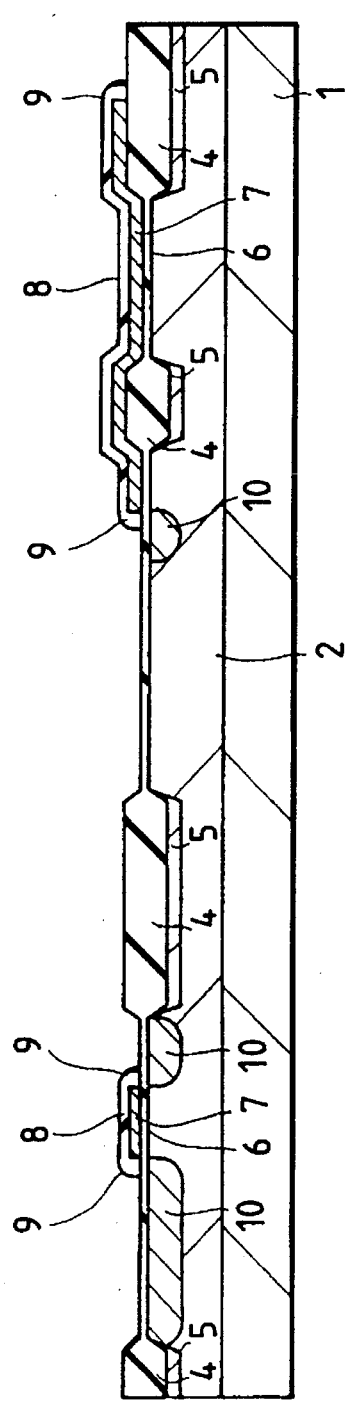
FIG. 12 is a section of an essential portion of the semiconductor substrate and shows a process of manufacturing the semiconductor integrated circuit device according to the first embodiment of the present invention.

Next, a photoresist mask is formed on the main surface of the semiconductor substrate 1 and is used as the mask to introduce P ions into the main surface of the $p^-$-type well 2 in the regions to be formed with the aforementioned driver MISFETs $Qd_1$ and $Qd_2$. Next, the photoresist film is ashed off, and the P in the main surface of the $p^-$-type well 2 is extended and diffused to form the n-type semiconductor regions 10 of the driver MISFETs $Qd_1$ and $Qd_2$ (as shown in FIG. 12).

Next, the main surface of the active regions of the $p^-$-type well 2 is doped with $BF_2$ ions for adjusting the threshold voltages of the transfer MISFETs $Qt_1$ and $Qt_2$, and the aforementioned silicon oxide film is etched from the main surface of the active regions by the dilute solution of hydrofluoric acid, to form the gate insulating film 12 of the transfer MISFETs $Qt_1$ and $Qt_2$. This gate insulating film 12 is formed to have a thickness of about 13 to 14 nm by the thermal oxidation method.

Next, the second-layered gate material is deposited on the whole surface of the semiconductor substrate 1. This gate material is formed of a laminated film (i.e., a polycide film) of a polycrystalline silicon film and a tungsten silicide film. At this time, the polycrystalline silicon film is deposited to a thickness of about 36 to 44 nm, and the photoresist film is then formed on the main surface of the semiconductor substrate 1. This photoresist film is used as the mask to etch the insulating film (i.e., the same insulating film as the gate insulating film 12) from the n-type semiconductor regions 10 of the driver MISFETs $Qd_1$ and $Qd_2$ thereby to form the contact hole 14.

Next, the photoresist film is ashed off, and the polycrystalline silicon film is further deposited to a thickness of about 36 to 44 nm. This polycrystalline silicon film is formed by the CVD method and is doped with P while being deposited so as to have its resistance reduced. Next, a tungsten silicide film is deposited on the polycrystalline silicon film. This tungsten silicide film is formed to have a thickness of about 72 to 88 nm by the CVD method.

Next, the insulating film 15 of a silicon oxide film is deposited on the aforementioned tungsten silicide film. This insulating film 15 is formed to have a thickness of about 270 to 330 nm by the CVD method. The insulating film 15 is formed to electrically isolate the gate electrodes 12 of the transfer MISFETs $Qt_1$ and $Qt_2$ and the conductive layer to be formed over the former.

Figure 13:
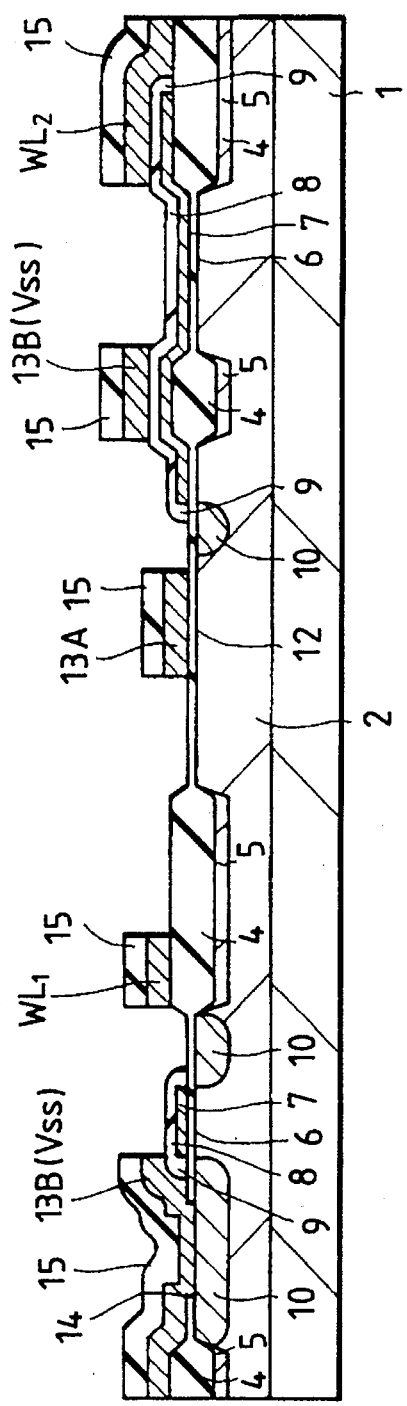
FIG. 13 is a section of an essential portion of the semiconductor substrate and shows a process of manufacturing the semiconductor integrated circuit device according to the first embodiment of the present invention.

Next, the photoresist film is formed on the aforementioned insulating film 15 and is used as the mask to etch the insulating film 15 and the aforementioned underlying second-layered gate material (i.e., the polycide film) sequentially. After this, the photoresist film is ashed off to form the gate electrodes 13A of the transfer MISFETs $Qt_1$ and $Qt_2$, the word lines WL (i.e., the first word line $WL_1$ and the second word line $WL_2$) and the reference voltage lines ($V_{ss}$) individually (as shown in FIG. 13).

Next, the photoresist film is formed on the main surface of the semiconductor substrate 1 and is used as the mask for introducing P ions into the main surface of the $p^-$-type well 2 in the regions to be formed with the transfer MISFETs $Qt_1$ and $Qt_2$. Next, the photoresist film is ashed off, and the P in the main surface of the $p^-$-type well 2 is extended and diffused to form the n-type semiconductor regions 17 of the transfer MISFETs $Qt_1$ and $Qt_2$.

Next, the silicon oxide film is deposited on the whole surface of the semiconductor substrate 1. This silicon oxide film is formed to have a thickness of about 270 to 330 nm by the CVD method. Next, this silicon oxide film is etched by the anisotropic etching method such as the RIE method to form the side wall spacers 16 on the individual side walls of the gate electrodes 13A of the transfer MISFETs $Qt_1$ and $Qt_2$, the word lines WL (i.e., the first word line $WL_1$ and the second word line $WL_2$) and the reference voltage line ($V_{ss}$) 13B.

Next, the photoresist film is formed on the main surface of the semiconductor substrate 1 and is used as the mask to introduce arsenic (As) into the main surfaces of the $p^-$-type well 2 of the regions to be formed with the driver MISFETs $Qd_1$ and $Qd_2$ and the regions to be formed with the transfer MISFETs $Qt_1$ and $Qt_2$. Next, the aforementioned photoresist film is ashed off, and the n$^+$-type semiconductor regions 11 are formed on the main surface of the p$^-$-type well 2 of the regions to be formed with the driver MISFETs Qd$_1$ and Qd$_2$, and the n$^+$-type semiconductor regions 18 are formed on the main surfaces of the p$^-$-type well 2 of the regions to be formed with the transfer MISFETs Qt$_1$ and Qt$_2$.

Figure 14:
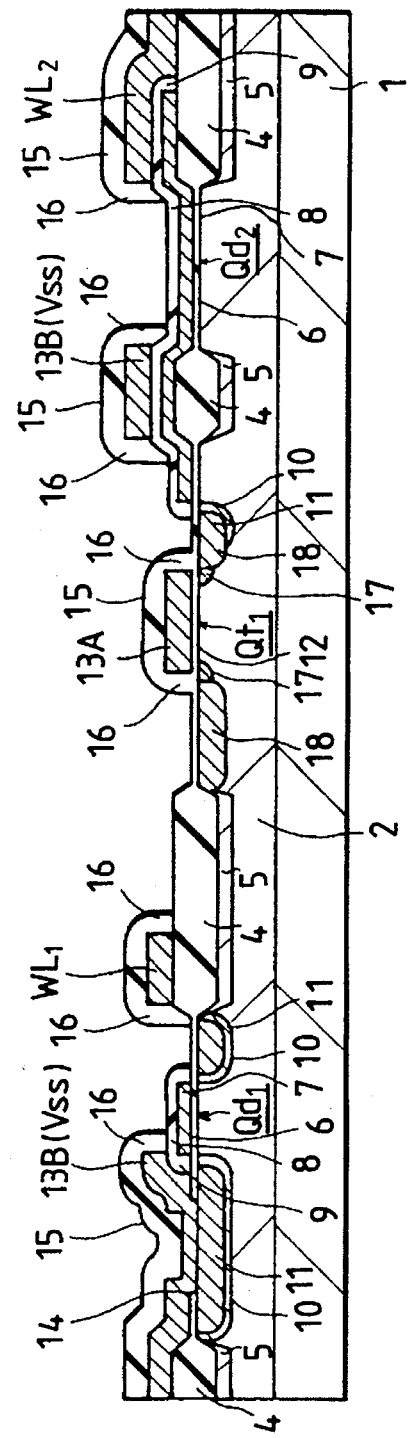
FIG. 14 is a section of an essential portion of the semiconductor substrate and shows a process of manufacturing the semiconductor integrated circuit device according to the first embodiment of the present invention.

Since the n-type semiconductor regions 10 are formed in advance on the main surface of the p$^-$-type well 2 of the regions to be formed with the driver MISFETs Qd$_1$ and Qd$_2$, these driver MISFETs Qd$_1$ and Qd$_2$ having the double diffused drain structure of the source regions and the drain regions are completed by forming the n$^+$-type semiconductor regions 11. Moreover, since the n-type semiconductor regions 17 are formed in advance on the main surface of the p$^-$-type well 2 of the regions to be formed with the transfer MISFETs Qt$_1$ and Qt$_2$, these transfer MISFETs Qt$_1$ and Qt$_2$ having the LDD structure of the source regions and the drain regions are completed (as shown in FIG. 14) by forming the n$^+$-type semiconductor regions 18.

Next, the insulating film 21 of a silicon oxide film is deposited on the whole surface of the semiconductor substrate 1. This insulating film 21 is formed to have a thickness of about 54 to 66 nm by the CVD method. Next, a photoresist film is formed on the insulating film 21 and is used as the mask to etch the insulating film 21, the insulating film 8 and the insulating film (i.e., the same insulating film as the gate insulating film 12 of the transfer MISFETs Qt$_1$ and Qt$_2$) thereby to form the contact hole 22 over either the source regions or the drain regions of the transfer MISFETs Qt$_1$ and Qt$_2$. At the same time, moreover, the photoresist film is used as the mask to etch the insulating film 21 and the insulating film (i.e., the same insulating film as the gate insulating film 12 of the transfer MISFETs Qt$_1$ and Qt$_2$) thereby to form the contact hole 22 over the other (i.e., either the source regions or the drain regions of the driver MISFETs Qd$_1$ and Qd$_2$) of the source regions or the drain regions of the transfer MISFETs Qt$_1$ and Qt$_2$.

Next, the polycrystalline silicon film of the third-layered gate material is deposited on the whole surface of the semiconductor substrate 1. This polycrystalline silicon film is formed to have a thickness of about 63 to 77 nm by the CVD method. This polycrystalline silicon film is doped with P while being deposited so as to have its resistance reduced. Next, the photoresist film on the polycrystalline silicon film is used as the mask to etch the polycrystalline silicon film and is then ashed off to form the gate electrodes 23A of the load MISFETs Qp$_1$ and Qp$_2$ and the pad layer 23B (as shown in FIG. 15).

Next, the gate insulating film 24 of the load MISFETs Qp$_1$ and Qp$_2$ is deposited on the whole surface of the semiconductor substrate 1 by the CVD method. After this, the photoresist film is formed on the gate insulating film 24 and is used as the mask to etch the gate insulating film 24 thereby to form the contact hole 25 over the gate electrodes 23A of the load MISFETs Qp$_1$ and Qp$_2$.

Next, the polycrystalline silicon film or the fourth-layered gate material is deposited on the whole surface of the semiconductor substrate 1. This polycrystalline silicon film is formed to have a thickness of about 36 to 44 nm by the CVD method. Next, the photoresist film on the polycrystalline silicon film is used as the mask to introduce P ions into the polycrystalline silicon film in the regions to be formed with the channel regions 26N of the load MISFETs Qp$_1$ and Qp$_2$. Next, the photoresist film is ashed off, and the new photoresist film on the polycrystalline silicon film is used as the mask to introduce ions of BF$_2$ into the polycrystalline silicon film to be formed with the source regions 26P and the drain regions 26P of the load MISFETs Qp$_1$ and Qp$_2$ and the power source line (V$_{cc}$) 26P.

Next, the aforementioned photoresist film is ashed off, and the new photoresist film on the aforementioned polycrystalline silicon film is used as the mask to etch the polycrystalline silicon film thereby to form the channel regions 26N, the source regions 26P and the drain regions 26P of the load MISFETs Qp$_1$ and Qp$_2$ and the power source line (V$_{cc}$) 26P. At the same time, moreover, the photoresist film is used as the mask to etch the gate insulating film 24 of the load MISFETs Qp$_1$ and Qp$_2$ below the polycrystalline silicon film, thereby to expose the individual portions of the gate electrodes 23A of the load MISFETs Qp$_1$ and Qp$_2$ and the pad layer 23B below the gate insulting film 24 to the outside (as shown in FIG. 16).

Next, the aforementioned photoresist film is ashed off, and a thin oxide film is formed by the thermal oxidation method on the individual surfaces of the channel regions 26N, the source regions 26P, the drain regions 26P and the partially exposed gate electrodes 23A of the load MISFETs Qp$_1$ and Qp$_2$. This oxide film is formed to improve the breakdown voltages of the load MISFETs Qp$_1$ and Qp$_2$.

Next, the insulating film 27 for the dielectric film of the capacitance elements C$_1$ and C$_2$ is deposited on the whole surface of the semiconductor substrate 1 by the CVD method. This insulating film 27 is formed of a laminated film of a silicon oxide film and a silicon nitride film, of which the lower silicon oxide film is given a thickness of about 13 to 17 nm whereas the upper silicon nitride film is given a thickness of about 5 to 7 nm.

Next, the photoresist film on the aforementioned insulating film 27 is used as the mask to etch the insulating film 27 from the aforementioned pad layer 23B and is then ashed off. Next, the polycrystalline silicon film of the fifth-layered gate material is deposited on the whole surface of the semiconductor substrate 1. This polycrystalline silicon film is formed to have a thickness of about 27 to 33 nm by the CVD method. The polycrystalline silicon film is doped with P while being deposited so as to have its resistance reduced.

Next, the photoresist film on the aforementioned polycrystalline silicon film is used as the mask to etch the polycrystalline silicon film. As a result, there are completed the plate electrodes 28 which are formed with the opening 29A over the drain regions 26P of the load MISFETs Qp$_1$ and Qp$_2$ and the opening 29B over the pad layer 23B. Thus, there are completed the capacitance elements C$_1$ and C$_2$ having the stack structure in which the gate electrodes 23A of the load MISFETs Qp$_1$ and Qp$_2$ are used as the first electrode, and in which the plate electrodes 28 are used as the second electrode and in which the insulating film 27 between the gate electrodes 23A and the plate electrodes 23 is formed of a dielectric film.

Figure 17:
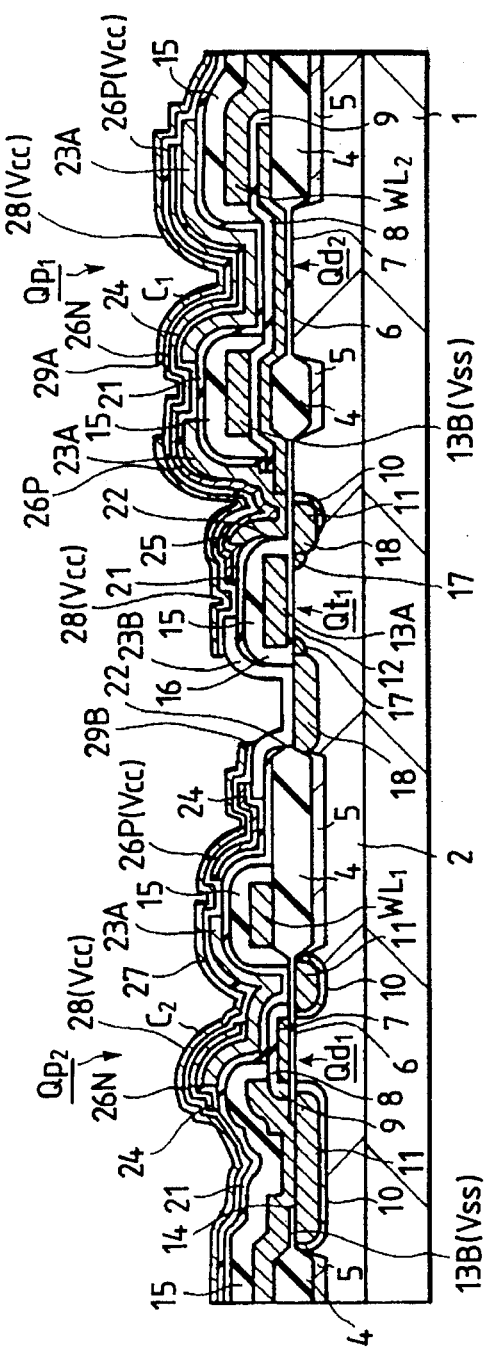
FIG. 17 is a section of an essential portion of the semiconductor substrate and shows a process of manufacturing the semiconductor integrated circuit device according to the first embodiment of the present invention.

At the same time, moreover, only the upper silicon oxide film of the insulating film 27 (i.e., the laminated film of the silicon oxide film and the silicon nitride film) below the aforementioned polycrystalline silicon film is etched by using the aforementioned photoresist film as the mask. As a result of this etching, only the upper silicon nitride film is removed from the insulating film which is exposed to the bottoms of the openings 29A and 29B of the plate electrodes 28 and the regions to be formed with the peripheral circuits. Moreover, this etching is carried out by the isotropic etching method using etching gases such as (CF$_4$+O$_2$) (as shown in FIG. 17) so that the lower silicon oxide film may be prevented from being over-etched to expose the channel regions 26N and the gate electrodes 23A of the load MISFETs Qp$_1$ and Qp$_2$.

Thus, in the SRAM of this embodiment, the insulating film 27 forming the dielectric film of the capacitance elements $C_1$ and $C_2$ has its portion formed of the silicon nitride film having a higher breakdown voltage than that of the silicon oxide film. Thanks to this construction, the insulating film 27 can be made thinner than that of the case, in which the dielectric film is formed of a single layer of a silicon oxide film, to increase the capacitances of the capacitance elements $C_1$ and $C_2$.

Moreover, since the insulating film 27 covering the load MISFETs $Qp_1$ and $Qp_2$ has its portion formed of the silicon nitride film having a higher water resistance than that of the silicon oxide film, it is possible to prevent the humidity from invading from the surface of the semiconductor chip 1 into the load MISFETs $Qp_1$ and $Qp_2$. As a result, the load MISFETs $Qp_1$ and $Qp_2$ can have their characteristics suppressed from fluctuations due to the invasion of humidity, to retain the stable operation of the memory cell MC.

On the other hand, the process of manufacturing the SRAM according to this embodiment is effected by etching the gate insulating film 24 from the gate electrodes 23A of the load MISFETs $Qp_1$ and $Qp_2$ to exit pose the gate electrodes 23A partially to the outside and subsequently by depositing the insulating film 27 forming the dielectric film of the capacitance elements $C_1$ and $C_2$ on the load MISFETs $Qp_1$ and $Qp_2$. Thanks to this construction, the dielectric film between the load MISFETs $Qp_1$ and $Qp_2$ and the plate electrodes 28 can be thinned to increase the capacitances of the capacitance elements $C_1$ and $C_2$.

According to the SRAM manufacturing process of this embodiment, on the other hand, simultaneously as the polycrystalline silicon film or the fifth-layered gate material is etched to form the plate electrodes 28 covering the memory cell array, the silicon nitride film forming a portion of the insulating film 27 below that polycrystalline silicon film is etched to remove the silicon nitride film from the bottoms of the openings 29A and 29B of the plate electrodes 28 and the regions to be formed with the peripheral circuits. Thanks to this construction, the fluctuations of the threshold voltages of the peripheral circuits (or their component MISFETs), which might otherwise be caused by forming the peripheral circuits with the silicon nitride film as is hardly permeable to hydrogen, can be suppressed to retain the stable operation of the SRAM.

Next, the photoresist film having been used for etching the aforementioned plate electrodes 28 is ashed off, and the insulating film of the silicon oxide film and the interlayer insulating film 32 of the BPSG are then sequentially deposited on the whole surface of the semiconductor substrate 1. The insulating film 31 is formed to have a thickness of about 135 to 165 nm by the CVD method. The interlayer insulating film 32 is formed to have a thickness of about 270 to 330 nm by the CVD method.

Next, the photoresist film on the aforementioned interlayer insulating film 32 is used as the mask to etch the interlayer insulating film 32 and the insulating film 31 thereby to form the contact hole 34 over the aforementioned pad layer 23B which is arranged over either the source region or the drain region of the transfer MISFETs $Qt_1$ and $Qt_2$. After this, the photoresist film is ashed off.

Figure 18:
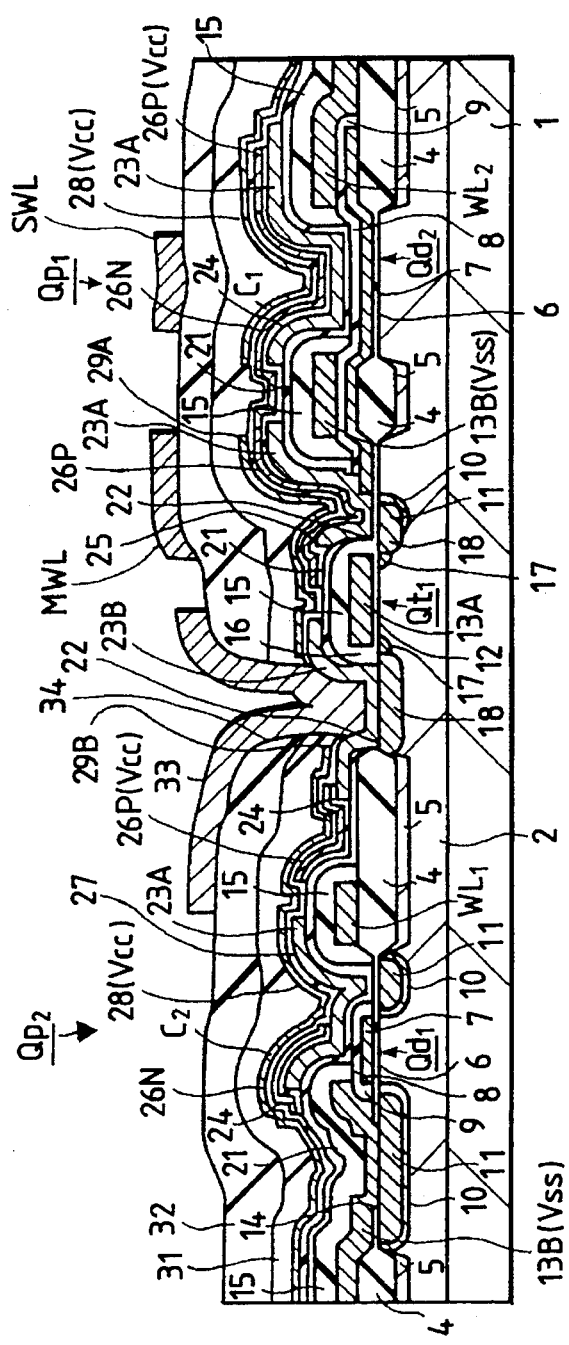
FIG. 18 is a section of an essential portion of the semiconductor substrate and shows a process of manufacturing the semiconductor integrated circuit device according to the first embodiment of the present invention.

Next, the tungsten film or the first-layered wiring material is deposited on the whole surface of the semiconductor substrate 1. This tungsten film is formed to have a thickness of about 300 nm by the sputtering method. Next, the photoresist film on the tungsten film is used as the mask to etch the tungsten film thereby to form the intermediate conductive layer 33, the sub-word line SWL and the main word line MWL. After this, the photoresist film is ashed off (as shown in FIG. 18).

Next, there are deposited on the whole surface of the semiconductor substrate 1 the interlayer insulating film 35 of the three-layered film which is prepared by laminating the silicon oxide film, the spin-on-glass film and the silicon oxide film sequentially. These silicon oxide films are formed by the plasma CVD method using oxygen ($O_2$) and tetraethoxysilane (Si $(OC_2H_5)_4$) as the source gas, and the lower silicon oxide film is given a thickness of about 450 to 550 nm whereas the upper silicon oxide film is given a thickness of about 360 to 440 nm. On the other hand, the spin-on-glass film is given a thickness of about 235 to 265 nm.

Since the silicon oxide film forming a portion of the aforementioned interlayer insulating film 35 is formed by the plasma CVD method using the aforementioned source gas, the interlayer insulating film 35 contains many hydrogen ions therein and facilitates transmission of the hydrogen which is to be supplied at the later-described hydrogen annealing step. As a result, a sufficient number of hydrogen atoms can be supplied to the uncombined bonds (or dangling bonds) which are present in the crystal surfaces of the polycrystalline silicon film forming the load MISFETs $Qp_1$ and $Qp_2$.

Next, the photoresist film formed on the aforementioned interlayer insulating film 35 is used as the mask to etch the interlayer insulating film 35 thereby to form the contact hole 36 over the intermediate conductive layer 33. After this, the photoresist film is ashed off.

Next, the second-layered wiring material is deposited on the whole surface of the semiconductor substrate 1. This wiring material is formed of the three-layered film which is prepared by laminating the TiW film, the aluminum alloy film and the TiW film sequentially. These TiW films are formed by the sputtering method, and the lower TiW film is given a thickness of about 60 nm whereas the upper TiW film is given a thickness of about 200 nm. The aluminum alloy film is formed to have a thickness of about 800 nm by the sputtering method. Subsequently, the photoresist film formed on the TiW film is used as the mask to etch the TiW film, the aluminum alloy film and the TiW film sequentially thereby to form the complementary data lines DL (i.e., the first data line $DL_1$ and the second data line $DL_2$).

Next, this photoresist film is ashed off, and the final passivation film 37 formed of the laminated film of the silicon oxide film and the silicon nitride film is deposited on the whole surface of the semiconductor substrate 1. The silicon oxide film is formed by the plasma CVD method using oxygen and tetraethoxysilane as the source gas, and the silicon nitride film is formed by the plasma CVD method using monosilane ($SiH_4$) and nitrogen (or ammonia) as the source gas. Since the silicon oxide film and the silicon nitride film forming the final passivation film 37 are formed by the plasma CVD methods, many hydrogen ions are contained in the final passivation film 37 and act as a hydrogen supply source for the polycrystalline silicon film forming the load MISFETs $Qp_1$ and $Qp_2$.

In this embodiment, moreover, the hydrogen annealing is carried out midway of the step of depositing the final passivation film 37, to supply the hydrogen to the polycrystalline silicon film forming the load MISFETs $Qp_1$ and $Qp_2$. First of all, the silicon oxide film is deposited to a thickness of about 360 to 440 nm. After this, the hydrogen annealing is carried out in the nitrogen atmosphere containing hydrogen at about 400° C. for about 30 minutes, and the silicon oxide film is then deposited to a thickness of about 360 to 440 nm. Finally, the silicon nitride film of about 1.2 μm is deposited on the silicon oxide film.

By the hydrogen annealing described above, the hydrogen is supplied to the polycrystalline silicon film forming the load MISFETs $Qp_1$ and $Qp_2$ through the interlayer insulating film 35, the interlayer insulating film 32 and the insulating film 31. Incidentally, in the SRAM of this embodiment, the dielectric film (or the insulating film 27) between the polycrystalline silicon film (i.e., the fourth-layered gate material) forming the channel regions 26N, the source regions 26P and the drain regions 26P of the load MISFETs $Qp_1$ and $Qp_2$ and the plate electrodes 28 (i.e., the fifth-layered gate material) overlying the polycrystalline silicon film has its portion formed of such a silicon nitride film as is hardly permeable to the hydrogen atoms. By forming the opening 29A in portions of the plate electrodes 28, however, sufficient hydrogen can be supplied through that opening 29A to the polycrystalline silicon film forming the load MISFETs $Qp_1$ and $Qp_2$.

Thus, in the SRAM of this embodiment, both the hydrogen supplied at the aforementioned hydrogen annealing and the hydrogen contained in the interlayer insulating film 35 and the final passivation film 37 can be supplied to the load MISFETs $Qp_1$ and $Qp_2$ through the opening 29A formed in portions of the plate electrodes 28. Thanks to this construction, a sufficient number of hydrogen atoms can be supplied to the uncombined bonds (i.e., the dangling bonds) which are present in the crystal surfaces of the polycrystalline silicon film forming the load MISFETs $Qp_1$ and $Qp_2$ so that the mutual conductance (Gm) of the load MISFETs $Qp_1$ and $Qp_2$ can be improved to improve the characteristics of the memory cell MC of the SRAM.

By the steps thus far described, the memory cell MC of the SRAM shown in FIG. 1 is completed. After this, the semiconductor chip 1 is packaged by a not-shown resin.
[Embodiment 2]

The load MISFETs $Qp_1$ and $Qp_2$ of the memory cell MC of the foregoing Embodiment 1 are constructed to have the so-called "bottom gate structure", in which the channel regions, t;he source regions and the drain regions are arranged over the gate electrodes. On the contrary, the load MISFETs $Qp_1$ and $Qp_2$ of Embodiment 2 are constructed to have the so-called "top gate structure", in which the gate electrodes are arranged over the channel regions, the source regions and the drain regions.

Figure 19:
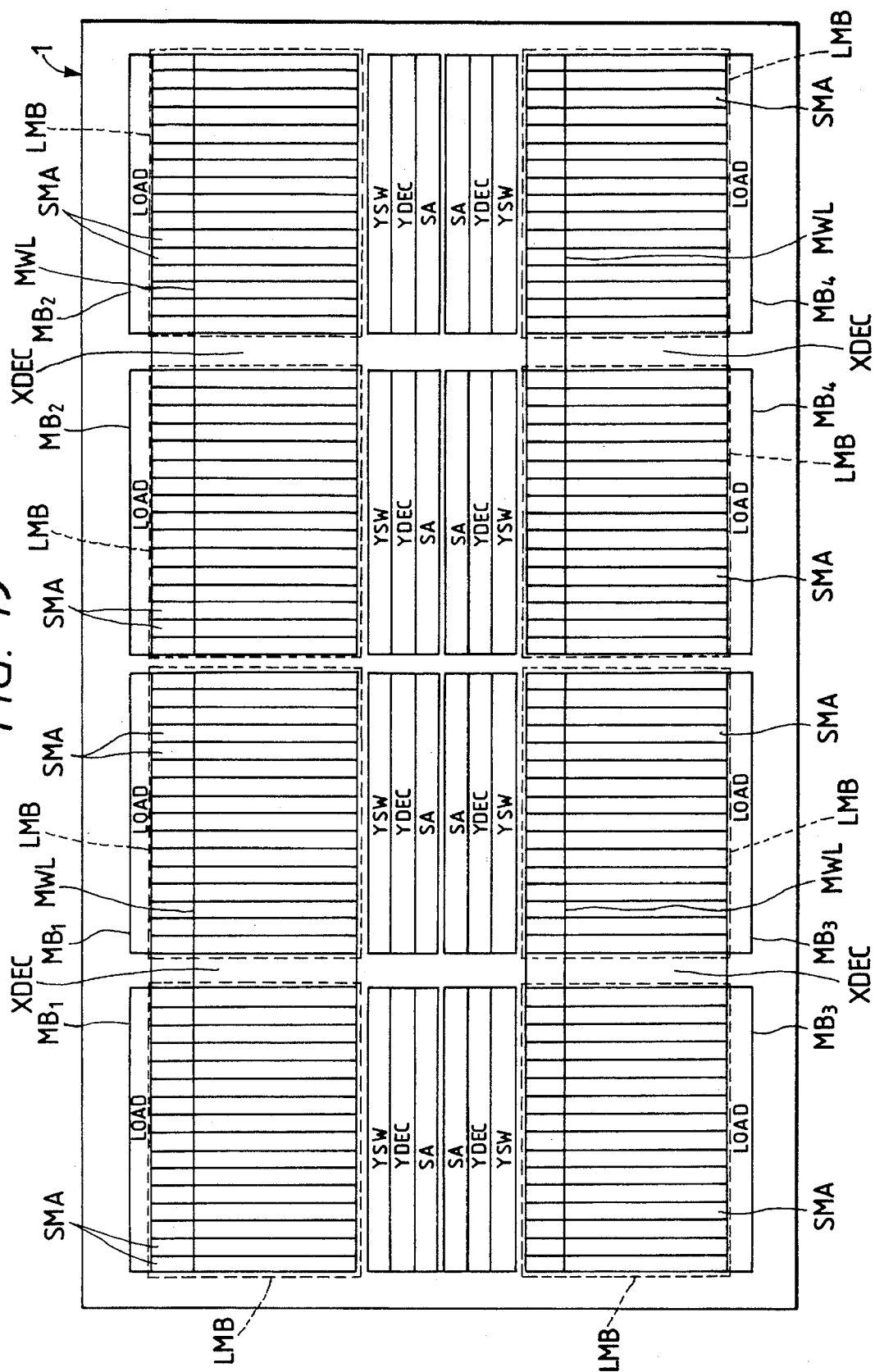
FIG. 19 is a (chip layout) diagram showing the whole structure of a semiconductor integrated circuit device according to a second embodiment of the present invention.
Figure 20:
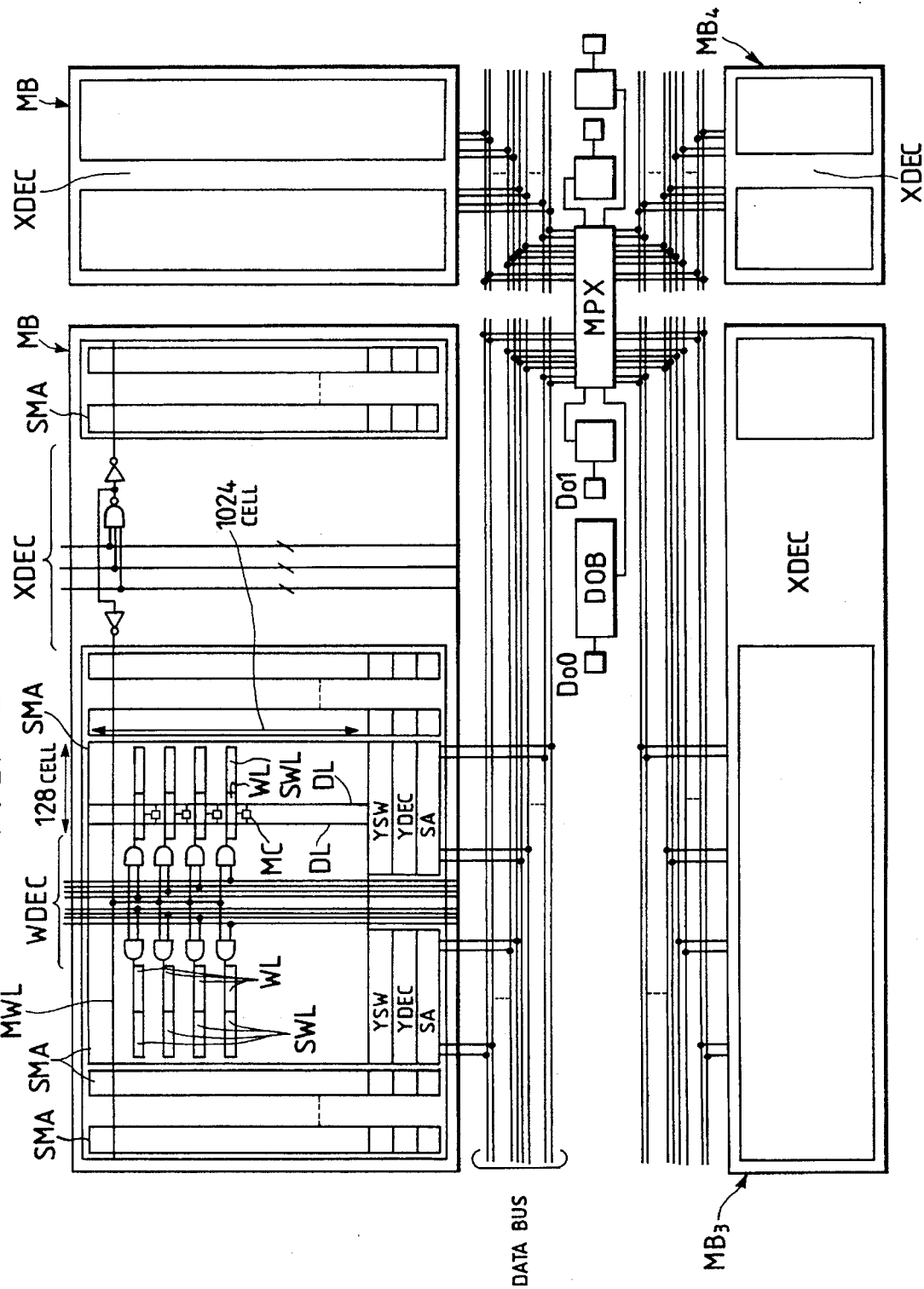
FIG. 20 is a (chip layout) diagram showing a portion of FIG. 19 in an enlarged scale.

FIG. 19 is a schematic (chip layout) diagram showing the whole structure of a SRAM according to this embodiment, and FIG. 20 is a schematic diagram showing a portion of FIG. 19 in an enlarged scale.

The rectangular semiconductor chip 1 is formed on its main surface with a SRAM having a capacity as high as about 4~64 Megabits [Mbits], for example, although not especially limited thereto. This SRAM has its memory cell array constructed of four memory blocks MB (i.e., $MB_1$ to $MB_4$), each of which is composed of thirty two subarrays SMA. Moreover, each subarray SMA is composed of memory cells of 1,024 rows×128 columns.

Each memory block MB is arranged at its one end with a load circuit LOAD and at its other end with a Y-selector circuit YSW, a Y-decoder circuit YDEC and a sense amplifier circuit SA. Moreover, each memory block MB is arranged at its center with an X-decoder circuit XDEC.

As shown in FIG. 20, the subarrays composing the aforementioned memory block MB are arranged at their individual ends with word decoder circuits WDEC. These word decoder circuits WDEC are selected by the aforementioned X-decoder circuit XDEC through the main word lines MWL which are extended in the column direction over the memory block MB.

The aforementioned word decoder circuit WDEC selects, through the sub-word lines SWL extending in the column direction over the subarrays SMA, the word lines WL extending in parallel with the sub-word lines SWL. The word lines WL are arranged individually for the memory cells MC arrayed in the column direction, and each memory cell MC is connected with two word lines WL (i.e., the first word line and the second word line) to be fed with a common select signal.

Over the aforementioned subarrays SMA, there are arranged the complementary data lines DL which are extended in the (row) direction to intersect the aforementioned main word lines MWL, sub-word lines SWL and word lines WL. The complementary data lines DL are composed of the two data lines (i.e., the first data line $DL_1$ and the second data line $DL_2$) extending in parallel with each other and are arranged each of the memory cells MC arrayed in the row direction. Each complementary data line DL has its one end connected with the load circuit LOAD and its other end connected with the sense amplifier circuit SA through the Y-selector circuit YSW.

As shown in FIGS. 19 and 20, the SRAM of this embodiment selects one of the word decoder circuits WDEC of the subarrays SMA through the main word lines MWL by the X-decoder circuit XDEC. The word decoder circuit WDEC thus selected selects the word lines WL (i.e., the first word line $WL_1$ and the second word line $WL_2$) through the sub-word lines SWL. Incidentally, the word lines WL are formed of the second-layered gate material, and the sub-word lines SWL are formed of the first-layered wiring material, as will be described hereinafter.

Specifically, the SRAM of this embodiment adopts the divided word line system, in which one set of word lines WL (i.e., the first word line $WL_1$ and the second word line $WL_2$) of the plurality of word lines WL extending over the subarrays SMA are selected by the word decoder circuit WDEC and the X-decoder circuit XDEC. Also is adopted the double word line system, in which those first word line $WL_1$ and second word line $WL_2$ of one set are connected with the word decoder circuit WDEC through the sub-word line SWL.

The aforementioned X-decoder circuit XDEC, Y-selector circuit YSW, Y-decoder circuit YDEC, sense amplifier circuit SA and load circuit LOAD constitute the peripheral circuits of the SRAM together with a multiplexer MPX and an output buffer DOB. These peripheral circuits are constructed of the CMOS for controlling the data writing, latching and reading operations of the memory cells MC.

Figure 21:
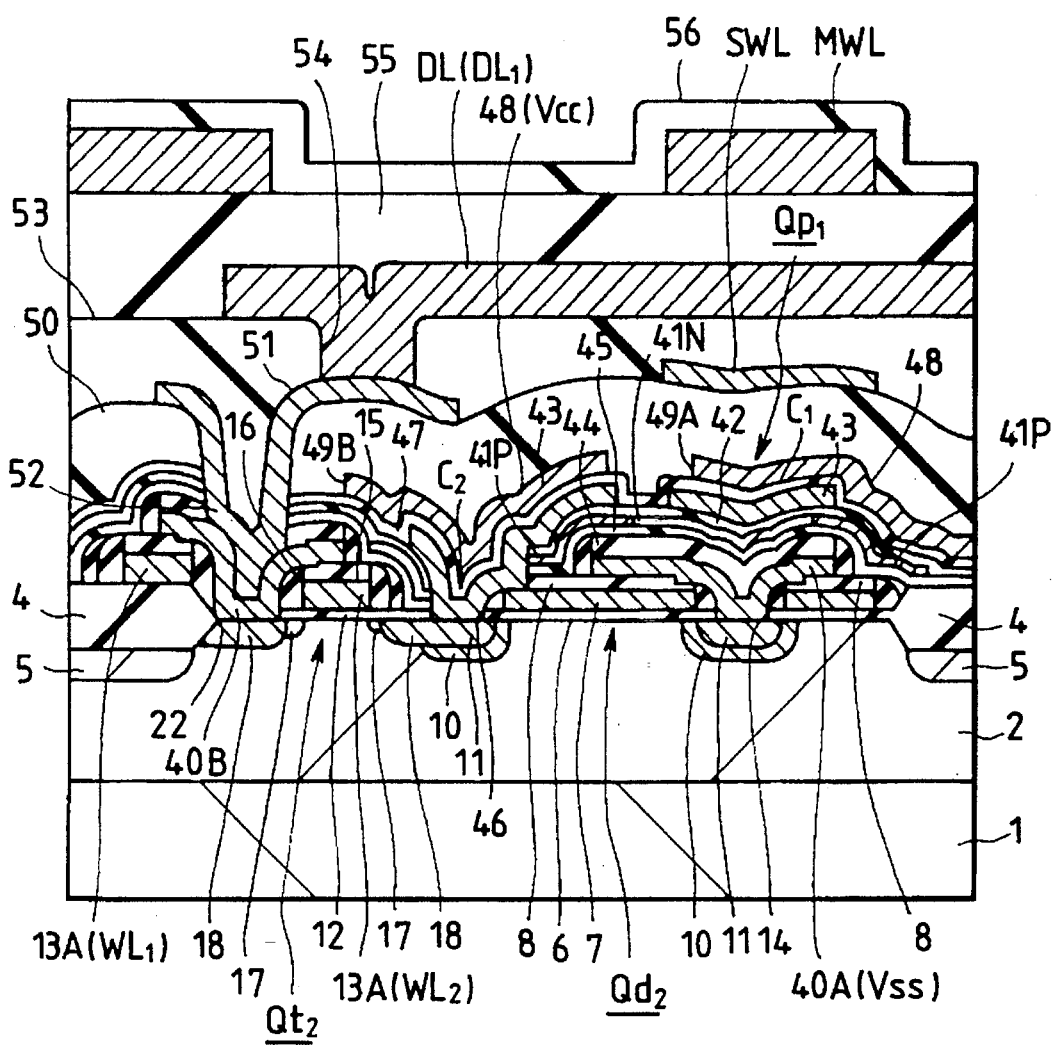
FIG. 21 is a section of an essential portion of a semiconductor substrate showing a memory cell of a semiconductor integrated circuit device according to the second embodiment of the present invention.

FIG. 21 is a section of an essential portion of a semiconductor substrate showing the memory cell MC of the SRAM of this embodiment, and FIGS. 22 to 28 are top plan views of an essential portion showing the pattern layout of the conductive layers forming the memory cell MC separately for the conductive layers.

As shown in FIG. 21, the semiconductor substrate 1 made of $n^-$-type monocrystalline silicon is formed on its main surface with the $p^-$-type well 2, which has its inactive region formed on its main surface with the element separating field insulating film 4 made of a silicon oxide film. Below this field insulating film 4, there are formed the p-type channel stopper regions 5 for preventing the inversion.

Of the transfer MISFETs $Qt_1$ and $Qt_2$, the driver MISFETs $Qd_1$ and $Qd_2$ and the load MISFETs $Qp_1$ and $Qp_2$ constituting the memory cell MC of the SRAM, the transfer MISFETs $Qt_1$ and $Qt_2$ and the driver MISFETs $Qd_1$ and $Qd_2$ are individually formed on the main surface of the active region of the $p^-$-type well 2 which is surrounded by the aforementioned field insulating film 4, and the load MISFETs $Qp_1$ and $Qp_2$ are formed over the driver MISFETs $Qd_1$ and $Qd_2$.

Figure 22:
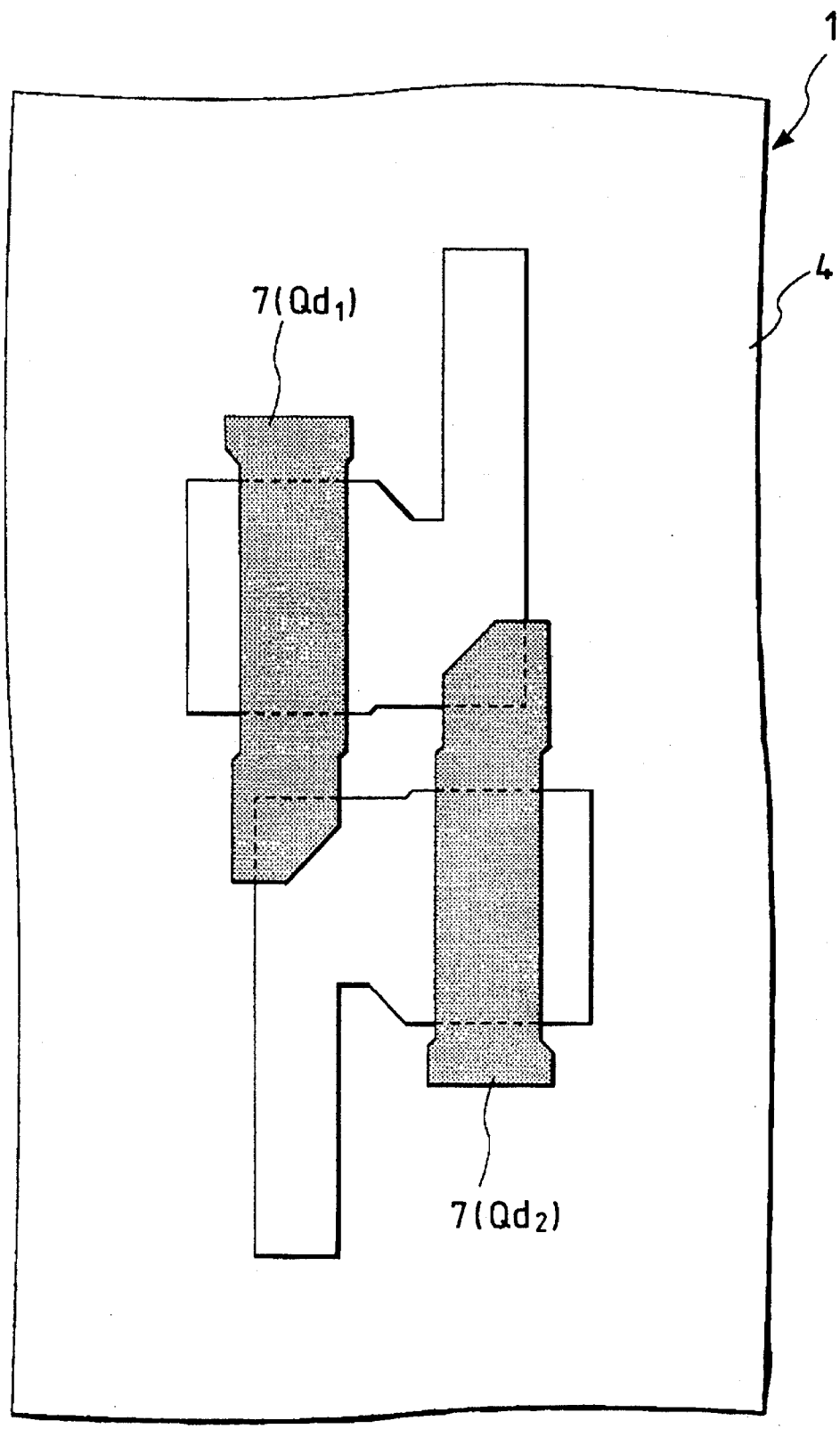
FIG. 22 is a top plan view of an essential portion showing a pattern layout of the memory cell of the semiconductor integrated circuit device according to the second embodiment of the present invention.

As shown in FIGS. 21 and 22, the driver MISFETs $Qd_1$ and $Qd_2$ are formed of the gate insulating film 6, the gate electrodes 7, the source regions and the drain regions. These source regions and drain regions are formed to have the double diffused drain structure, in which the $n^+$-type semiconductor regions 11 are formed over the n-type semiconductor regions 10. Incidentally, of the two driver MISFETs $Qd_1$ and $Qd_2$, semiconductor regions (10, 11) of the driver MISFET $Qd_1$ and the gate electrodes 7 and semiconductor regions (10, 11) of the driver MISFET $Qd_2$ are shown in FIG. 21.

The gate electrodes 7 of the driver MISFETs $Qd_1$ and $Qd_2$ are formed of a polycrystalline silicon film, for example, at the step of forming the first-layered gate material. This polycrystalline silicon film is doped with an n-type impurity (e.g., phosphorus or arsenic) so as to have its resistance reduced. Over the gate electrodes 7, there is formed the insulating film 8 for separating the gate electrodes 7 and the overlying conductive layer electrically. This insulating film 8 is made of a silicon oxide film, for example.

Figure 23:
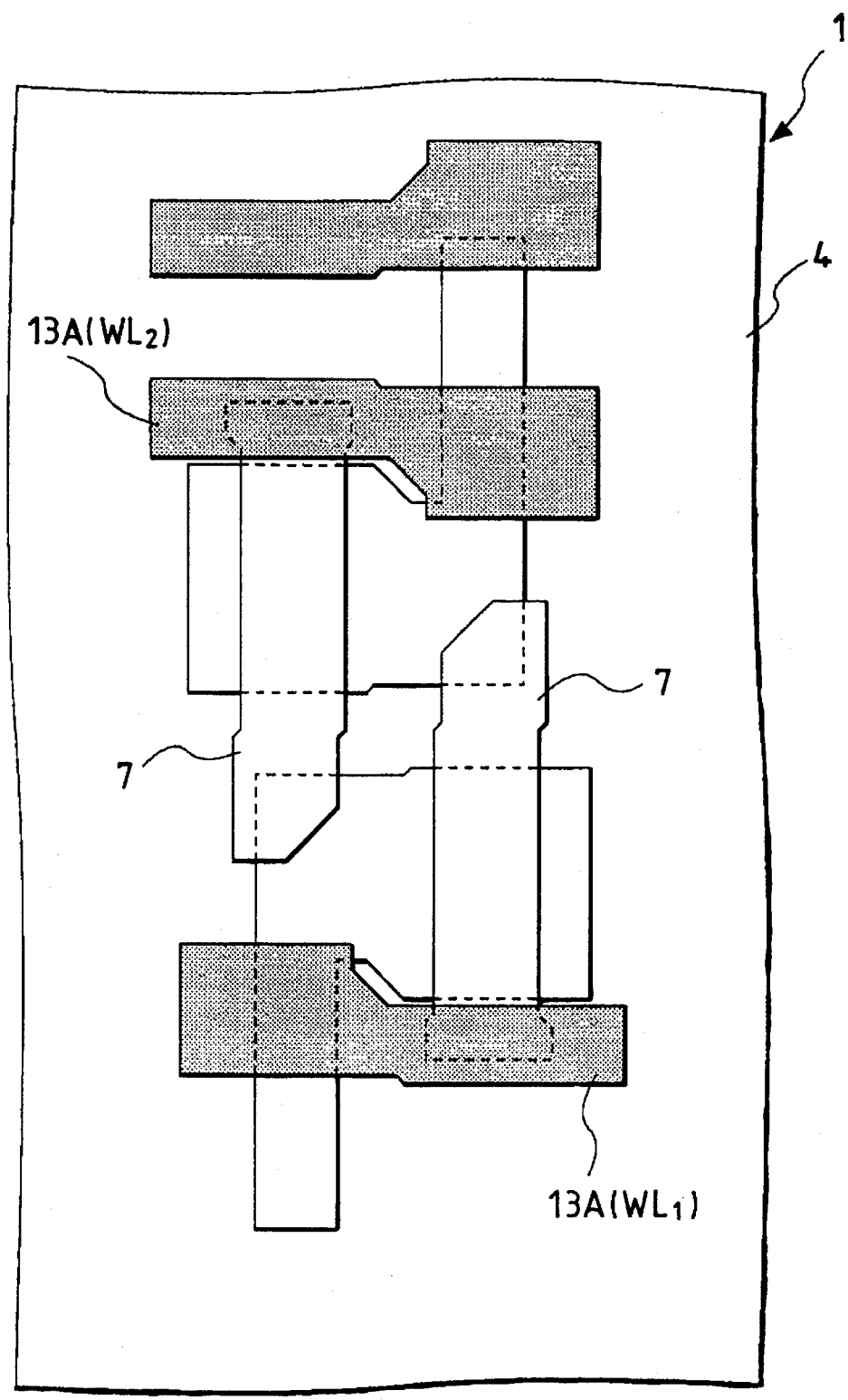
FIG. 23 is a top plan view of an essential portion showing a pattern layout of the memory cell of the semiconductor integrated circuit device according to the second embodiment of the present invention.

As shown in FIGS. 21 and 23, the transfer MISFETs $Qt_1$ and $Qt_2$ of the memory cell MC are formed on the main surface of the active region of the $p^-$-type well 2, which is surrounded by the field insulating film 4. The transfer MISFETs $Qt_1$ and $Qt_2$ are formed of the gate insulating film 12, the gate electrodes 13A, the source regions and the drain regions. These source regions and drain regions are formed of the lightly doped n-type semiconductor regions 17 and the heavily doped $n^+$-type semiconductor regions 18. In short, the source regions and drain regions of the transfer MISFETs $Qt_1$ and $Qt_2$ are constructed to have the LDD structure. Incidentally, of the two transfer MISFETs $Qt_1$ and $Qt_2$, FIG. 21 shows the gate insulating film 12, the gate electrodes 13A and semiconductor regions (17, 18) of the transfer MISFET $Qt_2$.

The gate electrodes 13A of the transfer MISFETs $Qt_1$ and $Qt_2$ are formed of a polycide film, for example, at the step of forming the second-layered gate material. The polycrystalline silicon film forming a portion of the polycide film is doped with an n-type impurity (e.g., phosphorus or arsenic) so as to have its resistance reduced. The gate electrodes 18A are made integral with the word lines WL. Specifically, the gate electrode 18A of the transfer MISFET $Qt_1$ is made integral with the first word line $WL_1$, and the gate electrode 13A of the transfer MISFET $Qt_2$ is made integral with the second word line $WL_2$.

Over the aforementioned gate electrodes 13A, there is formed the insulating film 15 for separating the gate electrodes 13A and the overlying conductive layer electrically. This insulating film 15 is formed of a silicon oxide film, for example. On the other hand, the gate electrodes 13A are formed on their longitudinal side walls with the side wall spacer 16 made of a silicon oxide film.

Figure 24:
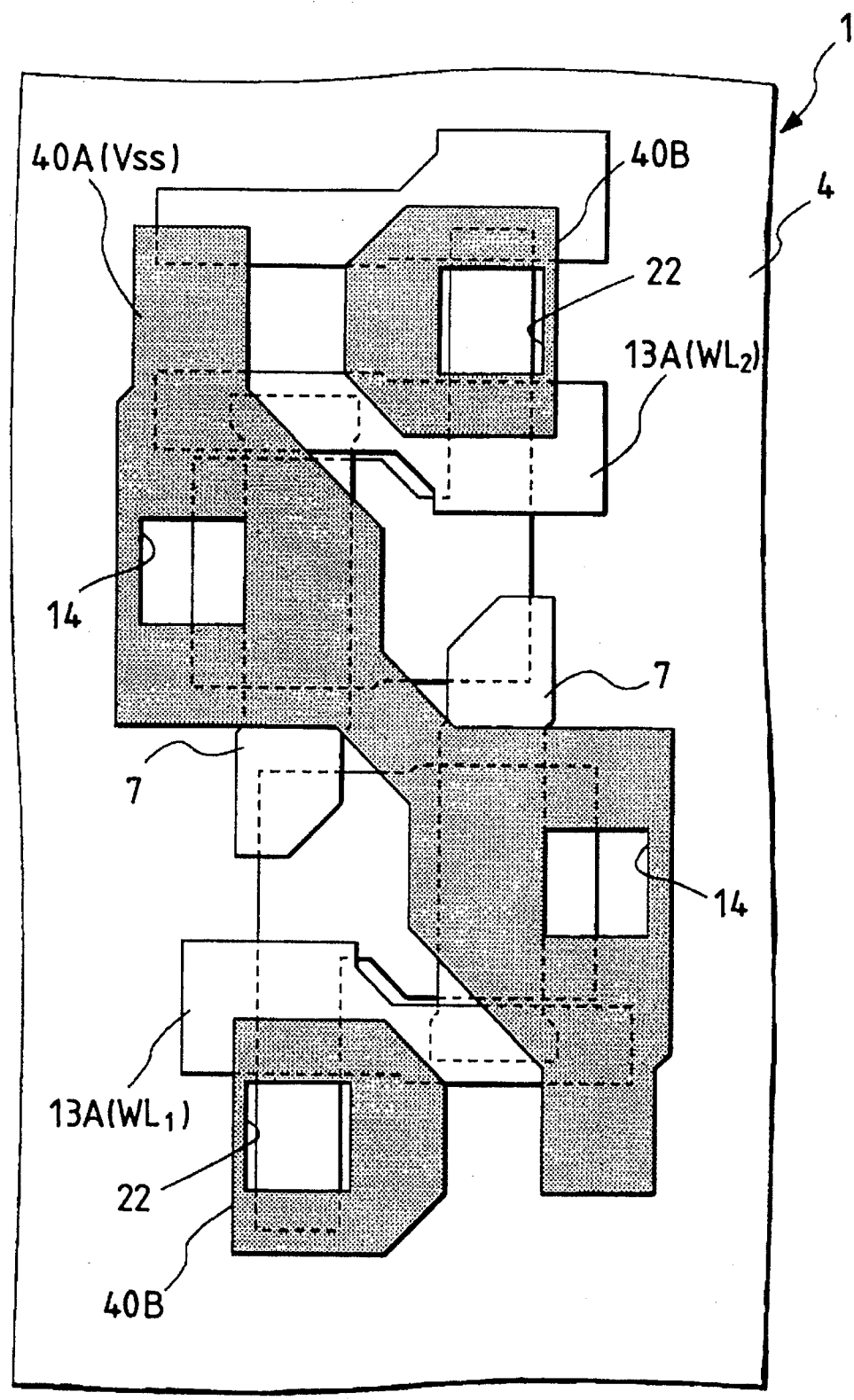
FIG. 24 is a top plan view of an essential portion showing a pattern layout of the memory cell of the semiconductor integrated circuit device according to the second embodiment of the present invention.

Over the driver MISFETs $Qd_1$ and $Qd_2$ and the transfer MISFETs $Qt_1$ and $Qt_2$, as shown in FIGS. 21 and 24, there is arranged a reference voltage line ($V_{ss}$) 40A. This reference voltage line ($V_{ss}$) 40A is connected with the source regions (i.e., the $n^+$-type semiconductor regions 11) of the driver MISFETs $Qd_1$ and $Qd_2$ through the contact hole 14 which is formed in the same insulating film as the gate insulating film 6 of the driver MISFETs $Qd_1$ and $Qd_2$. The reference voltage line ($V_{ss}$) 40A is formed of a polycide film, for example, like the gate electrodes 13A of the transfer MISFETs $Qt_1$ and $Qt_2$ at the step of forming the third-layered gate material. The polycrystalline silicon film forming a portion of the polycide film is doped with an n-type impurity (e.g., phosphorus or arsenic) so as to have its resistance reduced.

Over one $n^+$-type semiconductor regions 18 (i.e., the drain regions) of the transfer MISFETs $Qt_1$ and $Qt_2$, there is arranged a pad layer 40B which is formed of the same third-layered gate material as the reference voltage line ($V_{ss}$) 40A. The pad layer 40B is connected with the $n^+$-type semiconductor regions 18 (i.e., the drain regions) through the contact hole 22 which is formed in the same insulating film as the gate insulating film 12 of the transfer MISFETs $Qt_1$ and $Q_2$.

Figure 25:
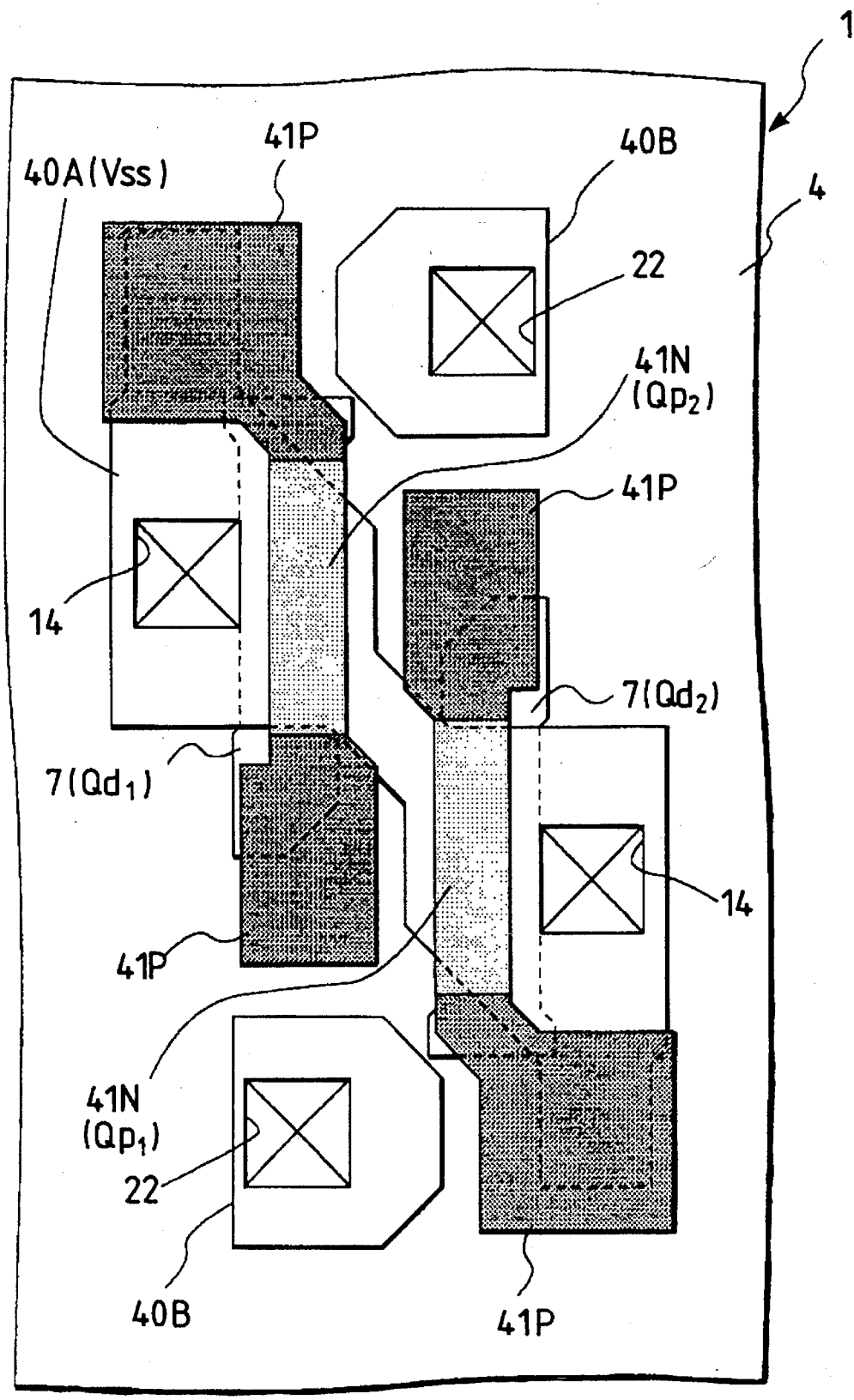
FIG. 25 is a top plan view of an essential portion showing a pattern layout of the memory cell of the semiconductor integrated circuit device according to the second embodiment of the present invention.

Of the load MISFETs $Qp_1$ and $Qp_2$ of the memory cell MC, as shown in FIGS. 21 and 25, the load MISFET $Qp_1$ is arranged over the region of the driver MISFET $Qd_2$ whereas the load MISFET $Qp_2$ is arranged over the region of the driver MISFET $Qd_1$. The load MISFETs $Qp_1$ and $Qp_2$ are individually formed of p-type source regions 41P, drain regions 41P, n-type channel regions 41N, a gate insulating film 42 and gate electrodes Incidentally, FIG. 21 shows the source region 41P, the drain region 41P, the channel region 41N and the gate insulating film 42 of the load MISFET $Qp_1$, and the gate electrode 43 of the load MISFET $Qp_2$.

The channel region 41N of the load MISFET $Qp_1$ is formed over the driver MISFET $Qd_2$ through an insulating film 44 and an insulating film 45. The channel region 41N of the load MISFET $Qp_2$ is formed over the driver MISFET $Qd_1$ through an insulating film 44 and an insulating film 45. These insulating films 44 and 45 are formed of a silicon oxide film, For example.

The individual channel regions 41N of the load MISFETs $Qp_1$ and $Qp_2$ are formed of a polycrystalline silicon film, For example, at the step of forming the fourth-layered gate material. This polycrystalline silicon film is doped in its portion (i.e., its source side) or in its whole surface with an n-type impurity (e.g., P) so as to set the threshold voltages of the load MISFETs $Qp_1$ and $Qp_2$ to the enhancement type.

The individual channel regions 41N of the load MISFETs $Qp_1$ and $Qp_2$ are formed at their one-end side with the drain regions 41P and at their other-end side with the source regions 41P. These drain regions and source regions 41P are made of the same fourth-layered gate material (i.e., the polycrystalline silicon film) as that of the channel regions 41N and are integrated with the channel regions 41N. Of the fourth-layered gate material, the polycrystalline silicon film in the regions forming the drain regions 41P and the source regions 41P is doped with a p-type impurity (e.g., boron).

The individual gate insulating films 42 of the load MISFETs $Qp_1$ and $Qp_2$ are formed over the aforementioned polycrystalline silicon film which forms the channel regions 41N, the drain regions 41P and the source regions 41P of the load MISFETs $Qp_1$ and $Qp_2$. The gate insulating films 42 are formed of a silicon oxide film having a thickness of about 10 to 60 nm, for example.

Figure 26:
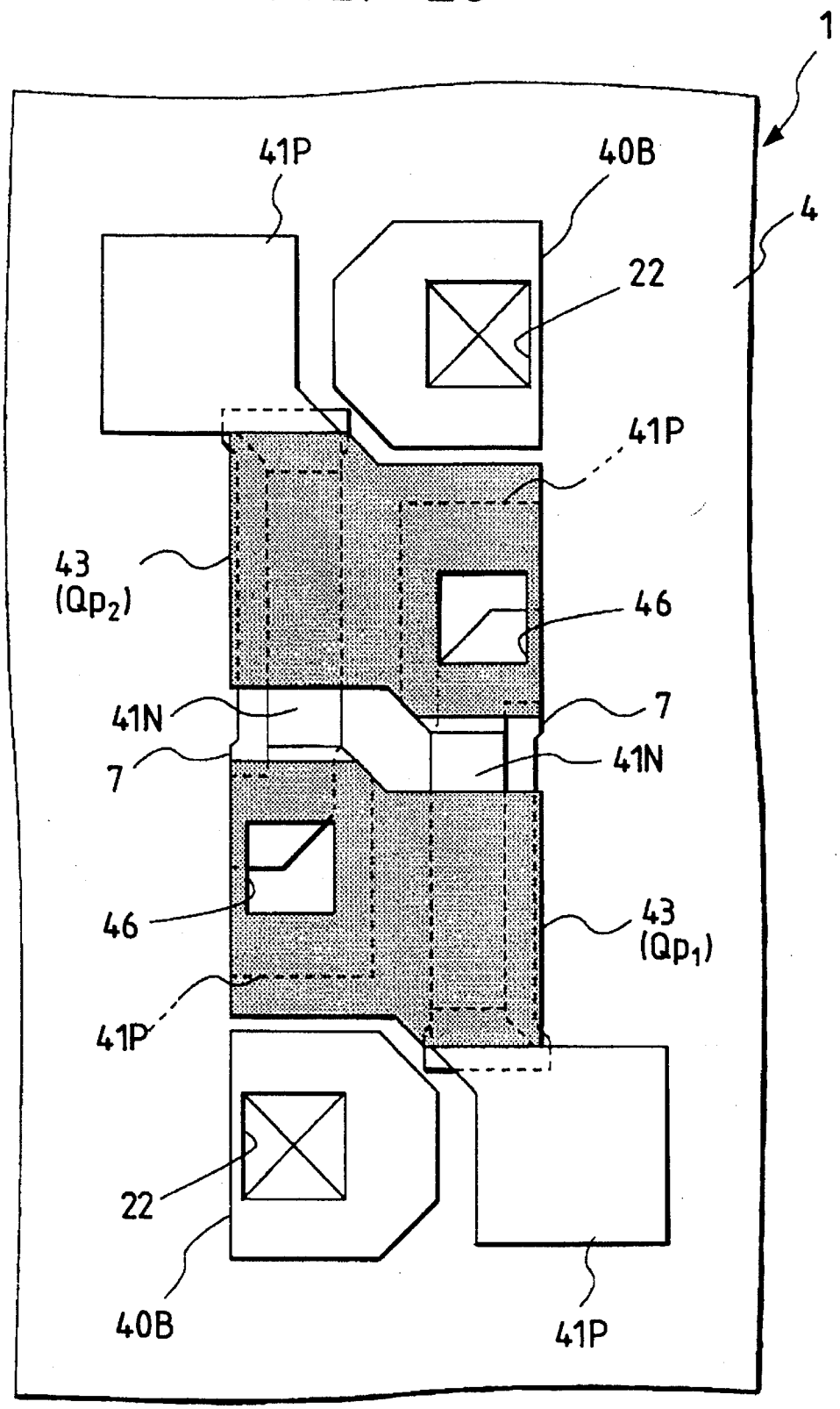
FIG. 26 is a top plan view of an essential portion showing a pattern layout of the memory cell of the semiconductor integrated circuit device according to the second embodiment of the present invention.

As shown in FIGS. 21 and 26, the individual gate electrodes 43 of the load MISFETs $Qp_1$ and $Qp_2$ are formed over the aforementioned gate insulating films 42.

The gate electrodes 43 are formed of a polycrystalline silicon film, for example, at the step of forming the fifth-layered gate material. This polycrystalline silicon film is doped with an n-type impurity (e.g., phosphorus) so as to have its resistance reduced.

In the load MISFETs $Qp_1$ and $Qp_2$, the drain regions 41P and the gate electrodes 43 are separated from each other through the channel regions 41N so as to prevent a difficulty that the leakage current is established between the source regions 41P and the drain regions 41P when a high field of electricity is applied between the gate electrodes 43 and the drain regions 41P below the gate electrodes 43 and in the state of the reference voltage ($V_{ss}$) while the load MISFETs $Qp_1$ and $Qp_2$ having their gate electrodes 43 supplied with the supply voltage ($V_{cc}$) are OFF. In short, the load MISFETs $Qp_1$ and $Qp_2$ are constructed to have the so-called "offset structure", in which the drain regions 41P and the gate electrodes 43 are separated without overlap. Incidentally, the offset regions 41off of the load MISFETs $Qp_1$ and $Qp_2$ are shown in a hatched pattern in FIG. 27.

Of the load MISFETs $Qp_1$ and $Qp_2$, the load MISFET $Qp_1$ has its gate electrode 43 connected through a contact hole 46 with one semiconductor region (i.e., the drain region) 11 (or one semiconductor region 18 of the transfer MISFET $Qt_2$) of the driver MISFET $Qd_2$. Although not shown in FIG. 21, the load MISFET $Qp_2$ has its gate electrode 43 connected with one semiconductor region (i.e., the drain region) 11 (or one semiconductor region 18 of the transfer MISFET $Qt_1$) of the driver MISFET $Qd_1$ through the contact hole 46 which is formed in the gate insulating film 42, the insulating film 45 and the insulating film 8.

To the side wall of the contact hole 46 connecting the gate electrode 43 of the load MISFET $Qp_2$ and the semiconductor region (i.e., the drain region) 11 (or the semiconductor region 18 of the transfer MISFET $Qt_1$) of the driver MISFET $Qd_1$, there is exposed the section of the drain region 41P of the load MISFET $Qp_1$. This exposed drain region 41P and the gate electrode 43 are electrically connected at the face of the side wall of the contact hole 46. To the side wall of this contact hole 46, there is also exposed the main surface of one end of the gate electrode 7 of the driver MISFET $Qd_2$, and this exposed gate electrode 7 and the gate electrode 43 of the load MISFET $Qp_2$ are electrically connected at the face of the side wall of the contact hole 46.

In short, the gate electrode 43 of the load MISFET $Qp_2$, one semiconductor region (i.e., the drain region) 11 (or one semiconductor region 18 of the transfer MISFET $Qt_1$) of the driver MISFET $Qd_1$, the drain region 41P of the load MISFET $Qp_1$ and the gate electrode 7 of the driver MISFET $Qd_2$ are mutually connected through the single contact hole 46.

To the side wall of the contact hole 46 connecting the gate electrode 43 of the load MISFET $Qp_1$ and the semiconductor region (i.e., the drain region) 11 (or the semiconductor region 18 of the transfer MISFET $Qt_2$) of the driver MISFET $Qd_2$, although not shown in FIG. 21, there is also exposed the section of the drain region 41P of the load MISFET $Qp_2$. This exposed drain region 41P and the gate electrode 43 are electrically connected at the face of the side wall of the contact hole 46. To the side wall of this contact hole 46, there is also exposed the main surface of one end of the gate electrode 7 of the driver MISFET $Qd_1$, and this exposed gate electrode 7 and the gate electrode 43 of the load MISFET $Qp_1$ are electrically connected at the face of the side wall of the contact hole 46.

In short, the gate electrode 43 of the load MISFET $Qp_1$, one semiconductor region (i.e., the drain region) 11 (or one semiconductor region 18 of the transfer MISFET $Qt_2$) of the driver MISFET $Qd_2$, the drain region 41P of the load MISFET $Qp_2$ and the gate electrode 7 of the driver MISFET $Qd_1$ are mutually connected through the single contact hole 46.

Figure 27:
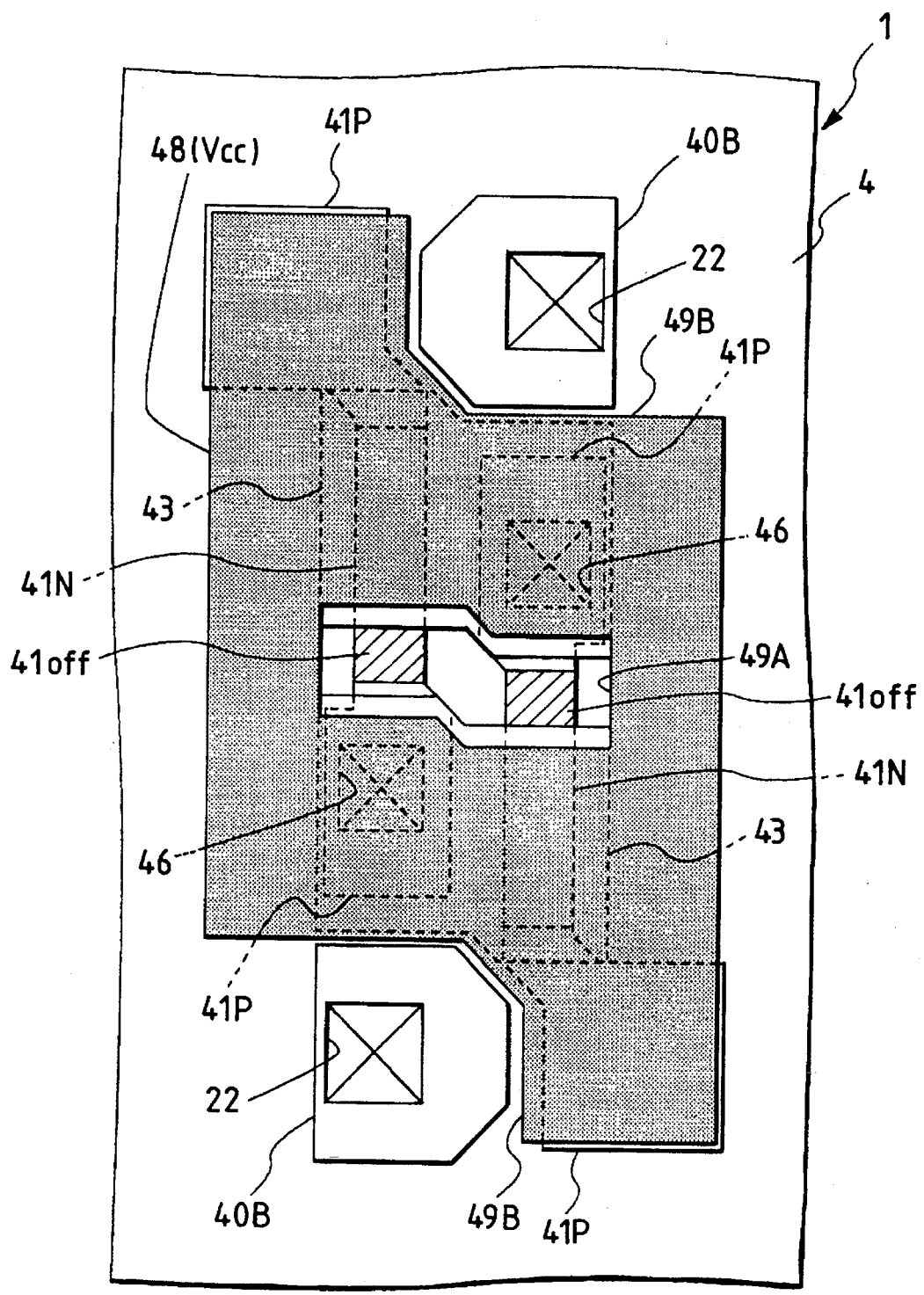
FIG. 27 is a top plan view of an essential portion showing a pattern layout of the memory cell of the semiconductor integrated circuit device according to the second embodiment of the present invention.

Over the gate electrodes 43 of the load MISFETs $Qp_1$ and $Qp_2$, as shown in FIGS. 21 and 27, there are arranged through the insulating film 47 the plate electrodes 48. These plate electrodes 48 are formed of a polycrystalline silicon film, for example, at the step of forming the sixth-layered gate material. The plate electrodes 48 are doped with an n-type impurity (e.g., P). Moreover, the plate electrodes 48 are formed to cover the whole area of the memory cell MC. The plate electrodes 48 are connected with the supply voltage ($V_{cc}$) of the circuit. Incidentally, the memory cell MC of the SRAM of this embodiment uses the supply voltage ($V_{cc}$) of Embodiment 1, as shown in FIG. 9, and the second supply voltage ($V_{cc1}$).

The memory cell MC of the SRAM of this embodiment is equipped with the two capacitance elements $C_1$ and $C_2$. In case of the SRAM of this embodiment, these capacitance elements $C_1$ and $C_2$ are formed between the load MISFETs $Qp_1$ and $Qp_2$ and the plate electrodes 48. Specifically, the capacitance elements $C_1$ and $C_2$ are constructed to have the stack (or laminate) structure, in which the gate electrodes 43 of the load MISFETs $Qp_1$ and $Qp_2$ are used as the first electrode, in which the plate electrodes 48 are used as the second electrode and in which the insulating film 47 between the gate electrodes 43 and the plate electrodes 48 is made of a dielectric film. The insulating film 47 is formed of a laminated film of a silicon oxide film having a thickness of about 5 to 30 nm and a silicon nitride film having a thickness of about 3 to 10 nm. Incidentally, in this embodiment, the capacitance elements $C_1$ and $C_2$ can be formed between the top surface (or whole surface) of the gate electrodes 43 and the plate electrodes 48.

Thus, in the SRAM of this embodiment, the capacitance elements $C_1$ and $C_2$ are formed between the gate electrodes 43 of the load MISFETs $Qp_1$ and $Qp_2$ and the plate electrodes 48 covering the former and having a large area. As a result, the capacitance elements $C_1$ and $C_2$ can be given high capacitances to drastically improve the resistance of the memory cell MC to the α-ray error.

The aforementioned plate electrodes 48 are formed in its portion with holes 49A and 49B. Of these, the hole 49A is formed over the drain regions 41P of the load MISFETs $Qp_1$ and $Qp_2$ so that the plate electrodes 48 may not cover the offset regions 41off. The hole 49B is formed over the aforementioned pad layer 40B which is formed at the step of forming the third-layered gate material as that of the aforementioned reference voltage line 40A ($V_{ss}$).

Thus, the SRAM of this embodiment is constructed to have the offset structure in which the plate electrodes 48 over the drain regions 41P of the load MISFETs $Qp_1$ and $Qp_2$ are formed with the hole 49A to separate the offset regions 41off and the plate electrodes 48 through that hole 49A. Thanks to this structure, a high electric field can be avoided from being applied between the plate electrodes 48 and the offset regions 41off when the load MISFETs $Qp_1$ and $Qp_2$ having their gate electrodes 43 supplied with the supply voltage ($V_{cc}$) are OFF. Thus, the establishment of the leakage current between the source regions 41P and the drain regions 41P by that high electric field can be prevented to retain the stable operation of the memory cell MC.

Incidentally, the other hole 49B formed in the plate electrodes 48 is formed to connect the pad layer 40B below the plate electrodes 48 and the complementary data lines DL (i.e., the first data line $DL_1$ and the second data line $DL_2$) over the plate electrodes 48 without being shorted to the plate electrodes 48.

Figure 28:
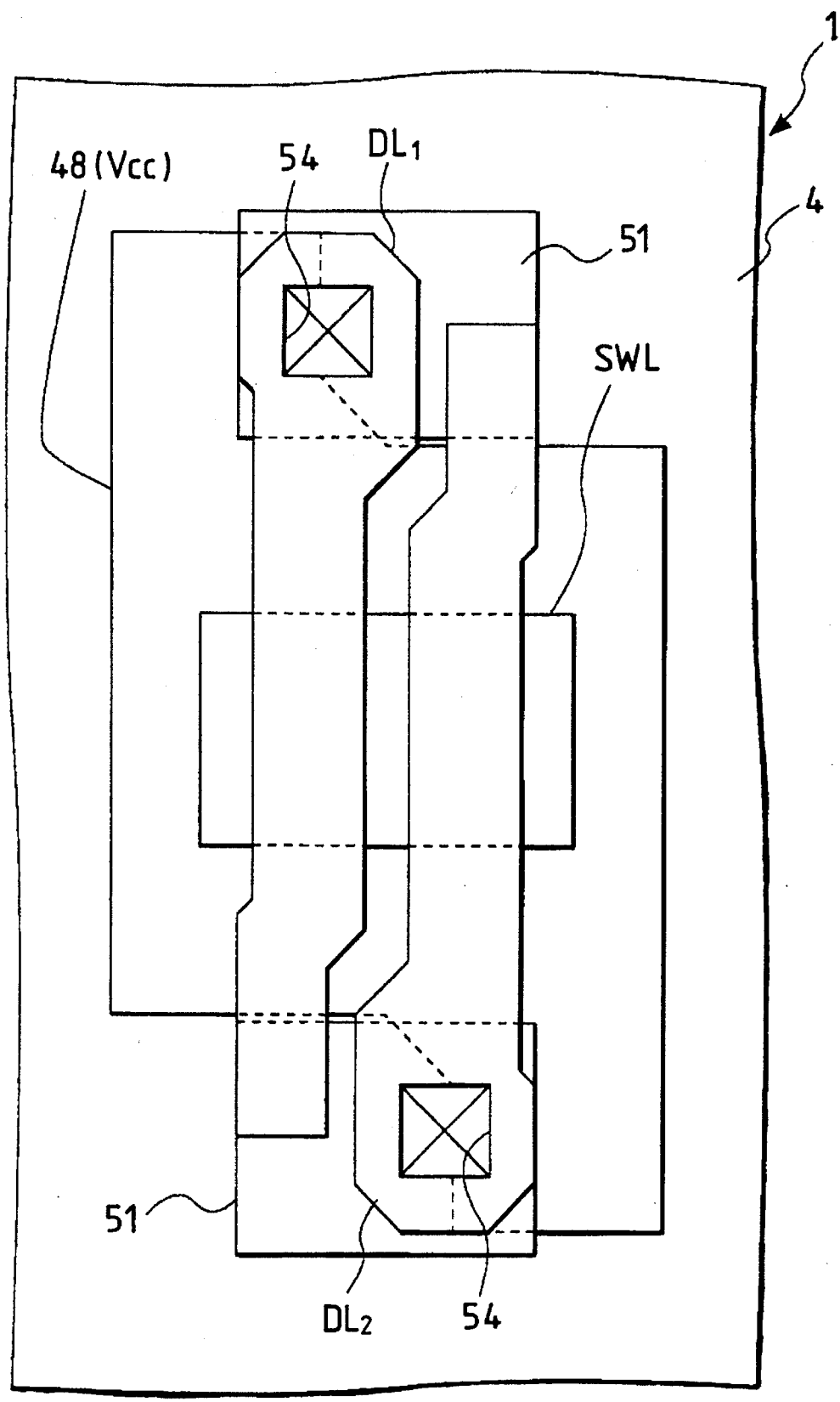
FIG. 28 is a top plan view of an essential portion showing a pattern layout of the memory cell of the semiconductor integrated circuit device according to the second embodiment of the present invention.

Over the plate electrode 48, as shown in FIGS. 21 and 28, there is arranged through an interlayer insulating film 50 the sub-word line SWL. This sub-word line SWL is formed, at the step of forming the first-layered wiring material, of a laminated film of a barrier metal film and a refractory metal film, for example. The barrier metal is made of titanium tungsten (TiW), for example, and the refractory metal is made of tungsten (W), for example. The interlayer insulating film 50 is formed of a laminated film of a silicon oxide film and a BPSG film, for example.

Over the semiconductor region (or the drain region) 18 of one of the transfer MISFETs $Qt_1$ and $Qt_2$, there is arranged an intermediate conductive layer 51 which is formed of the same first-layered wiring material as that of the sub-word line SWL. This intermediate conductive layer 51 is connected with the aforementioned pad layer 40B, which is formed over the semiconductor region (i.e., the drain region) 18 of one of the transfer MISFETs $Qt_1$ and $Qt_2$, through a contact hole 52 which is formed in the interlayer insulating film 50, the insulating film 47, the insulating film 45 and the insulating film 44.

Over the sub-word line SWL and the intermediate conductive layer 51 described above, there are arranged through a second-layered interlayer insulating film 58 the complementary data lines DL. The complementary data lines DL are connected with the intermediate conductive layer 51 through a contact hole 54 which is formed in the interlayer insulating film 53. The complementary data lines DL are formed, at the step of forming the second-layered wiring material, of a three-layered film which is prepared by laminating a barrier metal film, an aluminum alloy film and a barrier metal film sequentially, for example. The barrier metal is exemplified by TiW, and the aluminum alloy is exemplified by aluminum having Cu and Si added thereto. The interlayer insulating film 53 is formed of a three-layered film which is prepared by laminating a silicon oxide film, a spin-on glass film and a silicon oxide film sequentially, for example. This silicon oxide film is formed by the plasma CVD method using oxygen and tetraethoxysilane as its source gas.

The aforementioned complementary data lines DL are connected with the semiconductor region (i.e., the drain region) 18 of one of the transfer MISFETs $Qt_1$ and $Qt_2$ of the memory cell MC. Of the complementary data lines DL, the first data line $DL_1$ is connected with the semiconductor region (i.e., the drain region) 18 of the transfer MISFET $Qt_1$. Although not shown, the second data line $DL_2$ is likewise connected with the semiconductor region (i.e., the drain region) 18 of the transfer MISFET $Qt_2$. The connections between the complementary data lines DL and the semiconductor region (i.e., the drain region) 18 of one of the transfer MISFETs $Qt_1$ and $Qt_2$ are carried out through the aforementioned intermediate conductive layer 51 and pad layer 40B.

Over the complementary data lines DL, there is arranged through a third-layered interlayer insulating film 55 the main word line MWL. This main word line MWL is formed, at the step of forming the third-layered wiring material, of a three-layered film which is prepared by laminating the same barrier metal film, aluminum alloy film and barrier metal film as those of the aforementioned second-layered wiring material, for example. The interlayer insulating film 55 is formed of a four-layered film which is prepared by laminating a silicon oxide film, a silicon oxide film, a spin-on glass film and a silicon oxide film sequentially for example. These silicon oxide films are formed by the plasma CVD method using oxygen and tetraethoxysilane as its source gas.

Over the aforementioned main word line MWL, there is formed a final passivation film 56. This final passivation film 56 is formed of a four-layered film which is prepared by laminating a silicon oxide film, a silicon oxide film, a silicon nitride film and a polyimide resin film sequentially, for example. The silicon oxide films are formed by the plasma CVD method using oxygen and tetraethoxysilane as its source gas, and the silicon nitride film is formed by the plasma CVD method using monosilane and nitrogen (or ammonia) as its source gas.

In this embodiment, like the foregoing Embodiment 1, the hydrogen annealing is carried out during the step of depositing the final passivation film 56, to supply the hydrogen to the polycrystalline film forming the load MISFETs $Qp_1$ and $Qp_2$. As a result of this hydrogen annealing, the hydrogen is supplied through the interlayer insulating film 55, the interlayer insulating film 53 and the interlayer insulating film 50 to the polycrystalline silicon film forming the load MISFETs $Qp_1$ and $Qp_2$.

Thus in the SRAM of this embodiment, both the hydrogen supplied at the aforementioned hydrogen annealing step and the hydrogen contained in the interlayer Insulating films 55 and 53 are supplied to the load MISFETs $Qp_1$ and $Qp_2$ through the opening 49A formed in the portion of the plate electrodes 48. Thanks to this construction, a sufficient number of hydrogen atoms can be supplied to the uncombined bonds (i.e., the dangling bonds) which are present in the crystal surfaces of the polycrystalline silicon film forming the load MISFETs $Qp_1$ and $Qp_2$, so that the mutual conductance (Gm) of the load MISFETs $Qp_1$ and $Qp_2$ can be improved to improve the characteristics of the memory cells MC of the SRAM.

[Embodiment 3]

Figure 29:
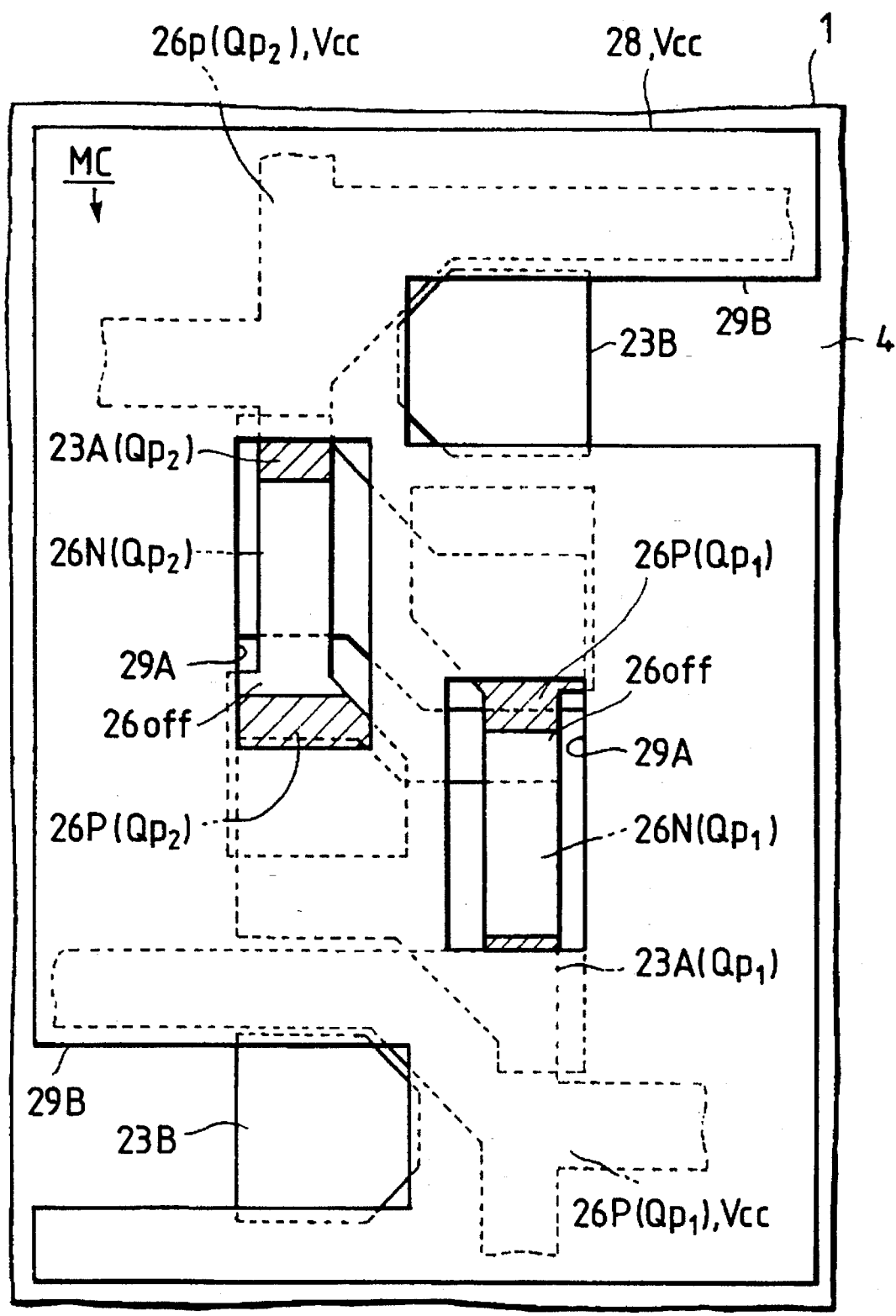
FIG. 29 is a top plan view of an essential portion showing a pattern layout of the memory cell of the semiconductor integrated circuit device according to a third embodiment of the present invention.
Figure 30:
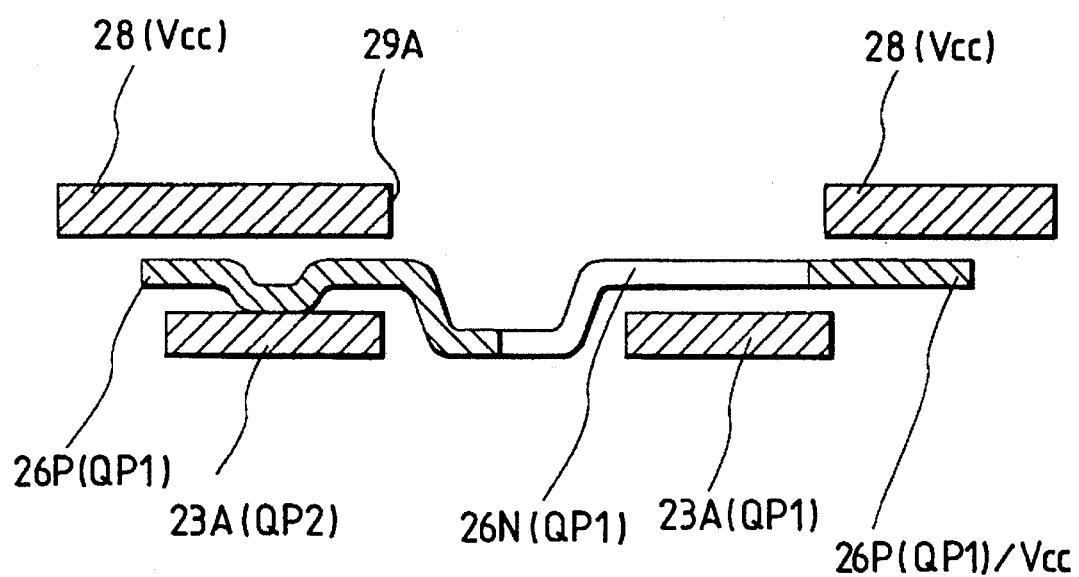
FIG. 30 is a schematic section schematically showing the arrangement of load MISFETs and plate electrodes formed over the MISFETs.

FIG. 29 is a top plan view of an essential portion showing a pattern layout of the plate electrodes of this embodiment, which are formed at the step of forming the fifth-layered gate material, and FIG. 30 is a schematic section schematically showing the arrangement of the plate electrodes and the load MISFETs below the plate electrodes.

In the memory cell MC of the SRAM of this embodiment, as shown in FIGS. 29 and 30, the openings 29A formed in the plate electrode ($V_{cc}$) are given a shape different from that of Embodiment 1. Specifically, the openings 29A are formed all over the channel regions 26N of the load MISFETs $Qp_1$ and $Qp_2$. These openings 29A are formed, as in Embodiment 1, to prevent the plate electrodes 28 ($V_{cc}$) from covering the channel regions 26N of the load MISFETs $Qp_1$ and $Qp_2$.

In addition to the effects similar to those of Embodiment 1, according to Embodiment 3 having the openings 29A shaped above, while the load MISFETs $Qp_1$ and $Qp_2$ are ON with their gate electrodes 23A being supplied with the reference voltage ($V_{ss}$), the electric field from the plate electrodes 28 over the channel regions 26N exerts no influence upon the channel regions 26N so that the current (i.e., the ON current) between the source regions 26P and the drain regions 26P can be increased. Thanks to this construction, more specifically, it is possible to increase the ON current and reduce the OFF current of the load MISFETs $Qp_1$ and $Qp_2$. As a result, the ratio of the ON current to the OFF current of the load MISFETs $Qp_1$ and $Qp_2$ can be improved to retain the stable operation of the memory cell MC.

Although our invention has been specifically described in connection with its embodiments, it should not be limited thereto but can naturally be modified in various manners without departing from the gist thereof.

In the foregoing Embodiment 1, simultaneously as the polycrystalline silicon film on the dielectric film is etched to form the plate electrodes, the silicon nitride film forming a portion of the dielectric film is removed. This removal is not indispensable, but the silicon nitride film may be partially left unetched.

Figure 31:
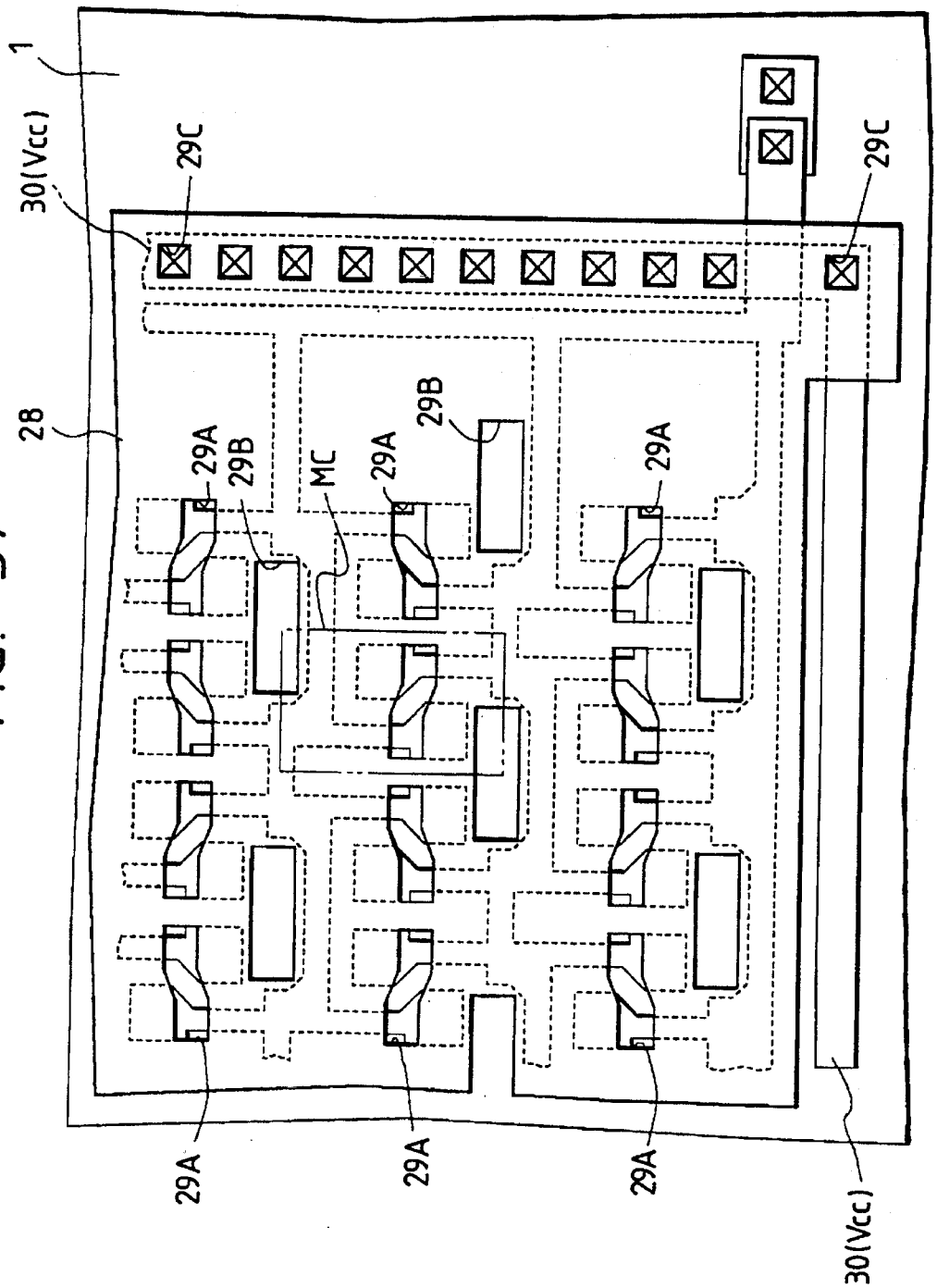
FIG. 31 is a top plan view of an essential portion showing a pattern layout of the memory cell of the semiconductor integrated circuit device according to the third embodiment of the present invention.
Figure 32:
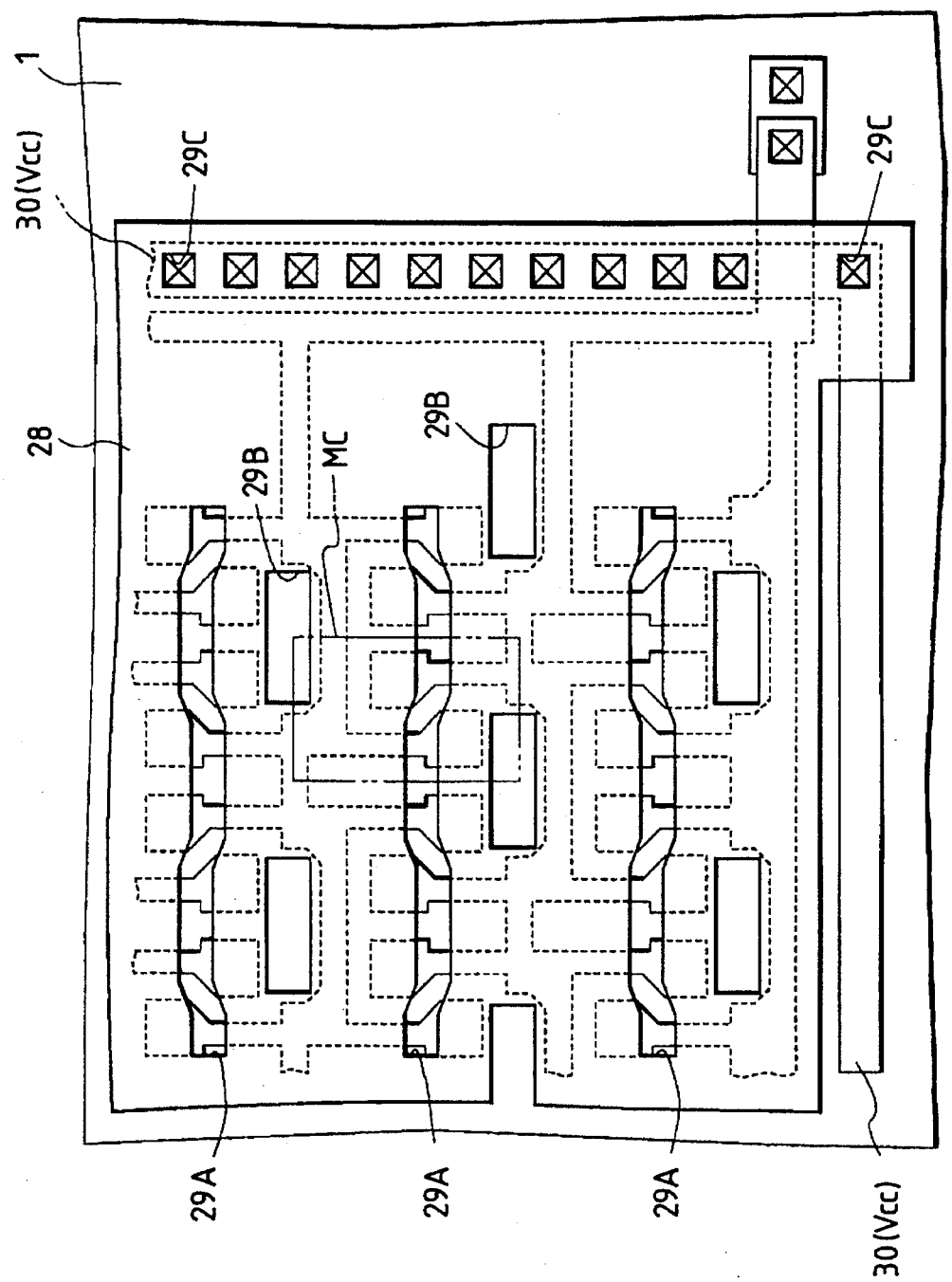
FIG. 32 is a top plan view of an essential portion showing a pattern layout of the memory cell of the semiconductor integrated circuit device according to the third embodiment of the present invention.

The pattern of the openings to be formed in the plate electrodes should not be limited to the rectangular shape, as shown in FIGS. 8 and 29, but may be shaped, as shown in FIG. 31 or 32. If the openings 29A are given a band-shaped pattern, as shown in FIG. 32, it is possible to increase the mask aligning allowance when the openings 29A are formed.

The foregoing Embodiments 1 to 3 have been described in connection with the memory cell MC which is formed with the plate electrodes over the load MISFETs, but the plate electrodes may be arranged below the load MISFETs. More specifically, the foregoing Embodiments 1 to 3 may be modified such that: the first conductive film formed over the main surface the semiconductor substrate forms the gate electrodes of the driver MISFETs; the second conductive film formed over the main surface of the semiconductor substrate forms the gate electrodes of the transfer MISFETs; the third conductive film formed over the first and second conductive films forms the plate electrodes of the load MISFETs; the fourth conductive film formed over the third conductive film forms the gate electrodes of the load MISFETs; the fifth conductive film formed over the fourth conductive film forms the channel regions, the source regions and the drain regions of the load MISFETs; the capacitance elements are formed between the load MISFETs and the plate electrodes; and at least the plate electrodes below the offset regions of the load MISFETs are formed with the openings.

Alternatively, the foregoing Embodiment 2 may be modified such that: the first conductive film formed over the main surface of the semiconductor substrate forms the gate electrodes of the driver MISFETs; the second conductive film formed over the main surface of the semiconductor substrate forms the gate electrodes of the transfer MISFETs; the third conductive film formed over the first and second conductive films forms the plate electrodes of the load MISFETs; the fourth conductive film formed over the third conductive film forms the channel regions, the source regions and the drain regions of the load MISFETs; the fifth conductive film formed over the fourth conductive film forms the gate electrodes of the load MISFETs; the capacitance elements are formed between the load MISFETs and the plate electrodes; and at least the plate electrodes below the offset regions or the channel regions of the load MISFETs are formed with the openings.

Moreover, the second supply voltage ($V_{cc1}$), as shown in FIG. 9, is equalized to the supply voltage ($V_{cc}$) in the foregoing Embodiments 1 and 3 but may be different from the supply voltage ($V_{cc}$). In the second supply voltage ($V_{cc1}$) is set to ½ $V_{cc}$, for example, the capacity can be added to either the storage node $n_1$ or $n_2$, as shown in FIG. 9.

[Embodiment 4]

This embodiment relates to a SRAM in which a silicon nitride film having such a thickness as is permeable to hydrogen but not to humidity is arranged over the load MISFETs.

First of all, this embodiment will be summarized in the following.

In the process of manufacturing a semiconductor device having transistors formed of a polycrystalline silicon, such as the load MISFETs of the SRAM according to the foregoing Embodiments 1 to 3, the so-called "hydrogenation" for improving the mutual conductance (gm) of the transistors is carried out by supplying the hydrogen atoms to the uncombined bonds (i.e., the dangling bonds) which are present in the crystal surfaces of the polycrystalline silicon film.

The aforementioned hydrogenation is exemplified by the so-called "hydrogen annealing method", in which the semiconductor substrate is subjected, after the transistors have been wired, to a heat treatment in the atmosphere containing the hydrogen gas.

Upon the development of the SRAM of the aforementioned complete CMOS structure, we have found out the following problems.

Like the gate insulating film of the load MISFETs of the SRAM, the gate insulating film formed over the polycrystalline silicon film is more degraded than the gate insulating film formed by thermally oxidizing the surface of the monocrystalline silicon, and is defective in that the threshold voltage (Vth) is easily fluctuated by the humidity in the film deposited on the load MISFETs or the humidity having invaded from the atmosphere during the manufacture process.

In order to eliminate this defect, it is effective to cover the load MISFETs with such a film as is impermeable to the humidity, such as the aforementioned silicon nitride film, thereby to prevent the humidity in the film deposited on the load MISFETs or the humidity in the atmosphere from invading into the load MISFETs.

If, however, the load MISFETs are covered with such silicon nitride film, the permeation of hydrogen is obstructed by the silicon nitride film when the polycrystalline silicon film forming the load MISFETs is hydrogenated, so that sufficient hydrogen is not supplied to the dangling bonds of the polycrystalline silicon film. Thus, there arises another problem that the mutual conductance (gm) of the load MISFETs is degraded.

Of the invention to be disclosed by this embodiment, a representative concept will be described in the following.

In the SRAM having its memory cell constructed to include: transfer MISFETs formed over the main surface of a semiconductor substrate; and a flip-flop circuit having driver MISFETs formed over the main surface of the semiconductor substrate and load MISFETs formed of a polycrystalline silicon film deposited on the driver MISFETs, a silicon nitride film having such a thickness as is permeable to hydrogen but not humidity is formed over the load MISFETs.

According to the means described above, the load MISFETs are covered with the humidity impermeable film so that the humidity can be prevented from invading into the load MISFETs. As a result, it is possible to prevent the fluctuations of the threshold voltage (Vth) of the load MISFETs, which might otherwise be caused by the invasion of humidity.

By forming the hydrogen permeable film over the load MISFETs, moreover, sufficient hydrogen can be supplied to the dangling bonds of the polycrystalline silicon film forming the load MISFETs, to improve the mutual conductance (Gm) of the load MISFETs.

Embodiment 4 will be described in detail in the following with reference to the accompanying drawings.

Figure 33:
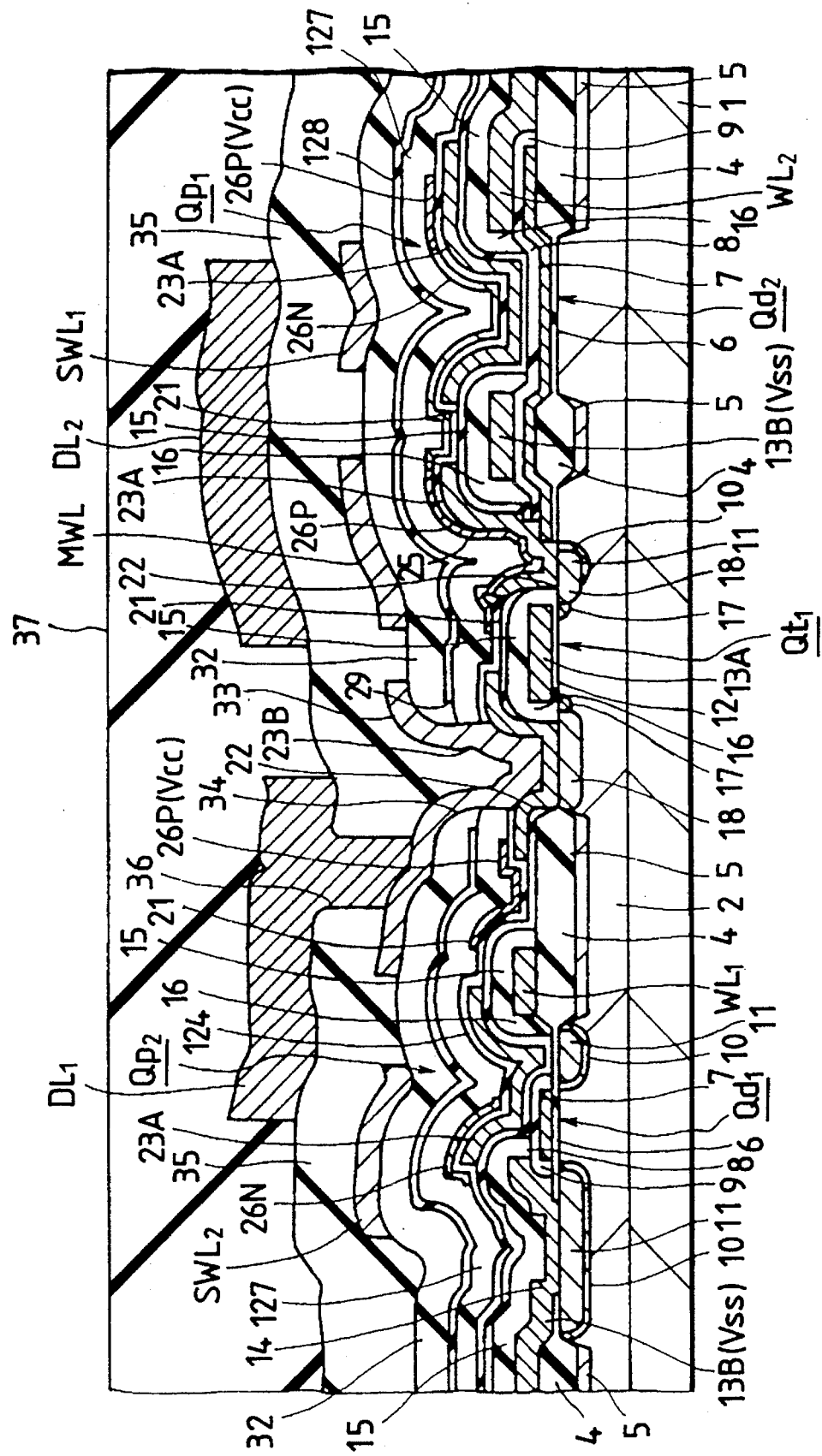
FIG. 33 is a section of an essential portion of a semiconductor substrate showing a memory cell of a semiconductor integrated circuit device according to a fourth embodiment of the present invention.

FIG. 33 is a section of an essential portion of a semiconductor substrate showing specific structure of the memory cell MC of this embodiment. Embodiment 4 is different from Embodiment 1, as shown in FIG. 1, in the construction of the gate insulating film 24, the insulating film 27, the plate electrodes 28 and the insulating film 31. In short, Embodiment 4 is exemplified into a SRAM having no plate electrode.

As shown in FIG. 33, an insulating film 127 is formed over an insulating film 124 and the channel regions 26N, source regions 26P, drain regions 26P and power source line ($V_{cc}$) 26P of the load MISFETs $Qp_1$ and $Qp_2$. That insulating film 127 is formed of a silicon oxide film, for example.

Over the insulating film 127, there is formed a silicon nitride film 128. This silicon nitride film 128 is provided for preventing the humidity in the film deposited on the load MISFETs $Qp_1$ and $Qp_2$ and the humidity in the atmosphere from invading into the load MISFETs $Qp_1$ and $Qp_2$. Incidentally, the silicon nitride film 128 of this embodiment is deposited on the load MISFETs $Qp_1$ and $Qp_2$ through the insulating film (of a silicon oxide film) 127 but may be deposited directly on the fourth-layered gate material forming the channel regions 26N, drain regions 26P and source regions 26P of the load MISFETs $Qp_1$ and $Qp_2$.

The BPSG film 32 is formed over the silicon nitride film 128.

One example of the specific process of manufacturing the SRAM of Embodiment 4 will be described in the following with reference to FIG. 34 and others.

The steps of Embodiment 4 up to that corresponding to FIG. 16 of Embodiment 1 are common, and their description will be omitted.

Figure 34:
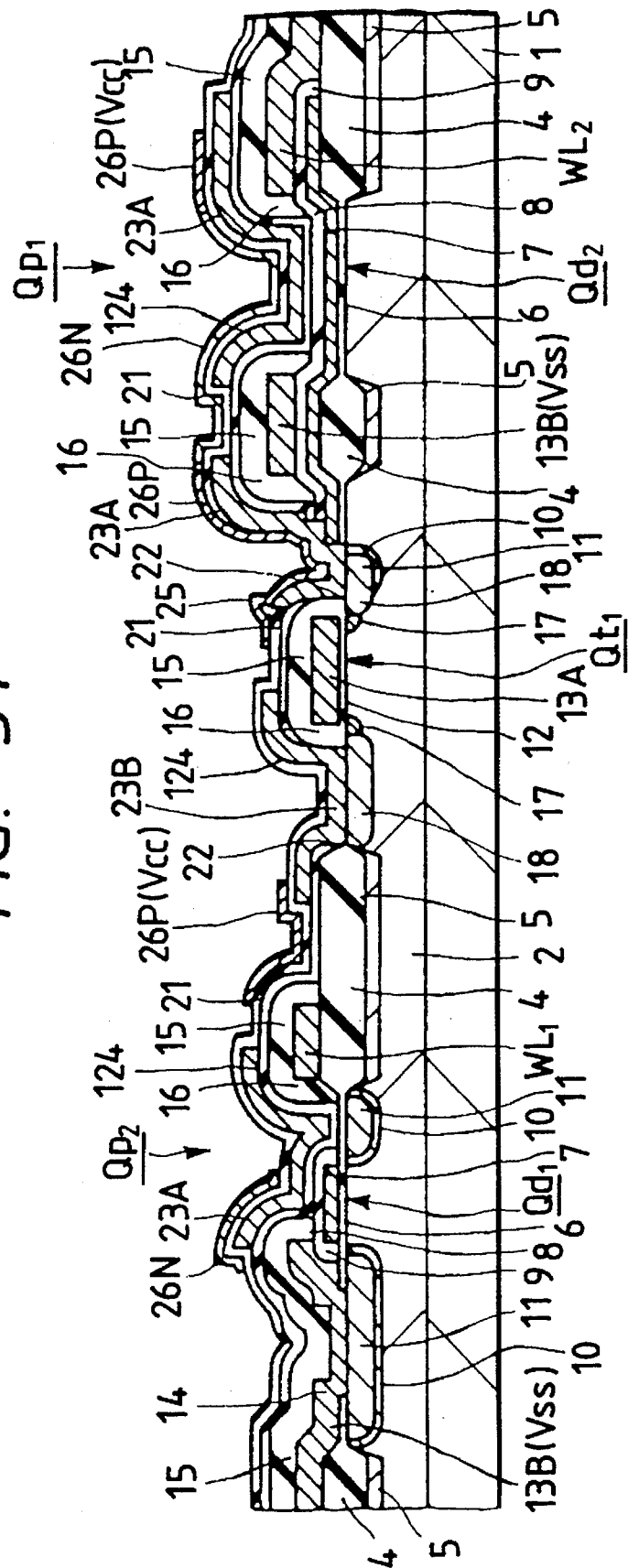
FIG. 34 is a section of an essential portion of the semiconductor substrate and shows a process of manufacturing the semiconductor integrated circuit device according to the fourth embodiment of the present invention.

From Embodiment 4, as shown in FIG. 34, there is eliminated the step of Embodiment 4, as shown in FIG. 16, of etching off the gate insulating film 24 by using the photomask for forming the channel regions, 26N, source regions 26P, drain regions 26P and power source line ($V_{cc}$) 26P of the load MISFETs $Qp_1$ and $Qp_2$.

Figure 35:
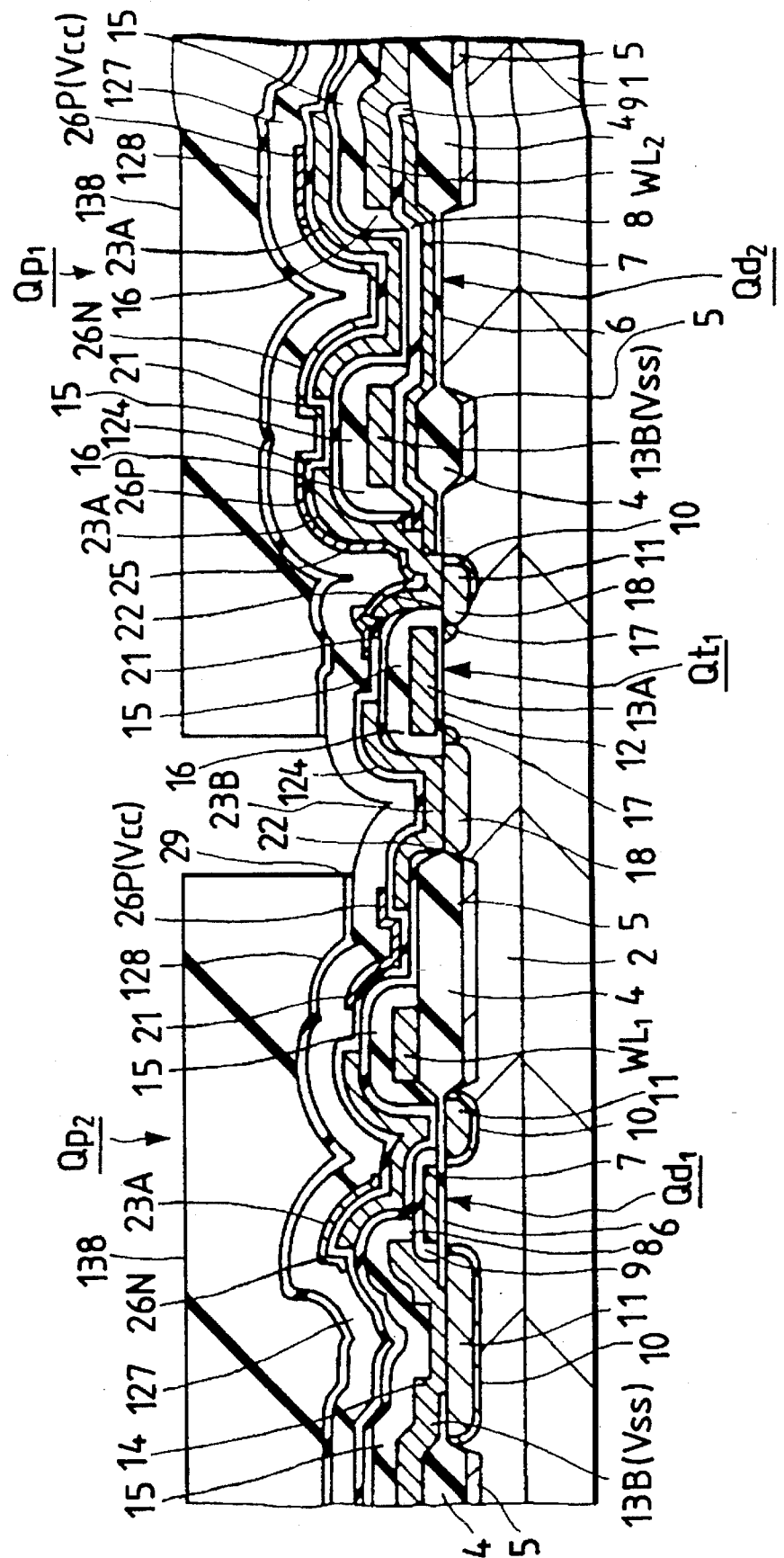
FIG. 35 is a section of an essential portion of the semiconductor substrate and shows a process of manufacturing the semiconductor integrated circuit device according to the fourth embodiment of the present invention.

Specifically, after the channel regions 26N, source regions 26P, drain regions 26P and power source line ($V_{cc}$) 26P of the load MISFETs $Qp_1$ and $Qp_2$ have been individually formed, the insulating film 127 is deposited on the whole surface of the semiconductor substrate 1 by the CVD method, as shown in FIG. 35. This insulating film 127 is formed of a silicon oxide film having a thickness of about 135 to 155 nm.

Next, the silicon nitride film 128 is deposited on the whole surface of the semiconductor substrate 1. This silicon nitride film 128 is required to have a thickness capable of blocking the humidity permeation. If, however, the silicon nitride film 128 is excessively thick, it also blocks the permeation of hydrogen. Even with the later-described hydrogenation, the polycrystalline silicon film forming the load MISFETs $Qp_1$ and $Qp_2$ cannot be fed with sufficient hydrogen. Hence, the silicon nitride film 128 has to be given a thickness permeable to hydrogen but not humidity and is deposited to have a thickness of about 5 to 20 nm, more preferably 6 to 15 nm by the low-pressure CVD method using dichlorosilane ($SiH_2Cl_2$) and ammonia, or monosilane ($SiH_4$) and nitrogen (or ammonia) as its source gas.

Next, a photoresist film 138 formed over the silicon nitride film 128 is used as the mask to etch the silicon nitride film 128 thereby to form an opening 29 having a larger diameter than that of the contact hole 34 to be formed at the later-described step, over the source regions or the drain regions (as located at the side where the complementary data lines DL are connected) of the transfer MISFETs $Qt_1$ and $Qt_2$. Simultaneously with this, the photoresist film 138 is used as the mask to remove the silicon nitride film 128 from the peripheral circuit regions while leaving the silicon nitride film 128 only over the memory block LMB, as indicated by broken lines in FIG. 19.

Figure 36:
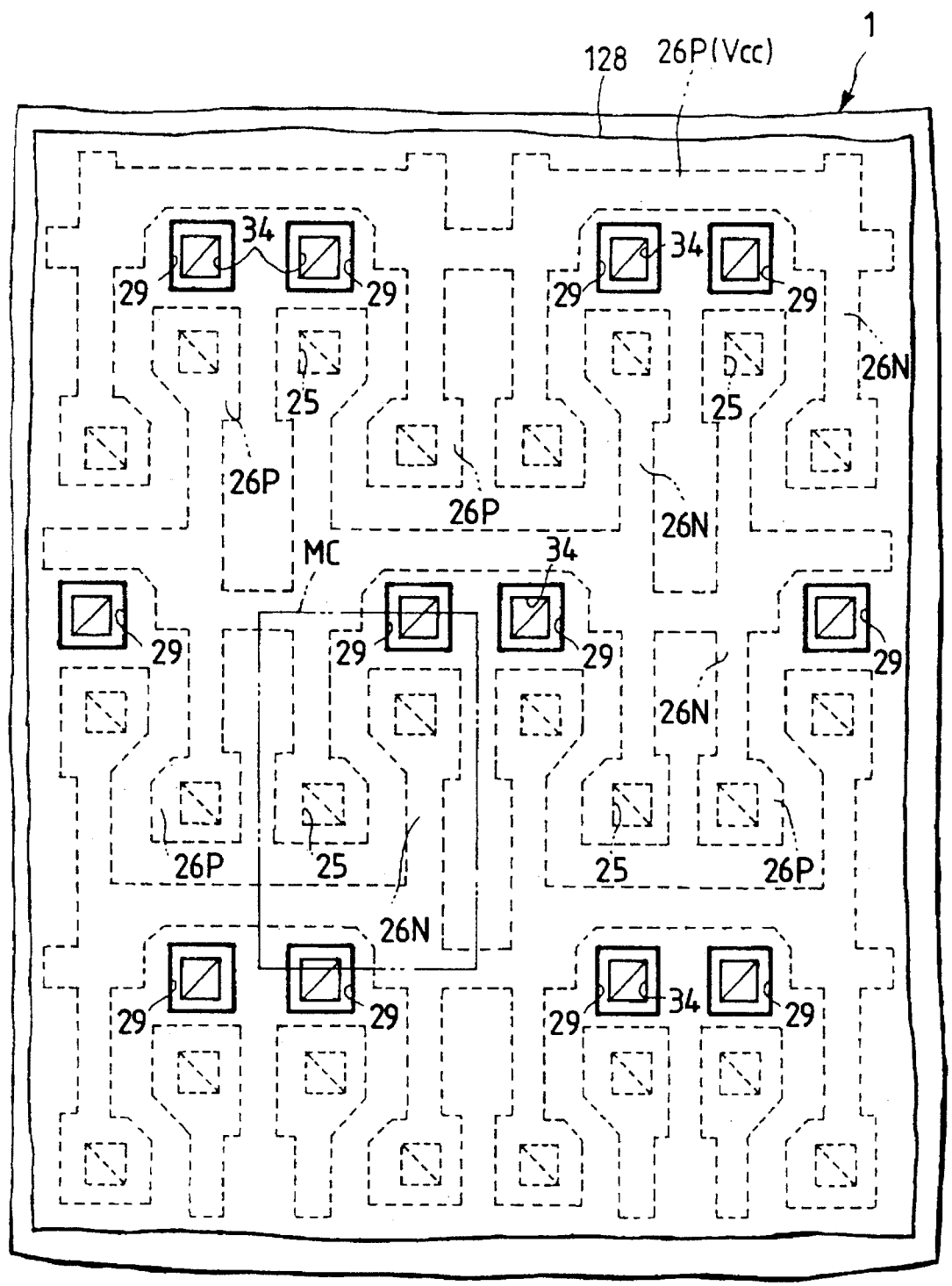
FIG. 36 is a top plan view of an essential portion of the semiconductor substrate and shows a process of manufacturing the semiconductor integrated circuit device according to the fourth embodiment of the present invention.

FIG. 36 is a top plan view of an essential portion of the memory block MB and shows the pattern of the silicon nitride film 128 which is deposited on the fourth-layered gate material (as indicated by broken lines) forming the channel regions, 26N, source regions 26P, drain regions 26P and power source line ($V_{cc}$) 26P of the load MISFETs $Qp_1$ and $Qp_2$. The region, as enclosed by double-dotted lines in FIG. 36, indicates the region which is occupied by one memory cell MC.

Figure 37:
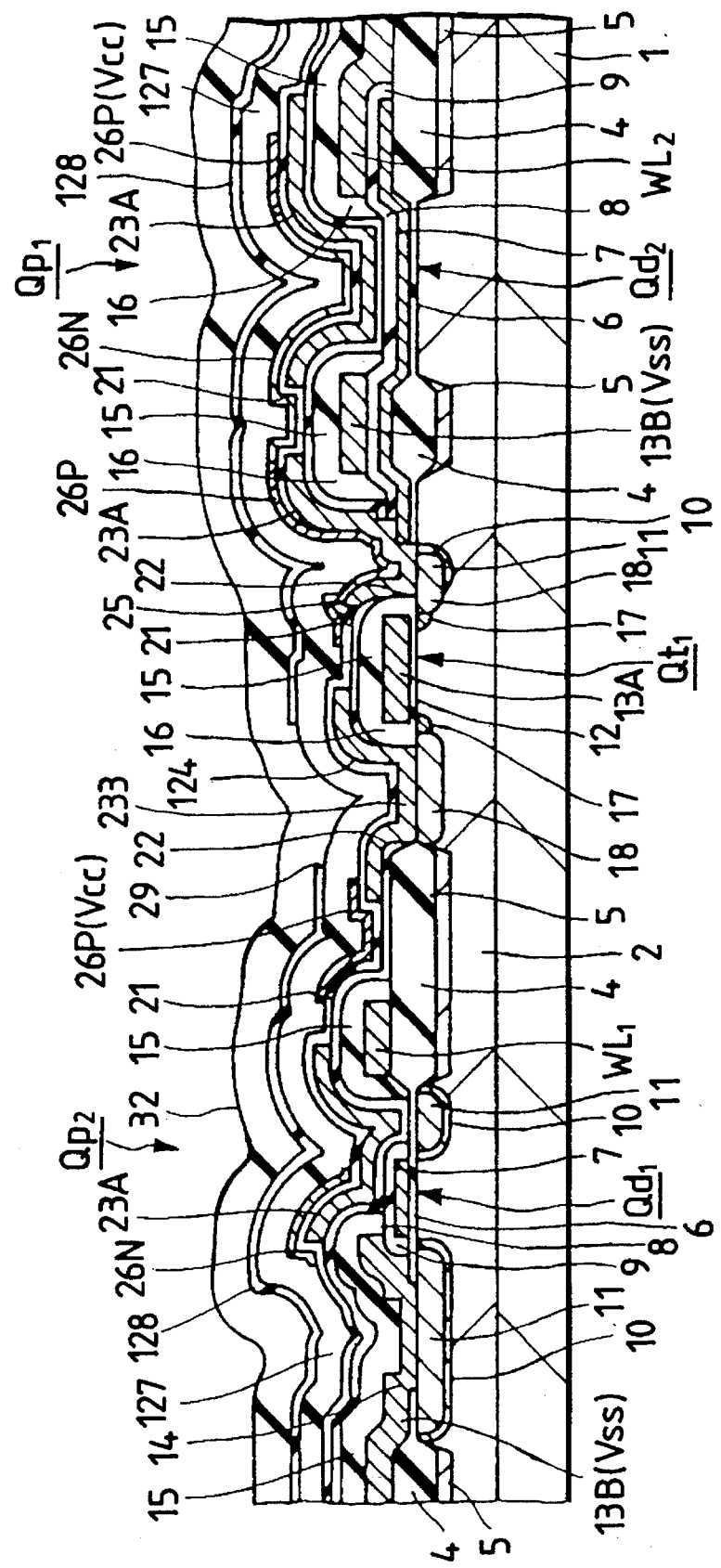
FIG. 37 is a section of an essential portion of the semiconductor substrate and shows a process of manufacturing the semiconductor integrated circuit device according to the fourth embodiment of the present invention.

Next, the photoresist film 138 is ashed off, and the BPSG film 32 is deposited on the whole surface of the semiconductor substrate 1 (as shown in FIG. 37). The BPSG film 32 is formed to have a thickness of o about 270 to 330 nm by the normal-pressure CVD method using ozone ($O_3$), tetraethoxysilane ($Si(OC_2H_5)_4$), PO $(OCH_3)_3$ and BO$(OCH_3)_3$ as the source gas. Subsequently, the BPSG film 32 is annealed to have its surface reflown and flattened. This annealing is carried out in the nitrogen atmosphere containing about 1% of oxygen at about 800° to 850° C. for about 20 minutes.

This annealing can reduce the dangling bonds which are present in the interface between the silicon nitride film 128 and the BPSG film 32 deposited on the former. As a result, the amount of hydrogen, which might otherwise be trapped by the dangling bonds, can be reduced to feed sufficient hydrogen to the dangling bonds of the polycrystalline silicon for forming the load MISFETs $Qp_1$ and $Qp_2$ at a later-described step. In order to reduce the dangling bonds, it is desired to carry out the annealing at a temperature of 600° C. or higher.

Moreover, since the BPSG film 32 is an insulating film having a high gettering effect, its deposition upon the silicon nitride film 128 can prevent a metallic impurity such as Na from invading the load MISFETs $Qp_1$ and $Qp_2$ through the silicon nitride film. This insulating film having a high gettering effect can be modified into a PSG (Phospho Silicate Glass) film in place of that BPSG film 32.

Next, the photoresist film is formed over the BPSG film 32 and is used as the mask to etch the BPSG film 32, the insulating film 127 and the insulating film (i.e., the same insulating film as that of the gate insulating film 124 of the load MISFETs $Qp_1$ and $Qp_2$) thereby to form the contact hole 34 over the aforementioned pad layer 23B.

Figure 38:
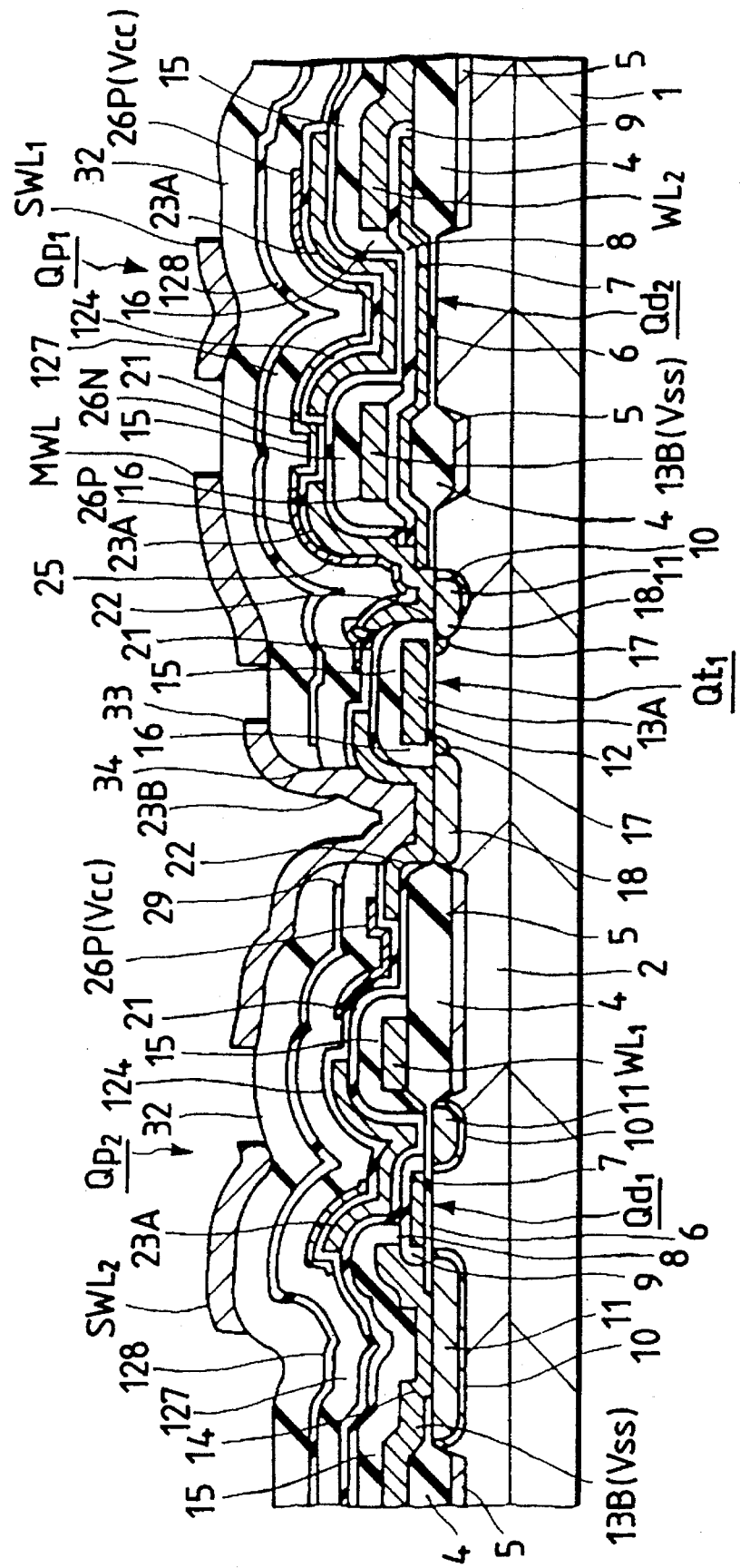
FIG. 38 is a section of an essential portion of the semiconductor substrate and shows a process of manufacturing the semiconductor integrated circuit device according to the fourth embodiment of the present invention.

Next, the photoresist film is ashed off, and a tungsten film or the first-layered wiring material is then deposited on the whole surface of the semiconductor substrate 1. This tungsten film is formed to have a thickness of about 270 to 330 nm by the sputtering method. Subsequently, the photoresist film is formed over the tungsten film and is used as the mask to etch the tungsten film thereby to form the intermediate conductive layer 38, the sub-word lines SWL (i.e., the first sub-word line $SWL_1$ and the second sub-word line $SWL_2$) and the main word line MWL individually. After this, the photoresist film is ashed off (as shown in FIG. 38).

Figure 39:
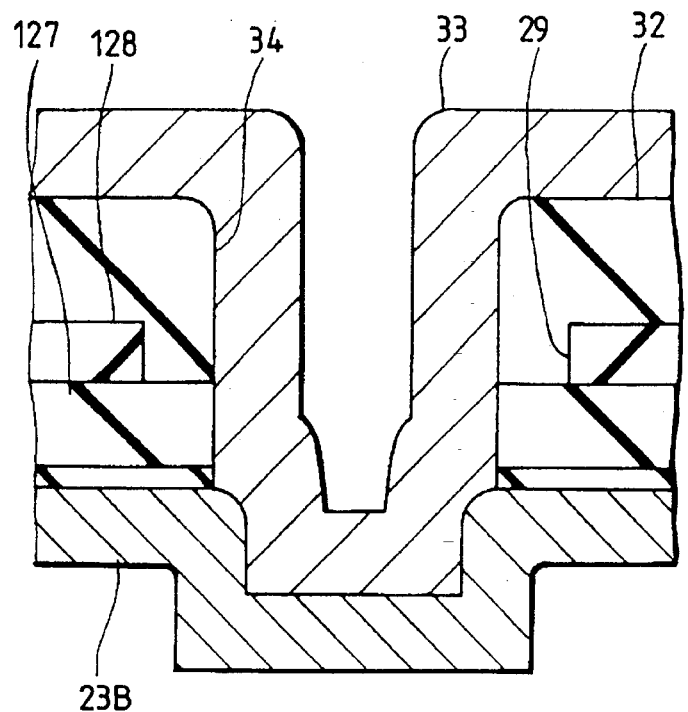
FIG. 39 is an enlarged section showing a data line connecting contact hole in case a silicon nitride film has a large opening.

The intermediate conductive layer 33 is connected through the contact hole 34 with the aforementioned pad layer 23B. The aforementioned silicon nitride film 128 over the pad layer 23B is formed with the larger opening 29 than the contact hole 34 so that the it is exposed to the side wall of the contact hole 34, as shown in FIG. 39.

Figure 40:
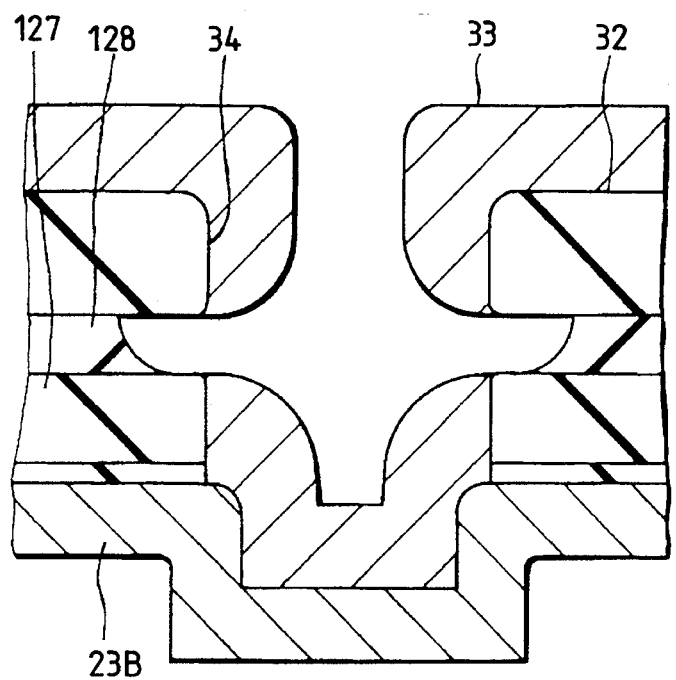
FIG. 40 is an enlarged section showing a data line connecting contact hole in case the silicon nitride film does not have a large opening.

Without the opening 29 in the silicon nitride film 128, on the contrary, when contact hole 34 is to be formed, as shown in FIG. 40, a step is formed in the side wall of the hole 34 as a result of the difference in the etching rate between the BPSG film 32 or the insulating-film 127 made of silicon oxide and the silicon nitride film 128. Thus, the coverage of the tungsten film in the contact hole 34 may be so insufficient as to disconnect the intermediate conductive layer 33.

Since the larger opening 29 than the contact hole 34 is thus formed in the silicon nitride film 128 over the pad layer 23B, the intermediate conductive layer 33 in the contact hole 34 can be reliably prevented from being disconnected.

Next, there is deposited on the whole surface of the semiconductor substrate 1 the interlayer insulating film 35 which is formed of a three-layered film prepared by laminating the silicon oxide film, the spin on glass film and the silicon oxide film sequentially. The silicon oxide films are formed by the plasma CVD method using oxygen ($O_2$) and tetraethoxysilane ($Si(OC_2H_5)_4$) as the source gas, for example, such that the lower silicon oxide film is given a thickness of about 450 to 550 nm whereas the upper silicon oxide film is given a thickness of about 360 to 440 nm. On the other hand, the spin on glass film is baked at about 440° C., after it has been formed to a thickness of about 235 to 265 nm, and then has its surfaced etched back and flattened.

Since the silicon oxide film forming the interlayer insulating film 35 is formed by the plasma CVD method, the interlayer insulating film 35 contains many hydrogen ions therein and facilitates transmission of the hydrogen which is to be supplied at the later-described hydrogen annealing step. As a result, sufficient hydrogen can be supplied to the polycrystalline silicon film forming the aforementioned load MISFETs $Qp_1$ and $Qp_2$.

Next, the photoresist film formed over the interlayer insulating film 35 is used as the mask to etch the interlayer insulating film 35 thereby to form the contact hole 36 over the intermediate conductive layer 33. After this, the photoresist film is ashed off.

Next, the second-layered wiring material is deposited on the whole surface of the semiconductor substrate 1. This wiring material is formed of the three-layered film which is prepared by laminating the TiW (titanium tungsten) film, the aluminum alloy film and the TiW film sequentially. These TiW films are formed by the sputtering method, and the lower TiW film is given a thickness of about 54 to 66 nm whereas to 220 nm. The aluminum alloy film is formed to have a thickness of about 720 to 880 nm by the sputtering method.

Figure 41:
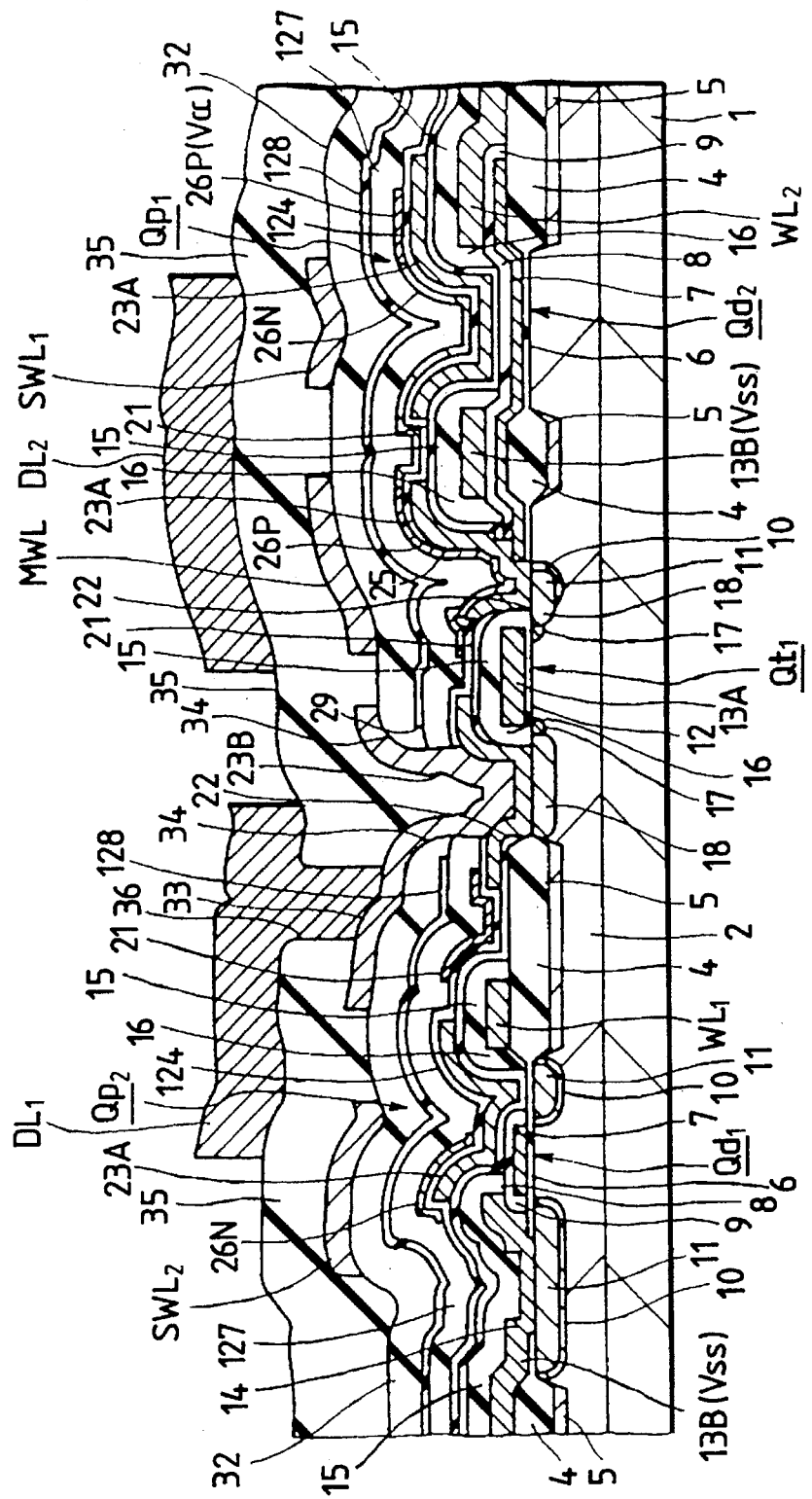
FIG. 41 is a section of an essential portion of the semiconductor substrate and shows a process of manufacturing the semiconductor integrated circuit device according to the fourth embodiment of the present invention.

Subsequently, the photoresist film formed on the TiW film is used as the mask to etch the TiW film, the aluminum alloy film and the TiW film sequentially thereby to form the complementary data lines DL (i.e., the first data line $DL_1$ and the second data line $DL_2$). After this, this photoresist film is ashed off (as shown in FIG. 41).

Next, the final passivation film 37 formed of the laminated film of the silicon oxide film and the silicon nitride film is deposited on the whole surface of the semiconductor substrate 1. The silicon oxide film is formed by the plasma CVD method using oxygen ($O_2$) and tetraethoxysilane ($Si(OC_2H_5)_4$) as the source gas, and the silicon nitride film is formed by the plasma CVD method using monosilane ($SiH_4$) and nitrogen (or ammonia) as the source gas. Since the silicon oxide film and the silicon nitride film forming the final passivation film 37 are formed by the plasma CVD methods, many hydrogen ions are contained in the final passivation film 37 and act as a hydrogen supply source for the polycrystalline silicon film forming the load MISFETs $Qp_1$ and $QP_2$.

Moreover, the hydrogen annealing is carried out midway of the step of depositing the final passivation film 37, to supply the hydrogen to the polycrystalline silicon film forming the load MISFETs $Qp_1$ and $Qp_2$. First of all, the silicon oxide film is deposited to a thickness of about 360 to 440 nm. After this, the hydrogen annealing is carried out in the nitrogen atmosphere containing hydrogen at about 400° C. for about 30 minutes, and the silicon oxide film is then deposited to a thickness of about 360 to 440 nm. Finally, the silicon nitride film of about 1.2 μm is deposited on the silicon oxide film. As a result of the steps described above, the memory cell MC of the SRAM shown in FIG. 33 is completed. After this, this SRAM is packaged with a resin. Thus, the steps from the step of forming the BPSG film as the interlayer insulating film to the step of forming the final passivation film 37 are substantially identical to those of Embodiment 1.

According to this Embodiment 4, the following effects can be achieved.

Figure 42:
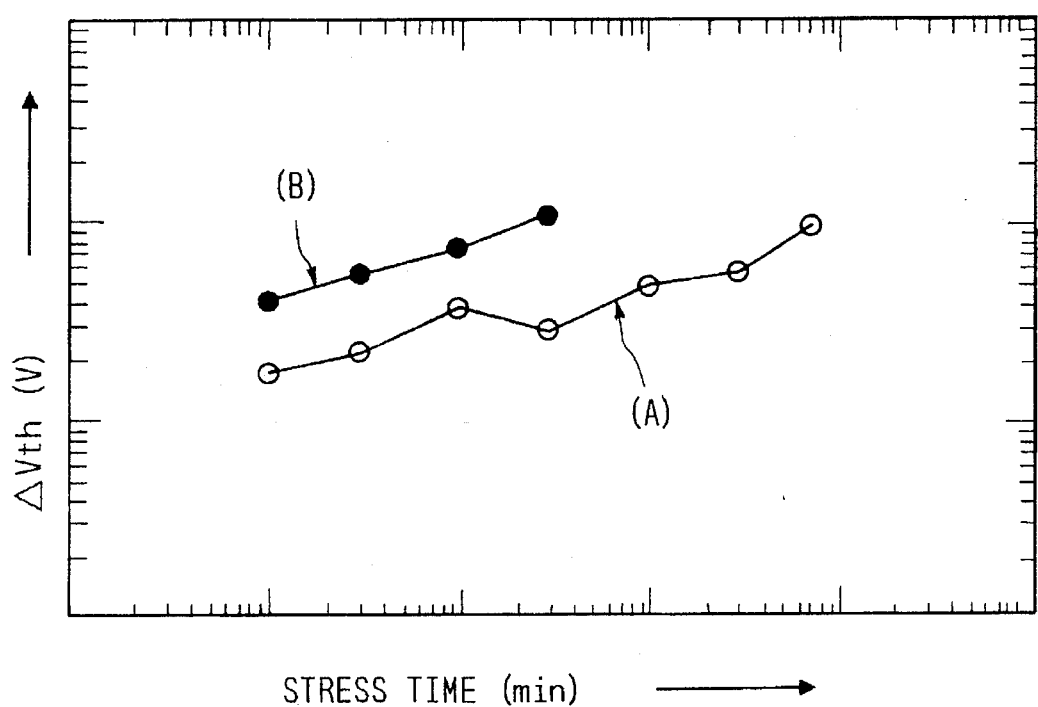
FIG. 42 is a graph plotting the fluctuations of the threshold voltages of the load MISFETs.

(1) Since the silicon nitride film 128 impermeable to humidity is formed over the load MISFETs $Qp_1$ and $Qp_2$ formed of the polycrystalline silicon film, the load MISFETs $Qp_1$ and $Qp_2$ can be kept away from invasion of the humidity. As a result, the SRAM of this embodiment can suppress the fluctuations of the threshold voltages (Vth) of the load MISFETs $Qp_1$ and $Qp_2$, as shown by (A) in FIG. 42, more than those of the SRAM according to the specifications of the prior art having no silicon nitride film 128, as shown by (B) in FIG. 42.

Moreover, the silicon nitride film 128 has its thickness controlled to become permeable to hydrogen, so that it can supply sufficient hydrogen to the dangling bonds of the polycrystalline silicon film forming the load MISFETs $Qp_1$ and $Qp_2$. As a result, the trap level due to the dangling bonds of the polycrystalline silicon film is terminated by the hydrogen to improve the quality of the polycrystalline silicon film. Thus, the mutual conductance (gm) of the load MISFETs $Qp_1$ and $Qp_2$ can be drastically improved.

Figure 43:
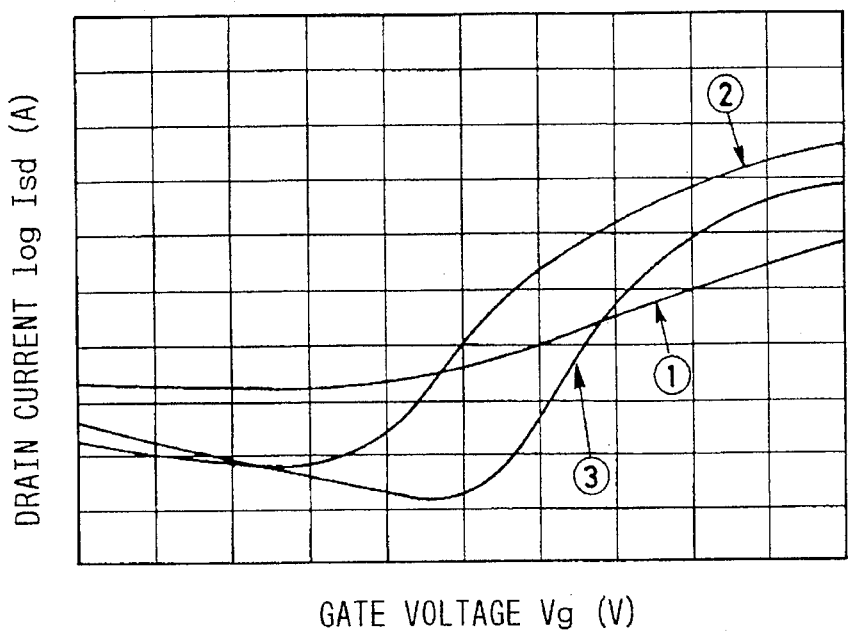
FIG. 43 is a graph plotting the transitions of the initial characteristics of the load MISFETs.

FIG. 43 illustrates the step transitions of the initial characteristics of the load MISFETs $Qp_1$ and $Qp_2$. In FIG. 43: curve ① indicates the initial characteristics immediately after the intermediate conductive layer 33 is formed over the BPSG film 32; curve ② indicates the initial characteristics immediately after the hydrogen annealing (and the hydrogenation at the step of depositing the silicon oxide film forming the final passivation film 37) is carried out in the course of the step of depositing the final passivation film 37; and curve ③ indicates the initial characteristics of the completed device. It is understood from FIG. 43 that the load MISFETs $Qp_1$ and $Qp_2$ of the completed device have their mutual conductance (gm) remarkably improved.

Figure 44:
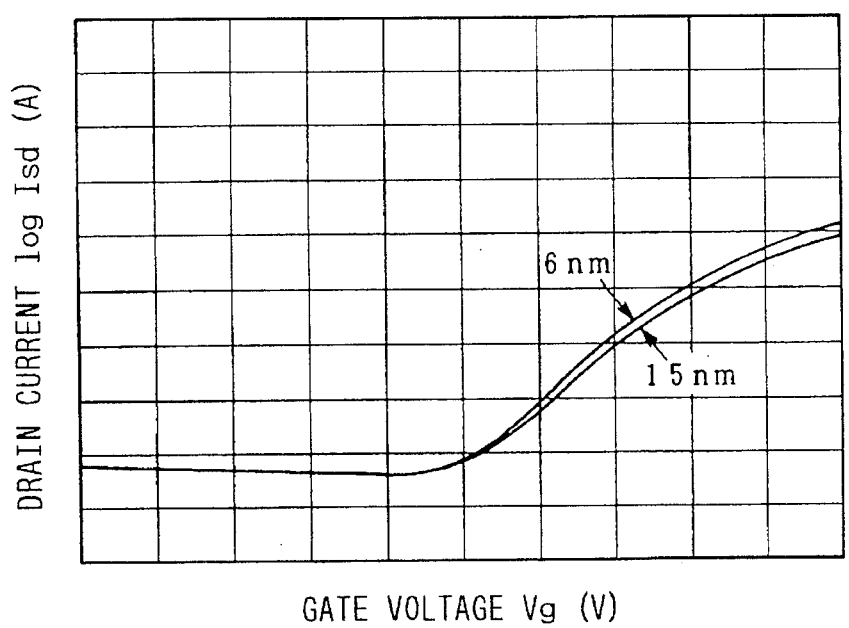
FIG. 44 is a graph plotting the fluctuations of the initial characteristics of the load MISFETs.

On the other hand, FIG. 44 illustrates the initial characteristics of the load MISFETs $Qp_1$ and $Qp_2$ when the silicon nitride film 128 is given thicknesses of 6 nm and 15 nm. As is apparent from FIG. 44, the mutual conductance (gm) of the load MISFETs $Qp_1$ and $Qp_2$ is remarkably improved by forming the silicon nitride film 128 having a thickness of 6 to 15 nm. Incidentally, in FIGS. 43 and 44, the abscissa indicates the gate voltage (Vg) of the load MISFETs $Qp_1$ and $Qp_2$, and the ordinate indicates the drain current (Isd (A)) of the load MISFETs $Qp_1$ and $Qp_2$.

Moreover, after the silicon nitride film 128 has been formed, the hydrogenations such as the hydrogen annealing and the plasma CVD method are carried out by making use of the steps before the step of depositing the final passivation film 37. As a result, sufficient hydrogen can be supplied to the dangling bonds of the polycrystalline silicon film forming the load MISFETs $Qp_1$ and $Qp_2$ without adding any special step for the hydrogenations.

(2) Since the opening larger than the contact hole 34 is formed in the silicon nitride film 128 over the pad layer 23B, the intermediate conductive layer 33 can be reliably prevented from being disconnected in that contact hole 34, so that the connection reliability of the complementary data lines DL can be improved.

(3) The dangling bonds present in the interface between the silicon nitride film 128 and the BPSG film 32 can be reduced by the annealing which is carried out after the deposition of the BPSG film 32 on the silicon nitride film 128. As a result, the amount of hydrogen to be trapped by the dangling bonds can be reduced so that sufficient hydrogen can be fed to the dangling bonds of the polycrystalline silicon film forming the load MISFETs $Qp_1$ and $Qp_2$.

By depositing the BPSG film 32 having a high gettering effect on the silicon nitride film 128, moreover, it is possible to prevent the metallic impurity such as Na from invading into the load MISFETs $Qp_1$ and $Qp_2$ through the silicon nitride film 128 and accordingly to prevent the deterioration of the electric characteristics of the memory cell MC.

(4) Since the silicon nitride film 28 is removed from the peripheral circuit region after it has been deposited on the load MISFETs $Qp_1$ and $Qp_2$, the peripheral circuits can be easily worked.

Although our invention has been specifically described hereinbefore, it should not be limited to the foregoing embodiments but can naturally be modified in various manners without departing from the gist thereof.

The embodiments have been described in case the present invention is applied to the SRAM which is constructed to include the load MISFETs of the bottom gate structure having their channel regions, source regions and drain regions formed over the gate electrodes. However, the present invention can also be applied to the SRAM which is constructed to include the load MISFETs of the top gate structure having the gate electrodes formed over their channel regions, source regions and drain regions.

In the foregoing embodiments, the silicon nitride film is removed from the peripheral circuit regions when the silicon nitride film deposited on the load MISFETs is etched to form the opening. However, the silicon nitride film over the peripheral circuit regions need not always be removed.

The description made above is directed to the case in which the present invention is applied to the SRAM having the load MISFETs formed of the polycrystalline silicon film. However, the present invention can be applied to all devices having semiconductor elements formed of a polycrystalline silicon film.

[Embodiment 5]

Figure 45:
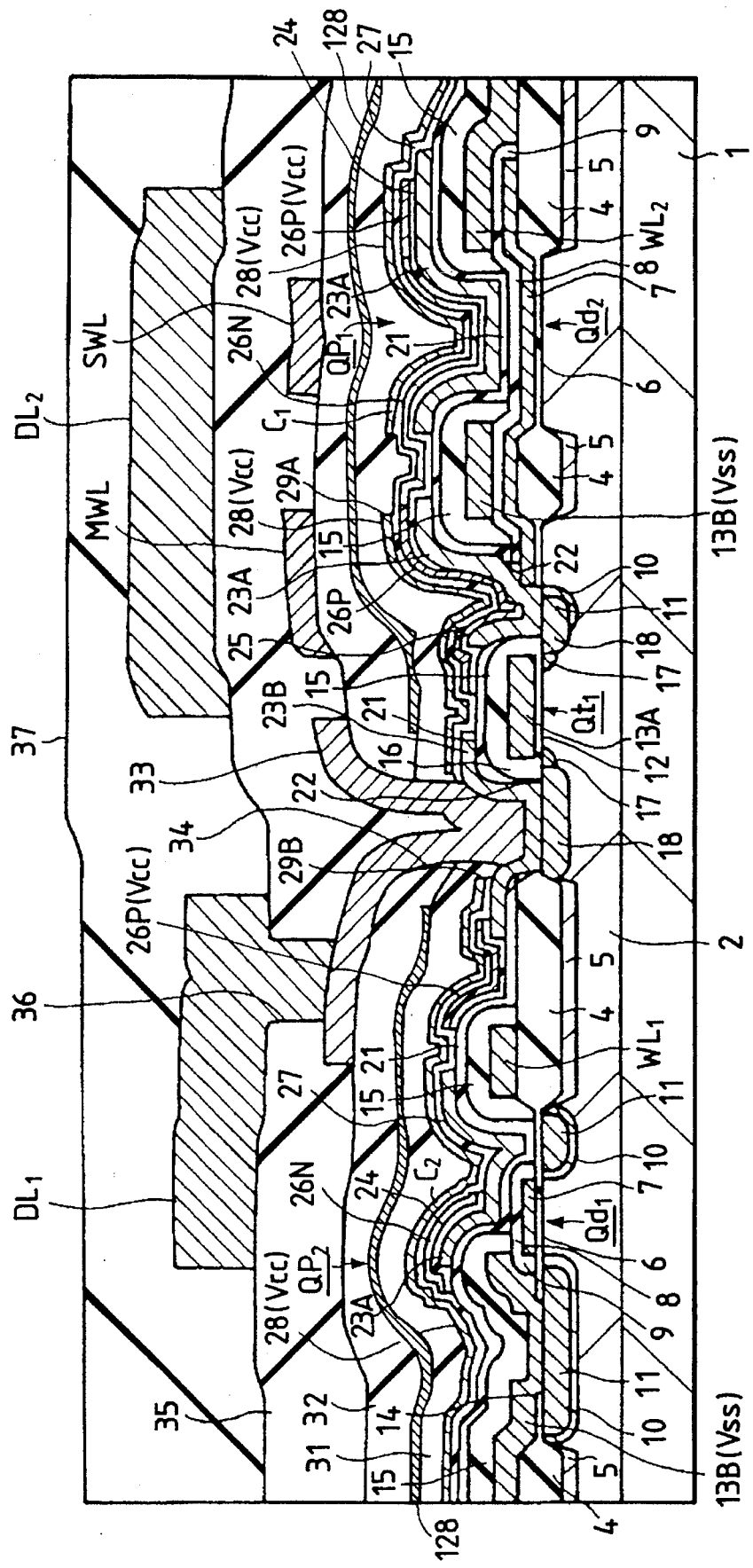
FIG. 45 is a section of an essential portion of a semiconductor substrate and shows the memory cell of a semiconductor integrated circuit device according to a fifth embodiment of the present invention.

This Embodiment 5 is exemplified by applying the silicon nitride film 128 of Embodiment 4 to the SRAM of Embodiment 1. As shown in FIG. 45, Embodiment 5 is different from Embodiment 1 in that the silicon nitride film 128 is formed.

According to this embodiment, the stable operation of the memory cell can be improved in addition to the same effects as those of the foregoing Embodiments 1 and 4.

Figure 46:
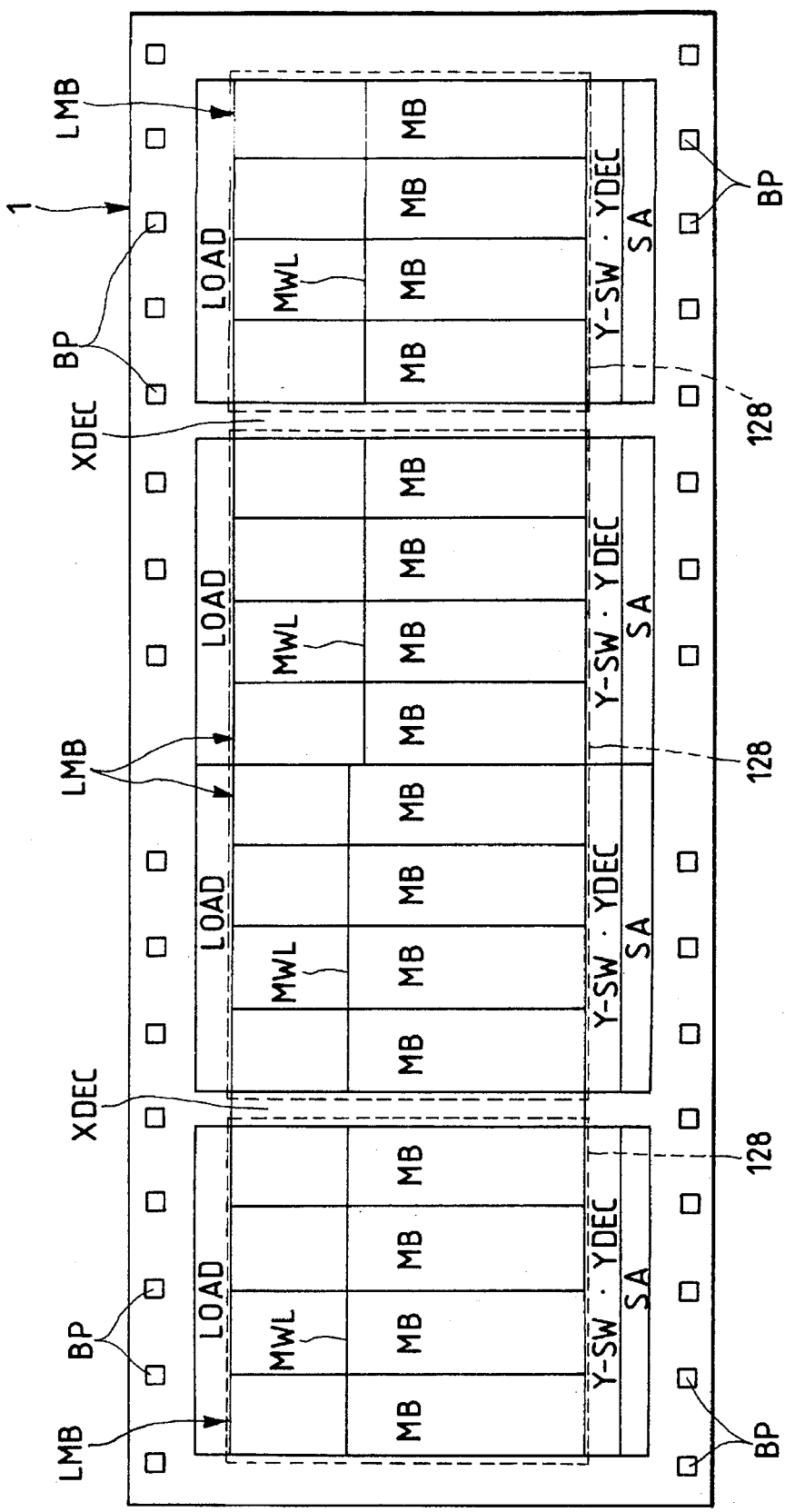
FIG. 46 is a schematic diagram showing the chip layout of the semiconductor integrated circuit device according to the fifth embodiment of the present invention.

Incidentally, the chip layouts of Embodiments 1 to 5 should not be limited to that of FIG. 19 but may be that of FIG. 46.

Figure 47:
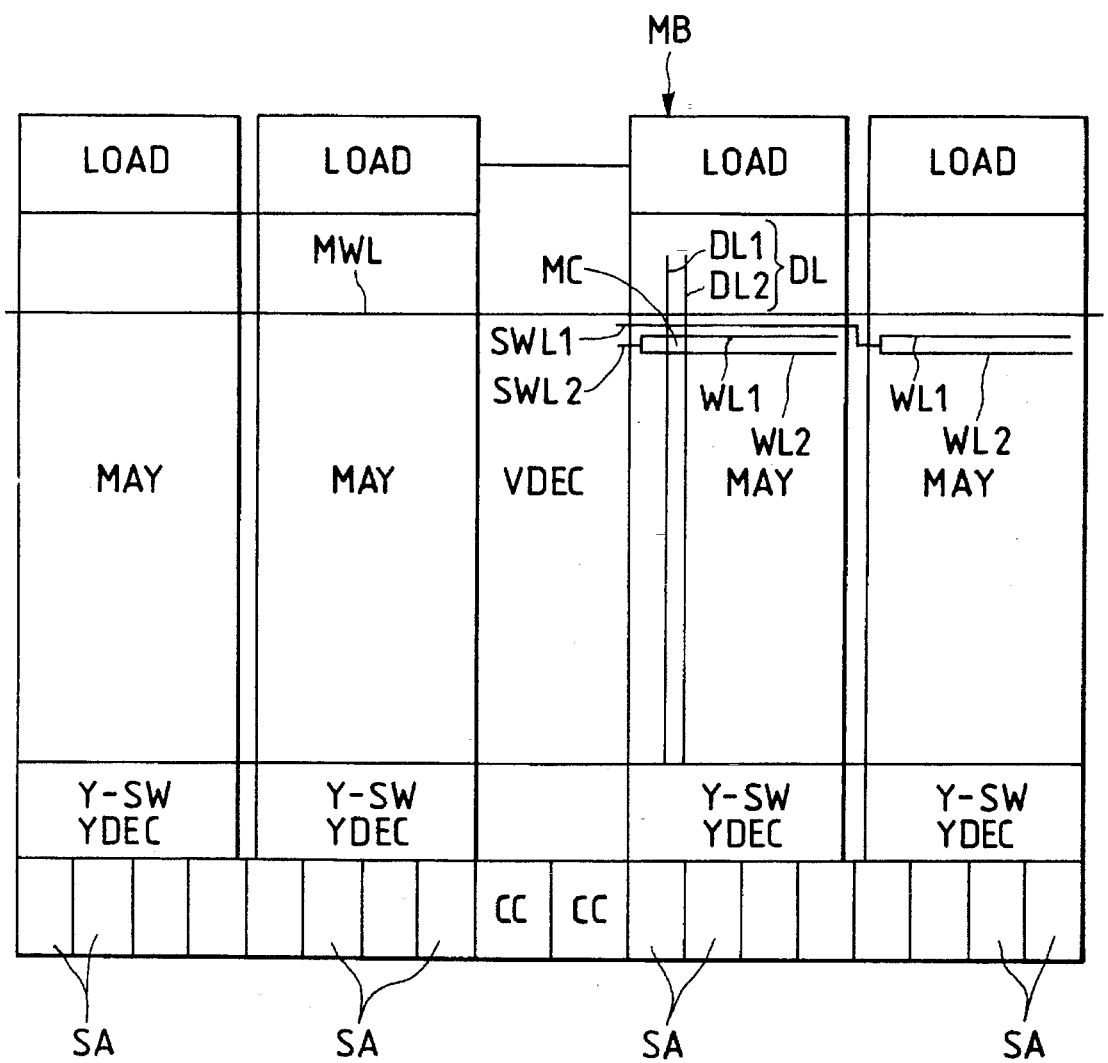
FIG. 47 is a schematic diagram showing a portion of FIG. 46 in an enlarged scale.

FIG. 48 is a schematic diagram (or a chip layout) of the SRAM device according to Embodiment 5 of the present invention, and FIG. 47 is a schematic diagram showing a portion of FIG. 46 in an enlarged scale.

The rectangular semiconductor chip 1 formed on its main surface with a SRAM having a capacity as high as 4 Megabits (Mbits) to 16 Megabits (Mbits), although not especially limited thereto. This SRAM has its memory cell region of four memory blocks LMB, each of which is divided into four memory blocks MB.

Each of the memory blocks LMB is arranged at its one end with the load circuit LOAD and at its other end with the Y-selector circuit YSW, the Y-decoder circuit YDEC and the sense amplifier SA. Moreover, the X-decoder circuit XDEC is arranged between the memory block LMB arranged at the most lefthand end of the main surface of the semiconductor chip 1 and the adjoining memory block LMB. Likewise, the X-decoder circuit XDEC is arranged between the memory block LMB arranged at the most righthand end of the main surface of the semiconductor chip 1 and the adjoining memory block LMB. On the other hand, bonding pads BP are arranged in the outermost peripheral portion of the semiconductor chip 1.

Each of the memory blocks MB dividing the aforementioned memory block LMB into four is further divided into four memory cell arrays MAY, as shown in FIG. 47. Moreover, each memory block MB is arranged at its center with one word decoder circuit WDEC. This word decoder circuit WDEC is selected by the aforementioned X-decoder circuit XDEC through the main word line MWL extending over the memory cell arrays MAY. Moreover, the word decoder circuit WDEC selects the first word line $WL_1$ and the second word line $WL_2$ through the first sub-word lines $SWL_1$ or the second sub-word lines $SWL_2$ extending over the memory cell arrays MAY. Control circuit CC are arranged at one end of the word decoder circuit WDEC.

The complementary data lines DL are extended in the direction perpendicular to the first word line $WL_1$ and second word line $WL_2$ over the aforementioned memory cell arrays MAY. These complementary data lines DL are composed of the first data line $DL_1$ and the second data line $DL_2$. The complementary data lines DL have their ends connected with the aforementioned load circuit LOAD and their other ends connected with the aforementioned sense amplifiers SA through the aforementioned Y-selector circuits YSW.

The memory cells MC of the SRAM are individually formed at the regions in which the first word line $WL_1$ and the second word line $WL_2$ of the memory cell array MAY intersect the first data line $DL_1$ and the second data line $DL_2$.

In this case, the silicon nitride film 128 of Embodiments 4 and 5 is formed over the memory block LMB shown in FIG. 46.

The effects to be achieved by the representative of the invention disclosed herein will be briefly described in the following.

(1) According to the present invention, the capacitance elements are formed between the load MISFETs and the plate electrodes covering the former and having a large area, so that they can be given a high capacity to improve the α-ray soft error resistance of the memory cell of the SRAM.

(2) According to the present invention, the plate electrodes over the channel regions at the drain region side of the load MISFETs are formed with the opening to separate the offset regions and the plate electrodes, so that a high electric field can be avoided from being applied from the plate electrodes to the offset regions of the load MISFETs while the supply voltage is OFF. As a result, a leakage current can be prevented from being established between the source regions and the drain regions by that high electric field, to reduce the OFF current. As a result, the ratio of the ON current to the OFF current can be improved to retain the stable operation of the memory cell.

(3) According to the present invention, by effecting the voltage supply to the plate electrodes from the outside of the memory cell array, the direct influence of the supply noises, if any, from the outside to the semiconductor chip formed with the SRAM, can be avoided from being exerted upon the memory cell, so that the stable operation of the memory cell can be retained.

(4) According to the present invention, a portion of the insulating film forming the dielectric film of the capacitance elements is formed of a silicon nitride film having a higher breakdown voltage than that of the silicon oxide film, so that the dielectric film can be made thinner than that of the case, in which it is made of a single layer of the silicon oxide film, to increase the capacitance of the capacitance elements.

(5) According to the present invention, the load MISFETs are covered with the dielectric film including the silicon nitride film having a higher water resistance than that of the silicon oxide film, so that the load MISFETs can be suppressed from having their characteristics subject to fluctuations which might otherwise be caused by the humidity invasion, to retain the stable operation of the memory cell.

(6) According to the present invention, the dielectric film is formed after a portion of the gate insulating film over the gate electrodes of the load MISFETs has been removed, it can be thinned to increase the capacitance of the capacitance elements.

(7) According to the present invention, hydrogen atoms are fed through the opening formed in the plate electrodes to the uncombined bonds (i.e., the dangling bonds) which are present in the crystal surfaces of the polycrystalline silicon film forming the load MISFETs, so that the mutual conductance (gm) of the load MISFETs can be improved.

(8) According to the present invention, simultaneously as the plate electrodes for covering the memory cell array are to be formed, the silicon nitride film forming a portion of the dielectric film below the plate electrodes is etched to remove the silicon nitride film over the peripheral circuits. By forming the hydrogen impermeable silicon nitride film over the peripheral circuits, the fluctuations of the threshold voltage of the peripheral circuits (or the MISFETs forming the peripheral circuits) can be suppressed to retain the stable operation of the SRAM.

(9) According to the present invention, the silicon nitride film permeable to hydrogen but not to humidity is formed over the load MISFETs formed of the polycrystalline silicon film. Thus, it is possible to prevent the fluctuations of the threshold voltage (Vth) of the load MISFETs and to improve the mutual conductance (gm).

What is claimed is:

1. A semiconductor integrated circuit device comprising a SRAM having a memory cell, the memory cell including a transfer MISFET to be controlled by a word line and a flip-flop circuit having a driver MISFET and a load MISFET, wherein said semiconductor integrated circuit device comprises:

a first conductive film overlying a main surface of a semiconductor substrate and forming a gate electrode of said driver MISFET;

a second conductive film overlying the main surface of said semiconductor substrate and forming a gate electrode of said transfer MISFET;

a third conductive film overlying said first and second conductive films and forming a gate electrode of said load MISFET;

a fourth conductive film overlying said third conductive film and forming a channel region, a source region and a drain region of said load MISFET;

a dielectric film overlying said fourth conductive film and covering a memory cell array of the SRAM;

a fifth conductive film overlying said dielectric film and covering said memory cell array, said fifth conductive film forming a plate electrode;

a capacitance element constituted by said dielectric film, said drain region of said load MISFET and said plate electrode; and an opening in said plate electrode over the channel region at the drain region side of the load MISFET.

2. A semiconductor integrated circuit device according to claim 1, wherein said dielectric film is formed at least partially of a silicon nitride film.

3. A semiconductor integrated circuit device according to claim 2, wherein said silicon nitride film has been removed from a bottom of said opening after said opening has been formed in said plate electrode, and wherein hydrogen has been supplied through said opening to the fourth conductive film forming said load MISFET, by a hydrogenating annealing.

4. A semiconductor integrated circuit device according to claim 3, wherein said silicon nitride film has been removed from regions forming peripheral circuits of the semiconductor integrated circuit device simultaneously as said silicon nitride film has been removed from the bottom of said opening.

5. A semiconductor integrated circuit device according to claim 1, wherein, with respect to a plan view in parallel with said main surface, said drain region and said gate electrode of said load MISFET do not overlap, thereby to form an offset region in said channel region, and wherein said opening is formed in said plate electrode such that said plate electrode does not cover said offset region.

6. A semiconductor integrated circuit device comprising a SRAM having a memory cell, the memory cell including a transfer MISFET to be controlled by a word line and a flip-flop circuit having a driver MISFET and a load MISFET, wherein said semiconductor integrated circuit device comprises:

a first conductive film overlying a main surface of a semiconductor substrate and forming a gate electrode of said driver MISFET;

a second conductive film overlying the main surface of said semiconductor substrate and forming a gate electrode of said transfer MISFET;

a third conductive film overlying said first and second conductive films and forming a channel region, a source region and a drain region of said load MISFET;

a fourth conductive film overlying said third conductive film and forming a gate electrode of said load MISFET;

a dielectric film overlying said fourth conductive film and covering a memory cell array of said SRAM;

a fifth conductive film overlying said dielectric film and covering said memory cell array, said fifth conductive film forming a plate electrode;

a capacitance element constituted by said dielectric film, said gate electrode of said load MISFET and said plate electrode; and an opening in said plate electrode over the channel region at the drain region side of the load MISFET.

7. A semiconductor integrated circuit device according to claim 6, with respect to a plan view in parallel with said main surface, said drain region and said gate electrode of said load MISFET do not overlap, thereby to form an offset region in said channel region, and wherein said opening is formed in said plate electrode such that said plate electrode does not cover said offset region.

8. A semiconductor integrated circuit device comprising a SRAM having a memory cell, the memory cell including a transfer MISFET to be controlled by a word line and a flip-flop circuit having a driver MISFET and a load MISFET, wherein said semiconductor integrated circuit device comprises:

a first conductive film overlying a main surface of a semiconductor substrate and forming a gate electrode of said driver MISFET;

a second conductive film overlying the main surface of said semiconductor substrate and forming a gate electrode of said transfer MISFET;

a third conductive film overlying said first and second conductive films and forming a plate electrode;

a dielectric film overlying said third conductive film and covering said third conductive film;

a fourth conductive film overlying said dielectric film and forming a gate electrode of said load MISFET;

a fifth conductive film overlying said fourth conductive film and forming a channel region, a source region and a drain region of said load MISFET;

a capacitance element constituted by said dielectric film, said gate electrode of said load MISFET and said plate electrode; and an opening in said plate electrode beneath the channel region at the drain region side of the load MISFET.

9. A semiconductor integrated circuit device according to claim 8, wherein, with respect to a plan view in parallel with said main surface, said drain region and said gate electrode of said load MISFET do not overlap, thereby to form an offset region in said channel region, and wherein said opening is formed in said plate electrode such that said plate electrode is not formed beneath said offset region.

10. A semiconductor integrated circuit device comprising:

a semiconductor substrate having a main surface;

a plurality of static random access memory cells arranged in a row direction and in a column direction, each of said plurality of static random access memory cells including first and second driver MISFETs and first and second load MISFETs, each of said driver MISFETs having a gate electrode formed over said main surface and source and drain regions formed in said semiconductor substrate;

a first insulating film formed over said driver MISFETs so as to cover said main surface;

first conductive strips formed over said first insulating film, a source region, a drain region and a channel forming region of each of the first and second load MISFETs being formed in said first conductive strips, said drain regions of said first and second load MISFETs being electrically connected to said drain regions of said first and second driver MISFETs, respectively;

gate electrodes of said first and second load MISFETs formed overlying said first insulating film such that a gate insulating film thereof intervenes between said gate electrodes and said first conductive strips, and such that, in a direction perpendicular to said main surface, said gate electrodes and said first conductive strips are laminated to overlap each other, said gate electrodes of said first and second load MISFETs being electrically connected to said drain regions of said second and first driver MISFETs, respectively;

a second insulating film formed over said first conductive strips and said gate electrodes of said first and second load MISFETs; and a plate electrode layer formed over said second insulating film, such that one of a respective gate electrode and drain region, of said first and second load MISFETs, said second insulating film, and said plate electrode layer comprises a capacitance element, wherein respective gate electrodes and drain regions of said first and second load MISFETs are not overlapped to form an offset region in said channel forming region thereof in each of said memory cells, and wherein said plate electrode layer has openings such that the plate electrode layer does not cover said offset region.

11. A semiconductor integrated circuit device according to claim 10, wherein said plurality of static random access memory cells constitute a memory cell array, and wherein said plate electrode layer is supplied with the supply voltage from outside of said memory cell array.

12. A semiconductor integrated circuit device according to claim 11, further comprising:

power source lines formed over said first insulating film and formed integrally with said first conductive strips, wherein said plate electrode layer and said power source lines are electrically separated from each other in said memory cell array.

13. A semiconductor integrated circuit device according to claim 10, wherein said gate electrodes of said first and second load MISFETs are overlying respective channel forming regions of the first and second load MISFETs.

14. A semiconductor integrated circuit device according to claim 10, wherein said channel forming regions of said first and second load MISFETs are overlying respective gate electrodes of the first and second load MISFETs.

15. A semiconductor integrated circuit device according to claim 10, wherein said driver MISFETs and said load MISFETs are n-channel MISFETs and p-channel MISFETs, respectively, and wherein each of said first conductive strips is comprised of a silicon film.

16. A semiconductor integrated circuit device according to claim 15, further comprising:

a third insulating film overlying said plate electrode layer so as to cover said main surface; and a silicon nitride film overlying said third insulating film and having such a thickness as to be permeable to hydrogen but not to humidity.

17. A semiconductor integrated circuit device according to claim 10, wherein said openings in said plate electrode layer extend such that the plate electrode layer does not cover a region between the drain region and the channel forming region of the first and second load MISFETs.

18. A semiconductor integrated circuit device according to claim 10, wherein said openings in said plate electrode layer extend such that the plate electrode layer leaves uncovered an entirety of the channel forming regions of the first and second load MISFETs.

19. A semiconductor integrated circuit device according to claim 18, wherein said openings in said plate electrode layer extend such that the plate electrode layer does not cover a region between the drain region and the channel forming region of the first and second load MISFETs.

20. A semiconductor integrated circuit device according to claim 10, wherein said openings have a rectangular shape.

21. A semiconductor integrated circuit device according to claim 10, wherein each of said openings have a shape of a band, extending in said row direction, to expose said offset regions of said memory cells arranged in said row direction.

22. A semiconductor integrated circuit device according to claim 10, wherein said gate electrodes of said first and second load MISFETs are provided over said first conductive strips, and wherein said openings of said plate electrode layer are provided above offset regions where respective gate electrodes and drain regions of said first and second load MISFETs are not overlapped.

23. A semiconductor integrated circuit device according to claim 10, wherein said first conductive strips are provided over said gate electrodes of said first and second load MISFETs, and wherein said openings of said plate electrode layer are provided above offset regions where respective gate electrodes and drain regions of said first and second load MISFETs are not overlapped.

24. A semiconductor integrated circuit device according to claim 10, wherein each of the plurality of static random access memory cells further includes first and second transfer MISFETs, the first and second transfer MISFETs each including source and drain regions in the semiconductor substrate and a gate electrode overlying the semiconductor substrate, and wherein the semiconductor integrated circuit device further includes pad layers electrically connected to the source or drain regions of the first and second transfer MISFETS, and the plate electrode layer had additional openings for exposing said pad layers.

* * * * *